United States Patent
Hatade

(10) Patent No.: US 7,745,906 B2
(45) Date of Patent: Jun. 29, 2010

(54) SEMICONDUCTOR DEVICE HAVING SPACED UNIT REGIONS AND HEAVILY DOPED SEMICONDUCTOR LAYER

(75) Inventor: Kazunari Hatade, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 92 days.

(21) Appl. No.: 11/550,189

(22) Filed: Oct. 17, 2006

(65) Prior Publication Data

US 2008/0006906 A1 Jan. 10, 2008

(30) Foreign Application Priority Data

Jul. 7, 2006 (JP) ............................. 2006-188339

(51) Int. Cl.
*H01L 27/082* (2006.01)

(52) U.S. Cl. ............... 257/586; 257/590; 257/E29.027; 257/E29.037; 257/E29.197

(58) Field of Classification Search ................. 257/586, 257/590, E29.027, E29.037, E29.197

See application file for complete search history.

(56) References Cited

U.S. PATENT DOCUMENTS

| 5,751,024 A | 5/1998 | Takahashi | |
|---|---|---|---|
| 5,869,850 A * | 2/1999 | Endo et al. ................... | 257/139 |
| 6,262,470 B1 * | 7/2001 | Lee et al. ..................... | 257/565 |

FOREIGN PATENT DOCUMENTS

| JP | 7-58320 | 3/1995 |
|---|---|---|
| JP | 9-503626 | 4/1997 |
| JP | 9-148574 | 6/1997 |
| JP | 2000-286416 | 10/2000 |
| JP | 2000286416 A * | 10/2000 |
| KR | 1989-0013770 | 9/1989 |
| KR | 1991-0007160 | 4/1991 |
| KR | 1997-0077752 | 12/1997 |
| KR | 1999-015506 | 3/1999 |
| KR | 2000-0064345 | 11/2000 |
| KR | 2002-0071768 | 9/2002 |
| KR | 10-2005-0083340 | 8/2005 |
| TW | 434900 | 5/2001 |
| TW | I256724 | 6/2006 |
| WO | WO 95/24055 | 9/1995 |

* cited by examiner

*Primary Examiner*—Eugene Lee
*Assistant Examiner*—Peniel M Gumedzoe
(74) *Attorney, Agent, or Firm*—Oblon, Spivak, McClelland, Maier & Neustadt, L.L.P.

(57) ABSTRACT

An $n^+$-emitter layer arranged under an emitter electrode is formed of convex portions arranged at predetermined intervals and a main body coupled to the convex portions. A convex portion region is in contact with the emitter electrode, and a $p^+$-layer doped more heavily than a p-base layer is arranged at least below the emitter layer. In a power transistor of a lateral structure, a latch-up immunity of a parasitic thyristor can be improved, and a turn-off time can be reduced.

6 Claims, 39 Drawing Sheets

: $p^+$-LAYER IS ARRANGED BELOW EMITTER LAYER AND MAY BE DEEPER THAN p-BASE LAYER.
: EMITTER LAYER MAY BE UNIT EMITTER LAYERS.

- $p^+$ –LAYER IS ARRANGED UNDER EMITTER LAYER.
- $p^+$ –LAYER MAY BE ARRANGED IN p–BASE LAYER AND MAY BE DEEPER THAN IT,
- EMITTER LAYER 6 MAY BE DIVIDED INTO UNIT EMITTER LAYERS.

I: VCE (DIELECTRIC ISOLATION)
II: VCE (JUNCTION ISOLATION)
III: ICE (DIELECTRIC ISOLATION)
IV: ICE (JUNCTION ISOLATION)

SEMICONDUCTOR DEVICE HAVING SPACED UNIT REGIONS AND HEAVILY DOPED SEMICONDUCTOR LAYER

BACKGROUND OF THE INVENTION

1. Field of the Invention

The present invention relates to a semiconductor power device, and particularly to a semiconductor device such as an Insulated Gate Bipolar Transistor (IGBT) or a power MOSFET (insulated gate field effect transistor). More particularly, the invention relates to a structure for improving a driving current quantity, a latch-up immunity and turn-off characteristics of a power device.

2. Description of the Background Art

Power devices have been used in the fields of converting and controlling electric powers. Such power devices include a MOS gate device receiving a voltage at an insulated gate for performing a switching operation. MOS gate devices include an IGBT (Insulated Gate Bipolar Transistor) and a MOSFET (insulated gate field effect transistor). A semiconductor switch of such power device is required to have characteristics of fast operation (fast switching operation) as well as large current driving and high breakdown voltage.

A reference 1 (Japanese Patent Laying-Open No. 07-058320) discloses the following structure for the purpose of reducing a turn-off time of the IGBT to increase an operation frequency. Reference 1 discloses, as a conventional structure, the following structure. A p-type base contact layer is arranged surrounding an n-type emitter layer, and is contacted with a p-type base layer. The p-type base contact layer and the n-type emitter layer are both coupled to an emitter electrode. The p-type base contact layer discharges minority carriers (holes) to the emitter electrode during turn-off. An n-type buffer layer is formed under a p-type collector layer. This buffer layer prevents the discharging of minority carriers to an $n^-$-type drift layer when majority carriers are discharged from the collector layer to a collector terminal during turn-off. In the case of employing the n-type buffer layer, if a buffering effect of the buffer layer is made so high, the efficiency of injection of the minority carriers into the drift layer during turn-on is lowered to lower a conductivity modulation effect, leading to an increased on-resistance and therefore an increased on-voltage. As a structure for avoiding such disadvantage, Reference 1 discloses a shorted collector structure. In this shorted collector structure, an n-type collector short layer is arranged surrounding an outer perimeter of a p-type collector. Both the p-type collector layer and the n-type collector short layer are commonly coupled to a collector electrode. In this collector short structure, majority carriers flow into the collector short layer during turn-off, but the collector short layer absorbs the minority carriers and thereby suppresses generation of the minority carriers so that the turn-off time is reduced.

The IGBT generally includes a p-type collector layer, n-type buffer layer, $n^-$-type drift layer, p-type base layer and n-type emitter layer. This npn structure accompanies a parasitic thyristor. A latch-up phenomenon may be caused in which the parasitic thyristor is turned on by a voltage drop at a base region of the IGBTeference 2 (Japanese Patent National Publication No. 09-503626: International Patent Publication WO 95/24055) discloses a structure aimed to improve this latch-up immunity.

In Reference 2, a heavily doped $p^+$-type region is arranged beneath an $n^+$-type source layer in a p-type base region formed in an $n^-$-type drift layer. The heavily doped $p^+$-type region serves to reduce a resistance value of a p-type base region, thereby to reduce a voltage drop at a junction between the source and base regions to improve latch-up immunity.

Reference 3 (Japanese Patent Laying-Open No. 2000-286416) discloses a structure aiming to increase an on-current and to improve the latch-up immunity. In Reference 3, a collector layer, an emitter layer and a gate electrode are each formed into a ring shape. The emitter layer (source layer) has a gear-like form having convex and concave portions, or is formed of island-like portions each isolated from the others. A base resistance of a portion under the emitter region is reduced, and a hole current is radially discharged from a collector layer formed at a central portion to reduce the current density of the hole current, for improving a latch-up immunity.

Reference 1 has pointed out the following problem occurring when the shorted collector structure is applied to a lateral IGBT structure. During the turn-off, majority carriers pass under the p-type collector layer, and flow into the n-type collector short layer, and therefore into the p-type collector layer also. Accordingly, minority carriers an increased quantity are injected into the $n^-$-type drift layer. For eliminating the problem of the shorted collector structure in the lateral IGBT structure, Reference 1 places an MOS transistor (insulated gate field effect transistor) having a sub-gate in the p-type collector layer, and couples the collector layer to a collector charge extraction layer via the sub-gate MOS transistor. The charge extraction layer is coupled to the collector terminal. In the sub-gate structure, the n-type source layer of the MOSFET is arranged adjacent to the p-type collector layer, and these layers are coupled by the common electrode, and thereby n-type carriers in the n-type source layer are converted into p-type carriers in the p-type collector layer. During the turn-off, the MOS transistor of the sub-gate structure is kept off to keep the p-type collector layer in this sub-gate in an electrically floating state, and the p-type collector layer is isolated from the charge extraction layer. Majority carriers (electrons) are pulled out to the collector terminal via the charge extraction layer. Meanwhile, the p-type collector layer and the underlying p-well (p-base) are in the electrically floating state, and a pn junction between the well and the drift layer is kept in a reversely biased state (not exceeding a built-in voltage), and suppresses injection of minority carriers.

However, tin the structure disclosed in Reference 1, an additional circuit is required for controlling a potential of the sub-gate separately from the gate (main gate) of the IGBT, which increases a scale of the control circuitry. In the IGBT element, the sub-gate and the main gate terminal are separately provided, which increases a layout area. In the structure disclosed in Reference 1, the majority carriers (electrons) pass under the p-type base layer, and are absorbed into the charge extraction layer. However, no consideration is given to a latch-up phenomenon by a parasitic thyristor between the p-type collector layer, underlying p-well, $n^-$-type drift layer and n-type emitter layer.

In the structure disclosed in Reference 2, it is intended to reduce the resistance value of the p-type base region by the heavily doped $p^+$-type region arranged beneath the n-type source layer. However, Reference 2 discusses only a vertical device structure, and no consideration is given to application to a lateral device structure. In addition, Reference 2 considers a structure for avoiding of latch-up due to a parasitic thyristor in the vertical device structure, but does not consider a structure for increasing a driving current.

In the structure disclosed in Reference 3, the emitter region is formed in a gear-like shape or is formed of separate island-like portions for avoiding the latch-up, but there is room for improvement for increasing the driving current and reducing the turn-off time.

SUMMARY OF THE INVENTION

An object of the invention is to provide a semiconductor device that can increase a driving current quantity, can reduce a turn-off time and can improve a latch-up immunity of a parasitic thyristor.

A semiconductor device according to an aspect of the invention includes a semiconductor substrate; a semiconductor region formed on the semiconductor substrate; a first semiconductor layer region arranged at a surface of the semiconductor region and coupled to a first electrode; a second semiconductor layer region of a ring-shaped form arranged at the semiconductor region, spaced from the first semiconductor layer region, surrounding the first semiconductor layer region and having a conductivity type different from that of the semiconductor region; a third semiconductor layer region different in conductivity type from the second semiconductor layer region having a main body arranged in the second semiconductor layer region and having a ring-shaped continuous form, and a plurality of convex regions adjacent to the main body, extending away from the first semiconductor layer region, coupled to a second electrode, arranged at predetermined internals and each having a width smaller than the predetermined interval; a heavily doped semiconductor layer region arranged in the second semiconductor layer region, located at least under the third semiconductor layer region, doped more heavily than the second semiconductor layer region and having the same conductivity type as the second semiconductor layer region; and a gate electrode layer forming a channel at a surface of the second semiconductor layer region for transferring charges between the first and third semiconductor layer regions.

A semiconductor device according to a second aspect of the invention includes a semiconductor substrate; a semiconductor region formed on the semiconductor substrate; a first semiconductor layer region arranged at the semiconductor region and coupled to a first electrode; a second semiconductor layer region of a ring-shaped form arranged at the semiconductor region, spaced from the first semiconductor layer region, surrounding the semiconductor layer region and different in conductivity type from the semiconductor region; a third semiconductor layer region having a plurality of unit regions arranged at the second semiconductor layer region, spaced from each other, arranged at predetermined intervals and each having a rectangle-like form and a width larger than the predetermined interval, and different in conductivity type from the second semiconductor layer region; a heavily doped semiconductor layer region arranged in the second semiconductor layer region, located at least under the third semiconductor layer region, doped more heavily than the second semiconductor layer region and being the same in conductivity type as the second semiconductor layer region; and a gate electrode layer forming a channel at a surface of the second semiconductor layer region for transferring charges between the first and third semiconductor layer regions.

In the semiconductor device according to the first aspect of the invention, the third semiconductor layer region corresponding to an emitter layer region in one embodiment of the invention has a gear-like form, and concave regions of the third semiconductor layer region have a reduced width. Therefore, it is possible to decrease a width of the second semiconductor layer region immediately under the third semiconductor layer region in a parasitic bipolar transistor that is formed of the semiconductor region (drift layer), the second semiconductor layer region (base region in one embodiment) and the third semiconductor layer region (emitter layer in one embodiment). Accordingly, the resistance of the second semiconductor layer region can be reduced. Thus, a parasitic bipolar transistor operation is suppressed, and therefore latch-up of a parasitic thyristor can be suppressed. The heavily doped semiconductor layer region is arranged under the third semiconductor layer region. Likewise, the resistance of the second semiconductor layer region immediately under the third semiconductor layer region can be reduced, so that the parasitic bipolar transistor operation can be suppressed, and the latch-up immunity can be improved.

The main body portion is formed continuously, which does not reduce a width of a channel formed with respect to the third semiconductor layer region that is the emitter in one embodiment. Collector-emitter current (ICE) characteristics or source-drain current characteristics, when a collector-emitter voltage or a source-drain voltage is applied under the condition that a certain gate-emitter or gate-source voltage (VGE or VGS) is applied, do not deteriorate. Since the channel region has the annular or the ring-shaped form, the channel region can made large, to conduct a large current.

Since an arrangement pitch of the convex portions is larger than the width of the convex portions, a gate electrode interconnection can be readily led out.

According to the semiconductor device of the second aspect of the invention, the third semiconductor layer region corresponding to the emitter layer region in one embodiment is formed of the unit regions each having the island-like form and spaced from each other, and the heavily doped semiconductor layer region is arranged under the unit regions. Accordingly, the resistance of the second semiconductor layer region immediately under the third semiconductor layer region can be reduced in the parasitic bipolar transistor that is formed of the semiconductor region (drift layer), the second semiconductor layer region (base region in one embodiment) and the third semiconductor layer region (emitter region in one embodiment). This can suppress the parasitic bipolar transistor operation, and accordingly can suppress the latch-up of the parasitic thyristor.

In a region between the unit regions, the heavily doped semiconductor layer region can pass minority carriers so that the minority carriers can be efficiently absorbed, and the turn-off time can be reduced. The heavily doped semiconductor layer region is arranged under the third semiconductor layer region, to reduce the resistance of the second semiconductor layer region immediately under the third semiconductor layer region, so that the parasitic bipolar transistor operation can be suppressed, and the latch-up immunity can be improved.

The unit regions are separated from each other in the third semiconductor layer region that is the emitter in one embodiment, but the width of the unit region is smaller than the distance between the unit regions. A width of a channel formed for the whole of the third semiconductor layer region is not substantially reduced. Collector-emitter current (ICE) characteristics or source-drain current characteristics, when a collector-emitter voltage or a source-drain voltage is applied under the condition that a certain gate-emitter or gate-source voltage (VGE or VGS) is applied, do not deteriorate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
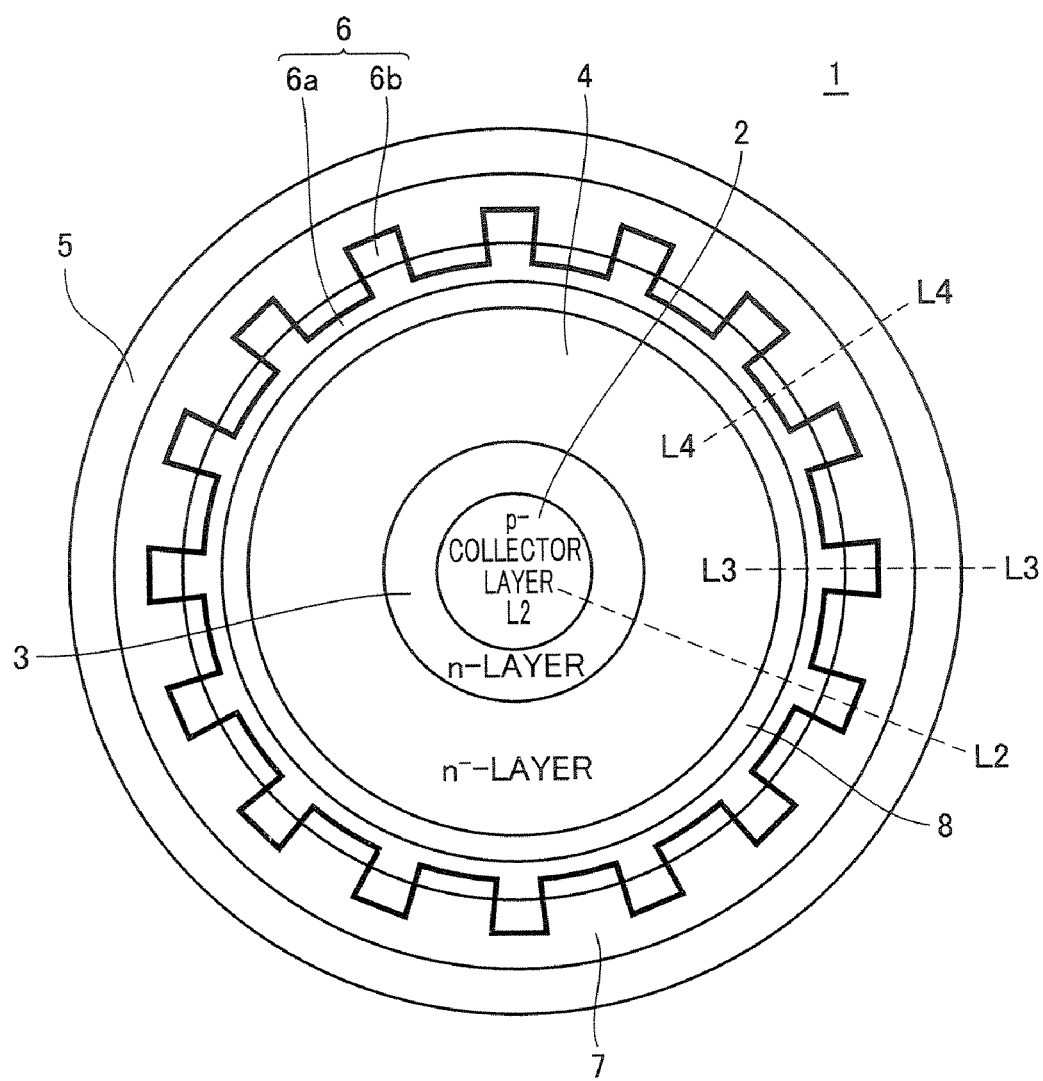
FIG. 1 schematically shows a surface layout of a lateral IGBT according to a first embodiment of the invention.

FIG. 1 schematically shows a planar layout of a lateral n-channel IGBT according to a first embodiment of the invention. FIG. 1 does not show insulating films, interconnection lines, electrodes and the like, and further does not show a heavily doped semiconductor region which is one of characteristic features of the invention.

In FIG. 1, an IGBT 1 includes a p-type collector layer (first semiconductor layer region) 2 formed at a central portion in a circular form, an n-type buffer layer (semiconductor region) 3 formed surrounding collector layer 2, an n$^-$-type drift layer (semiconductor region) 4 formed in a ring-shaped form outside buffer layer 3, an annular p-type base layer (second semiconductor region) 5 formed in a ring-shaped form outside n$^-$-type drift layer 4, and an n$^+$-emitter layer (third semiconductor region) 6 formed in p-type base layer 5.

Emitter layer 6 includes a main body 6a formed into a continuous, ring-shaped form and convex portions 6b that are arranged at predetermined intervals, are coupled to main body 6a and protrude away from collector layer 2. N$^+$-emitter layer 6 is formed having partially increased radial length with the convex portions, to shorten the length of p-type base layer 5 located under the emitter layer, for reducing the base resistance.

In p-type base layer 5, a channel formation region 8 in which a channel is formed by a voltage on a not-shown gate electrode is arranged between emitter layer 6 and n$^-$-drift layer 4. An emitter electrode contact region 7 of a ring-shaped form is arranged at a central portion of p-type base layer 5 in the region of emitter layer 6. An emitter electrode electrically coupled to convex portion 6b of emitter layer 6 is arranged in emitter electrode contact region 7.

Since emitter layer 6 has main body 6a formed continuously in a ring-shaped form, the channel formed in channel formation region 8 is formed continuously in the ring-shaped form.

N-type layer (buffer layer) 3 formed surrounding p-type collector layer 2 absorbs minority carriers transferred from p-type collector layer 2.

Figure 2:
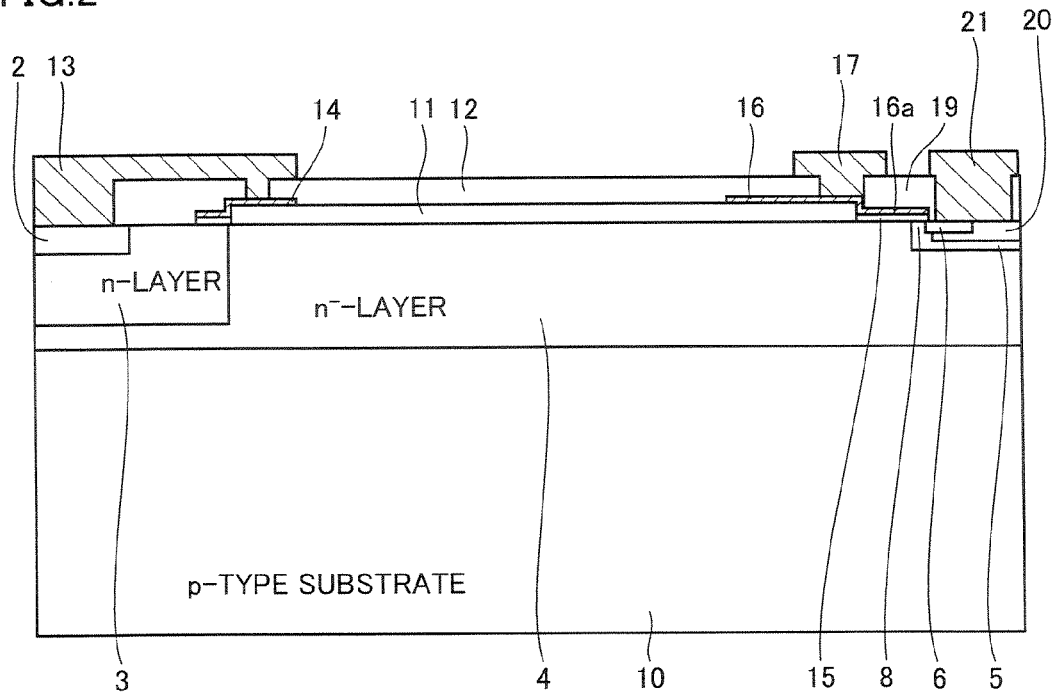
FIGS. 2, 3 and 4 schematically show sectional structures taken along lines L2-L2, L3-L3 and L4-L4 in FIG. 1, respectively.

FIG. 2 schematically shows a cross sectional structure of IGBT 1 taken along a line L2-L2 shown in FIG. 1. In FIG. 2, IGBT 1 has n$^-$-type drift layer 4 formed on a surface of a p-type semiconductor substrate (semiconductor substrate) 10. N-type layer (well region) 3 is formed at a central portion (left end in FIG. 2) of a surface of n$^-$-type layer (drift layer) 4, and p-type collector layer 2 is formed at the surface of n-type (buffer) layer 3. P-type collector layer 2 is electrically coupled to a collector electrode 13, which in turn is coupled to a collector terminal (not shown) via a collector electrode line 14.

A first insulating film 11 is formed under collector electrode and interconnection line 14 and at the surface of n$^-$-layer 4, and a second insulating film 12 serving as a passivation film is formed on first insulating film 11. An interlayer insulating film is provided between collector electrode 13 and n-buffer layer 3.

In an emitter portion shown on the right side of FIG. 2, a gate interconnection line 16 is formed on first insulating film 11. Gate interconnection line 16 includes a gate electrode and interconnection line portion 16a formed on n$^-$-layer 4 with a gate insulating film 15 interposed in between. Gate interconnection line 16 is electrically coupled to a gate electrode 17. In gate interconnection line 16, gate electrode interconnection portion 16a has a ring-shaped form, so that according to a voltage applied to the gate electrode 17, a channel can be formed over a whole channel formation region 8 at the surface of p-type base layer 5.

A p$^+$-layer 20 that is doped more heavily than p-type base layer 5 is formed at the surface of p-type base layer 5, being deeper than emitter layer 6. N$^+$-emitter layer 6 is formed on p$^+$-layer 20. An emitter electrode 21 is formed to be in contact with both p$^+$-layer 20 and n$^+$-emitter layer 6. An interlayer insulating film 19 is provided between gate electrode 17 and emitter electrode 21 for isolating them from each other.

Heavily doped p$^+$-layer 20 is arranged at the bottom of n$^+$-emitter layer 6, and therefore the base layer located at the bottom of n$^+$-emitter layer 6 has a reduced resistance value to reduce a voltage drop thereacross.

Figure 3:
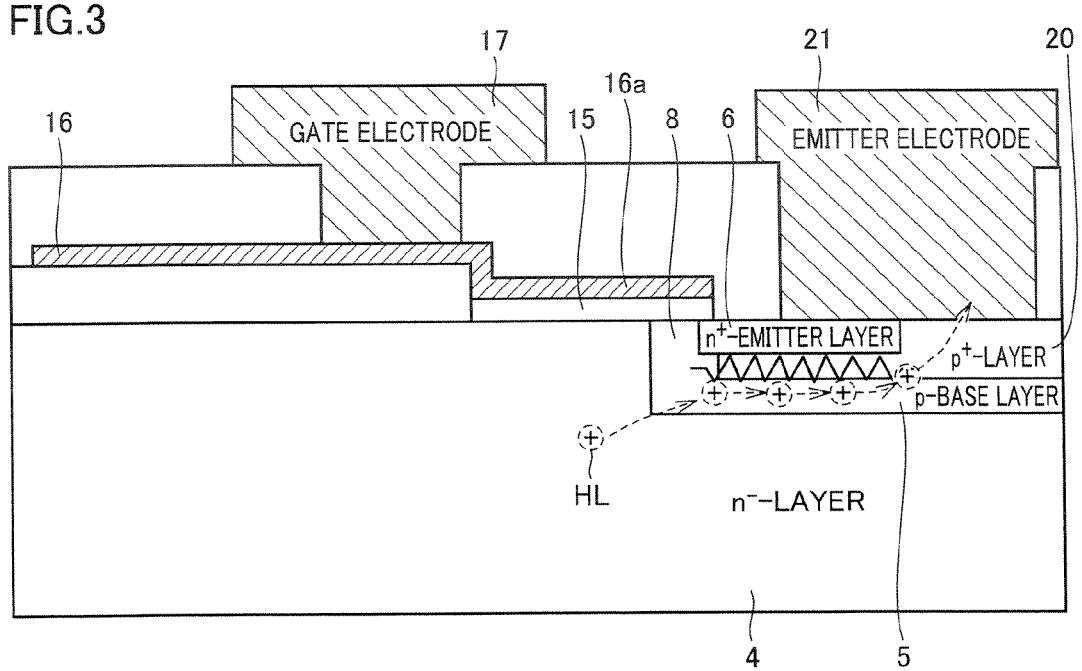

FIG. 3 schematically shows a cross sectional structure of IGBT 1 taken along a line L3-L3 in FIG. 1. The cross sectional structure of IGBT 1 shown in FIG. 3 is the same as that of the portion neighboring the emitter region of the IGBT shown in FIG. 2. Corresponding portions are allotted with the same reference numerals, and detailed description thereof will not be repeated. However, first and second insulating films 11 and 12 shown in FIG. 2 are not particularly appended the reference numerals in FIG. 3.

As shown in FIG. 3, n$^+$-emitter layer 6 extends from channel formation region 8 to a portion under emitter electrode 21 (the convex portions are coupled to emitter electrode 21). Emitter electrode 21 is also coupled to p$^+$-layer 20 formed under n$^+$-emitter layer 6. Therefore, a contact resistance between emitter electrode 21 and the base layer can be reduced as compared with the case where p-type base layer 5 is directly coupled to emitter electrode 21. During turn-off or in the steady state, holes HL flow from p-base layer 5 into emitter electrode 21 via p$^+$-layer 20. In this operation, the resistance value in p$^+$-layer 20 is small, and the voltage drop of p-type base layer 5 under n$^+$-emitter layer 6 is small. Therefore, it is possible to prevent p-type base layer 5 and n$^+$-emitter layer 6 from being forwardly biased and accordingly to prevent turn-on of a parasitic npn bipolar transistor. Specifically, owing to the provision of p$^+$-layer 20, holes HL can flow without stagnation immediately under n$^+$-emitter layer 6 into emitter electrode 21 so that the holes of minority carriers can be discharged rapidly. In other words, through the reduction in contact resistance of base layer 5 (p$^+$-layer 20) with respect to emitter electrode 21, the base resistance of the p-base region immediately under n$^+$-emitter layer 6 can be resultantly reduced.

Figure 4:
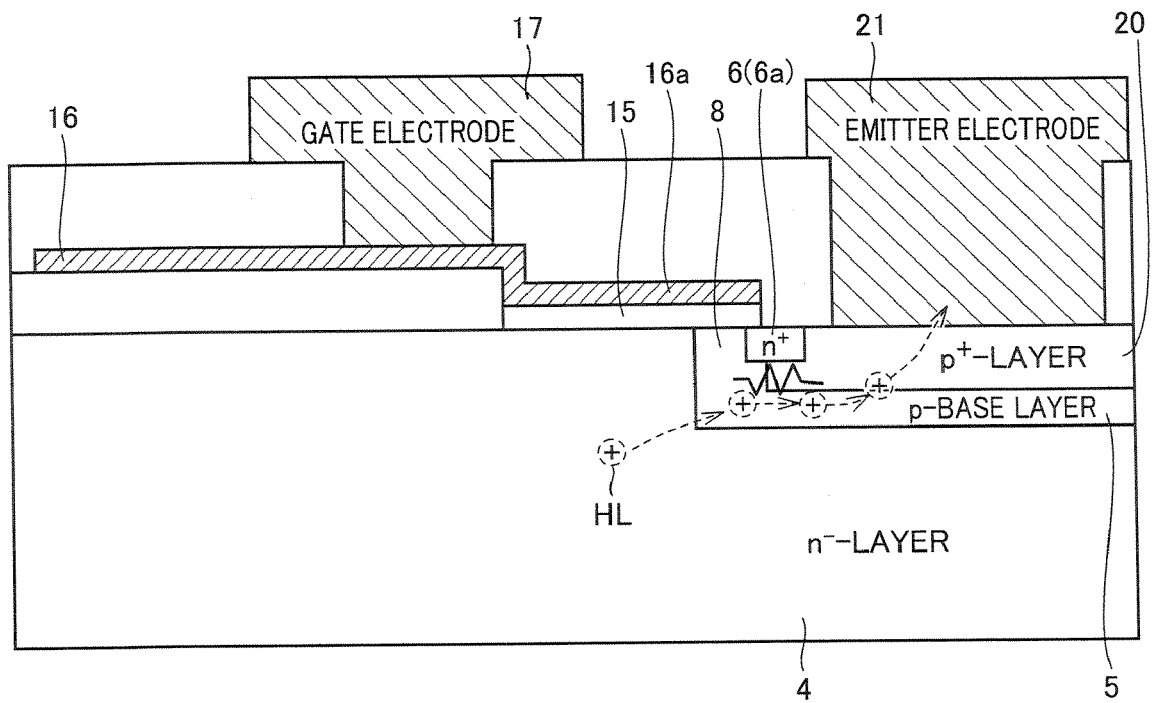

FIG. 4 schematically shows a cross sectional structure of IGBT 1 taken along a line L4-L4 in FIG. 1. In the region of IGBT 1 shown in FIG. 4, at n$^+$-emitter layer 6, there is provided main body 6a, but there is not provided convex portions 6b. Therefore, emitter electrode 21 is in contact with only p$^+$-layer 20. Other structure in the cross sectional structure shown in FIG. 4 is the same as that in FIG. 3. Corresponding portions are assigned the same reference numerals, and description thereof is not repeated.

As shown in FIG. 4, main body 6a is short in a radial direction at the portion where convex portion 6b is no provided in n$^+$-emitter layer 6. In this region, therefore, the base resistance under n$^+$-emitter layer 6 is even smaller, and holes HL are discharged to emitter electrode 21 via p$^+$-layer 20 of a small resistance without being stagnated. Thereby, the parasitic npn bipolar transistor operation can be suppressed more effectively, and therefore the latch-up immunity of the parasitic thyristor can be improved during the turn-off of IGBT 1 and during the on state in the steady state.

Figure 5:
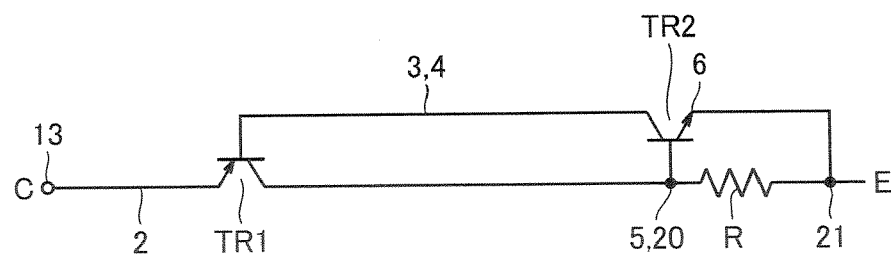
FIG. 5 shows an electrically equivalent circuit of a parasitic thyristor of the lateral IGBT shown in FIGS. 1 to 4.

FIG. 5 shows an electrically equivalent circuit of the parasitic thyristor of lateral IGBT 1 shown in FIGS. 1 to 4. In FIG. 5, the parasitic thyristor includes a pnp bipolar transistor TR1 and an npn bipolar transistor TR2. Pnp bipolar transistor TR1 has an emitter formed of p-type collector layer 2, a base formed of $n^+$- and $n^-$-layers 3 and 4, and a collector formed of p-base layer 5 and $p^+$-layer 20. Npn bipolar transistor TR2 has a collector formed of $n^+$- and $n^-$-layers 3 and 4, an emitter formed of $n^+$-emitter layer 6 and a base formed of p-base layer 5 and $p^+$-layer 20. A base resistance R is present in a base layer of bipolar transistor TR2.

The emitter of parasitic bipolar transistor TR1 is coupled to collector electrode 13, and the emitter and base of parasitic bipolar transistor TR2 are coupled to emitter electrode 21.

Since $p^+$-layer 20 is employed, and $n^+$-emitter layer 6 has a reduced radial length, base resistance R can be reduced. Accordingly, the base-emitter voltage of parasitic bipolar transistor TR2 can be prevented from exceeding the built-in voltage, and parasitic bipolar transistor TR2 is prevented from being turned on. Thereby, the latch-up immunity of the parasitic thyristor can be improved.

Although emitter layer 6 has a periphery formed into a gear-like shape having convex and concave portions, has main body 6a at its inner portion formed continuously, to provide continuous channel formation region 8. Since main body 6a of emitter region 6 is formed into a ring-shaped form, the channel is also formed continuously along the circumferential direction of emitter layer 6, and the channel width can be made sufficiently large. Therefore, it is possible to suppress deterioration of characteristics of a collector-emitter current ICE, when a collector-emitter voltage VC is applied in the state where a certain gate-emitter voltage VGE is applied, and a large current can be driven.

Figure 6A:
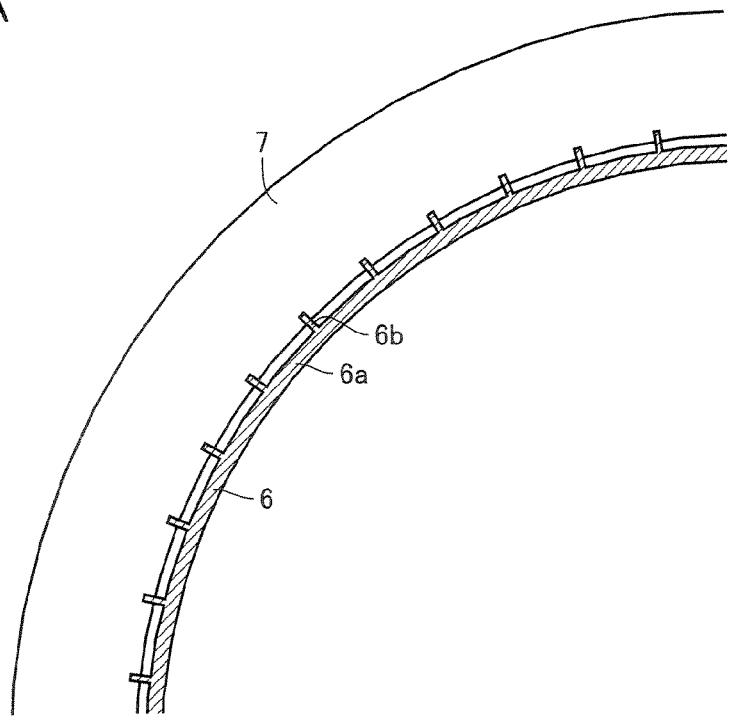
FIG. 6A shows, on an enlarged scale, forms of an emitter layer and an emitter contact region.

FIG. 6A specifically shows an emitter contact region for $n^+$-emitter layer 6 in the planar layout shown in FIG. 1. $N^+$-emitter layer 6 includes main body 6a of a continuous and ring-shaped form, and convex portions 6b spaced from each other by a predetermined distance. Convex portions 6b are coupled to main body 6a. An emitter contact region 25 partially overlapping with convex portion 6b is formed along the outer periphery of main body 6a. In emitter electrode contact region 7, emitter electrode (21) is formed and electrically connected to underlying convex portions 6b and $p^+$-layer 20 (not shown in FIG. 6A).

Therefore, convex portions 6b are used in emitter electrode contact region 7 as regions for making electric contact with $n^+$-emitter layer 6, and thereby it is possible to reduce a length of the p-type base layer under $n^+$-emitter layer 6.

Figure 6B:
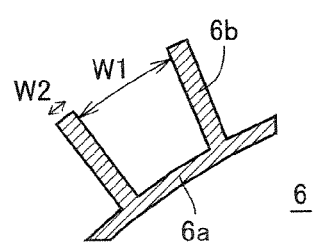
FIG. 6B shows, on an enlarged scale, a structure of the emitter layer.

FIG. 6B shows, on an enlarged scale, a structure of a part of $n^+$-emitter layer 6 shown in FIG. 6A. In $n^+$-emitter layer 6, convex portions 6b each having a width W2 are formed along the outer periphery of main body 6a, and are aligned to each other in the circumferential direction with a predetermined pitch (interval) W1. Pitch W1 of arrangement of convex portions 6b is significantly larger than width W2 of convex portion 6b (W1>W2). By arranging convex portions 6b of the $n^+$-emitter layer at sufficient intervals, it is possible to suppress sufficiently the increase in a width of $n^+$-emitter layer 6 in the radial direction and thereby to reduce the base resistance. In addition, pitch W1 sufficiently larger than width W2 of convex portion 6b can provide the following advantage.

Figure 7:
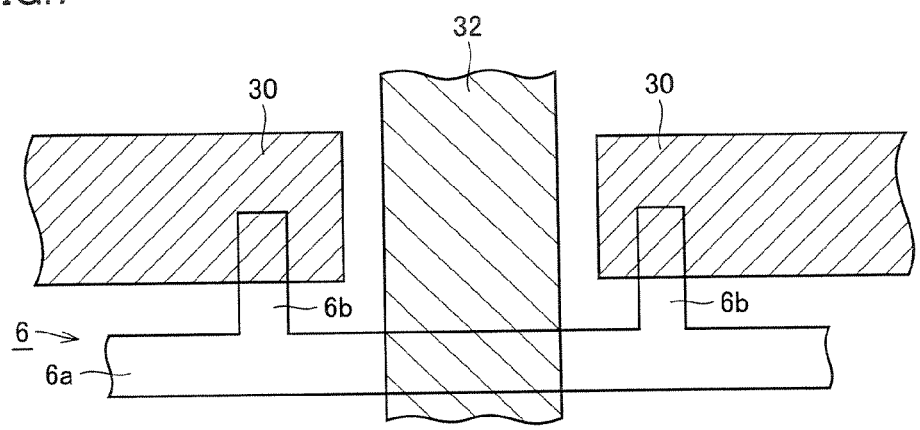
FIG. 7 shows an example of an arrangement of a gate electrode lead-out line in the structure of the emitter layer shown in FIG. 6A.

FIG. 7 shows, on an enlarge scale, the planar layout of the $n^+$-emitter layer, emitter electrode and gate electrode lead-out line. As shown in FIG. 7, $n^+$-emitter layer 6 includes main body 6a of the ring-shaped, continuous form, and convex portions 6b adjacent to main body 6a and arranged at predetermined pitches (W1). Electrical contact is made between convex portions 6b and an emitter electrode 30 (21). Emitter electrode 30 corresponds to emitter electrode 21 shown in FIG. 2, has a ring-shaped form and is arranged along emitter electrode contact region 7 shown in FIG. 1. A gate electrode lead-out line 32 is arranged between adjacent convex portions 6b.

Emitter electrode 30 is cut off in a region between convex portions 6b where gate electrode lead-out line 32 is arranged. Therefore, main body 6a of $n^+$-emitter layer 6 can continuously extend under gate electrode lead-out line 32, and emitter electrode 21 (30) can be in electrical contact with $n^+$-emitter layer 6 via convex portions 6b. Thereby, it is not necessary to separate off emitter layer 6 at the region where gate electrode lead-out line 32 is arranged. Since $n^+$-emitter layer main body 6a is formed extending continuously, the channel formation region can also made extending continuously, and the reduction in channel width of the IGBT can be prevented.

Figure 8:
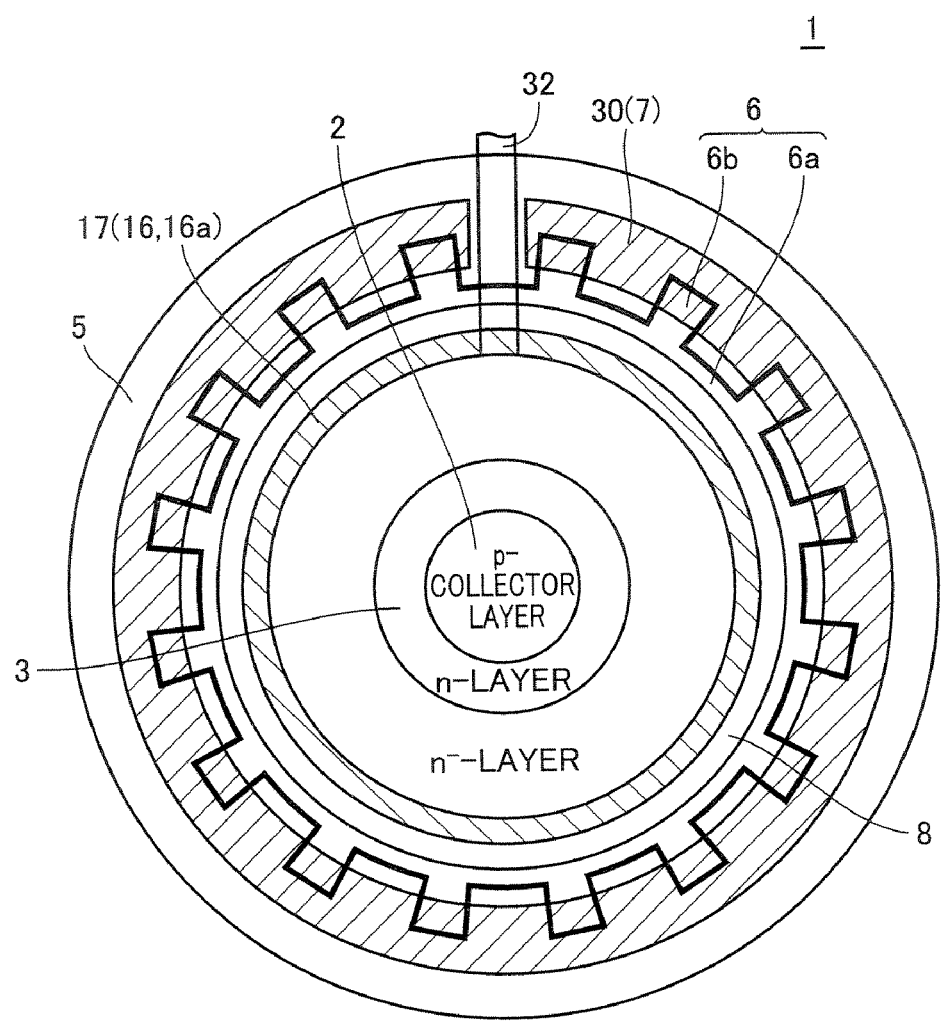
FIG. 8 schematically shows a planar layout of the gate electrode lead-out line shown in FIG. 7 and various electrodes.

FIG. 8 schematically shows a planar layout of the emitter and gate electrodes of IGBT 1. As shown in FIG. 8, IGBT 1 includes channel formation region 8 arranged along and inside p-base layer 5. Gate electrode 17 (gate interconnections including gate electrode interconnection lines 16 and 19) is arranged in the ring-shaped form inside channel formation 8. Gate electrode 17 is arranged surrounding n-buffer layer 3 and p-collector layer 2 formed inside.

$N^+$-emitter layer 6 that has main body 6a formed in a ring-shaped, continuous form and convex portions 6b coupled to main body 6a is arranged outside and along channel formation region 8. Emitter electrode 30 (emitter electrode contact region 7) is formed at the surface of p-base layer 5. Emitter electrode 30 is arranged partially overlapping with convex portions 6b of emitter layer 6, and has a discontinuous region located between convex portions 6b. Gate electrode lead-out line 32 is arranged in the discontinuous region of emitter electrode 30, and is coupled at its inner portion to channel gate electrode 17 of the ring-shaped form.

As shown in FIG. 8, $n^+$-emitter layer 6 has a continuous form, and is electrically connected to emitter electrode 30. Therefore, the channel inside $n^+$-emitter layer 6 can be formed continuously in channel formation region 8, and reduction of the channel width can be suppressed.

In FIG. 8, emitter electrode 30 has one discontinuous region, where gate electrode lead-out line 32 is arranged. However, emitter electrode 30 may be cut off at a plurality of portions, and gate electrode lead-out line 32 may be arranged at each of the cut-off portions. It is merely required that all the divided emitter electrodes 30 are commonly coupled to the emitter electrode lead-out interconnection line (emitter terminal).

As described above, the width (W1) in the circumferential direction of convex portion 6b is smaller than the pitch (W2) in the circumferential direction of convex portions 6b, whereby gate electrode lead-out line 32 can be arranged with a sufficient margin. Thereby, the characteristics of collector-emitter current ICE when collector-emitter voltage VC is applied under the condition that a certain gate-emitter voltage VGE is applied, can be prevented from being deteriorated.

The description has been made on the n-channel IGBT. However, even with a lateral p-channel IGBT, similar effects can be achieved as in the n channel lateral IGBT.

In the lateral p-channel IGBT, respective regions have the conductivity types opposite to those in the n-channel IGBT, and an n-base layer has a heavily doped 6 semiconductor region being formed adjacent to a p-emitter region and deeper than the emitter layer.

[First Modification]

Figure 9:
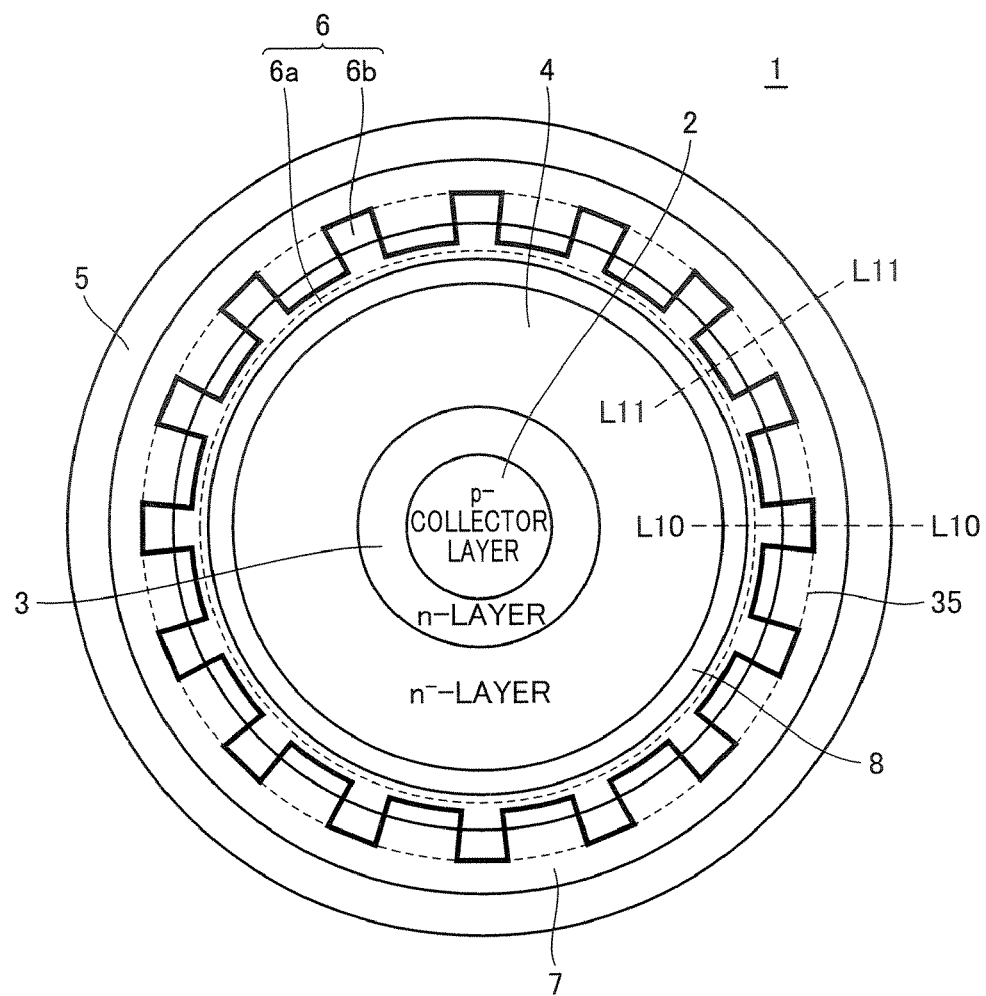
FIG. 9 schematically shows a planar layout of a lateral IGBT of a first modification of the first embodiment of the invention.

FIG. 9 schematically shows a planar layout of the IGBT of a first modification of the first embodiment of the invention. FIG. 9 does not show the insulating films, electrodes and interconnections, either. The planar layout shown in FIG. 9 differs from the planar layout of IGBT 1 shown in FIG. 1 in the following points. Inside p-type base layer 5, a heavily doped p$^+$-layer 35 of a ring-shaped form is arranged, which is located under n$^+$-emitter layer 6, and has an outer periphery aligned to tip ends of convex portions 6b of emitter layer 6. In the planar layout shown in FIG. 9, other structures are the same as those in the planar layout shown in FIG. 1. Corresponding portions are allotted with the same reference numerals, and description thereof is not repeated.

Figure 10:
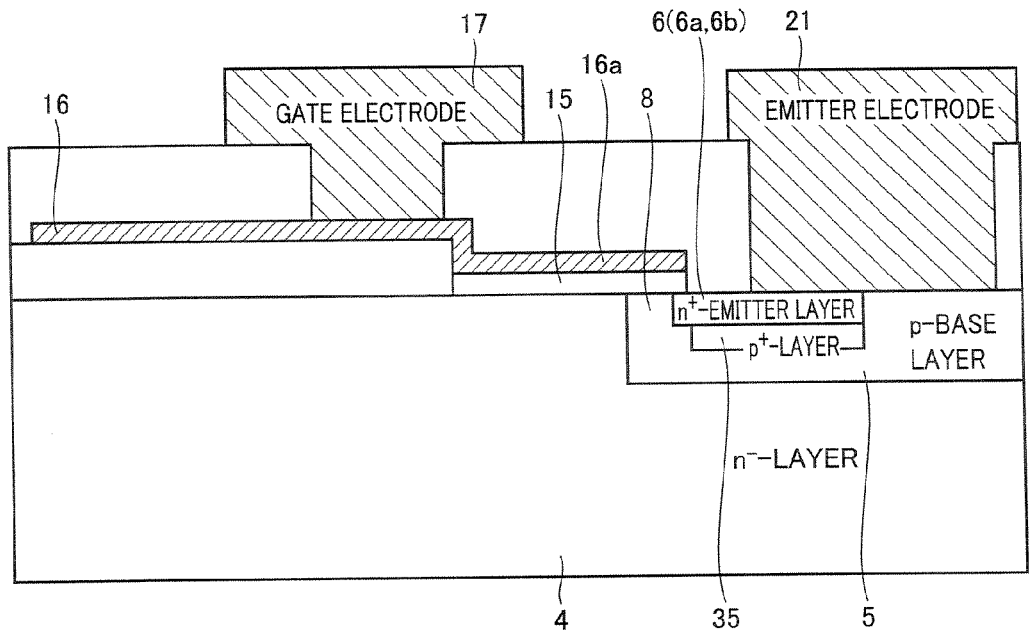
FIGS. 10 and 11 schematically show cross sectional structures taken along lines L10-L10 and L11-L11 shown in FIG. 9, respectively.

FIG. 10 schematically shows a cross sectional structure taken along a line L10-L10 in FIG. 9. In FIG. 10, p$^+$-layer 35 is formed under n$^+$-emitter layer 6 (6a and 6b) in p-base layer 5 with its end aligned to the end of n$^+$-emitter layer. Other structures in the sectional structure shown in FIG. 10 are the same as those in the cross sectional structure shown in FIG. 3. Corresponding portions are allotted with the same reference numerals, and description thereof is not repeated. In this region, therefore, emitter electrode 21 is electrically coupled to p-type base layer 5 and to n$^+$-emitter layer 6.

Figure 11:
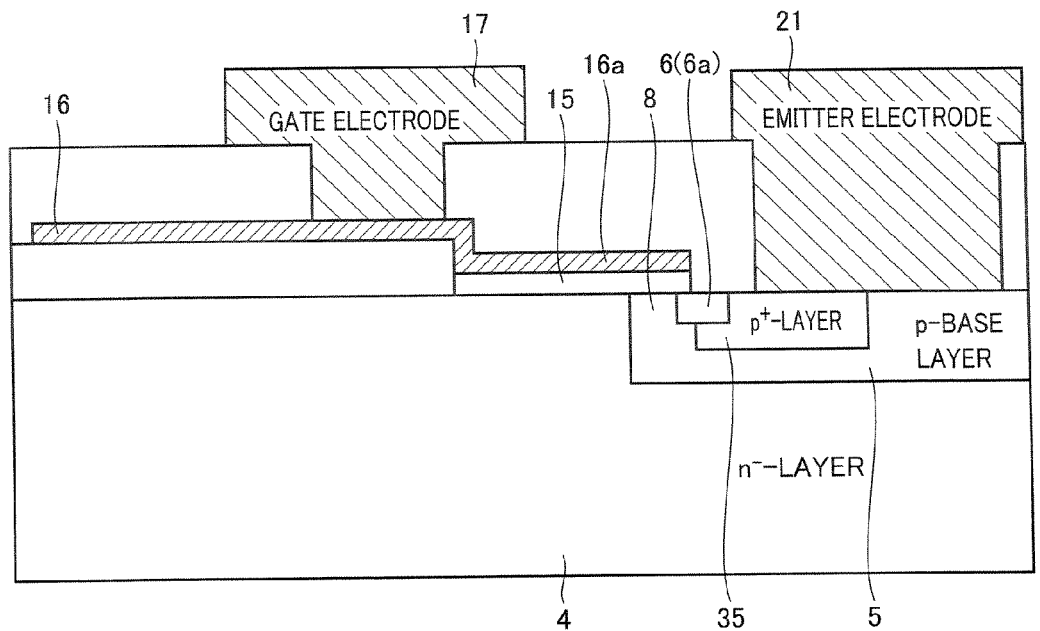

FIG. 11 schematically shows a cross sectional structure taken along a line L11-L11 shown in FIG. 9. In the cross sectional structure shown in FIG. 11, n$^+$-emitter layer 6 has main body 6a, but does not have a convex portion (6b). In this region, heavily doped p$^+$-layer 35 is coupled to emitter electrode 21.

As shown in FIGS. 9 to 11, at the concave regions of the emitter layer where p$^+$-layer 35 is arranged under n$^+$-emitter layer 6 in p-base layer 5 and no concave portions 6b are provided, emitter electrode 21 is electrically connected to the heavily doped n$^+$-region. Thus, the resistance of p-base layer 5 can be reduced, and the latch-up immunity of the parasitic thyristor can be improved. Due to main body 6a, a channel can be formed in a ring-shaped and continuous form, and can have sufficiently increased channel width, so that deterioration of characteristics of collector-emitter current ICE can be suppressed. P$^+$-layer 35 is electrically coupled to emitter electrode 21, and a contact resistance of emitter electrode 21 to base layer 5 can be reduced. Thereby, the base resistance can be reduced, and the latch-up immunity of the parasitic thyristor can be further improved.

In n$^+$-emitter layer 6, the width of each convex portion 6b is made smaller than the arrangement pitch of convex portions 6b, and the gate electrode lead-out line can be arranged with a sufficient margin, as in the foregoing structure shown in FIG. 7.

[Second Modification]

Figure 12:
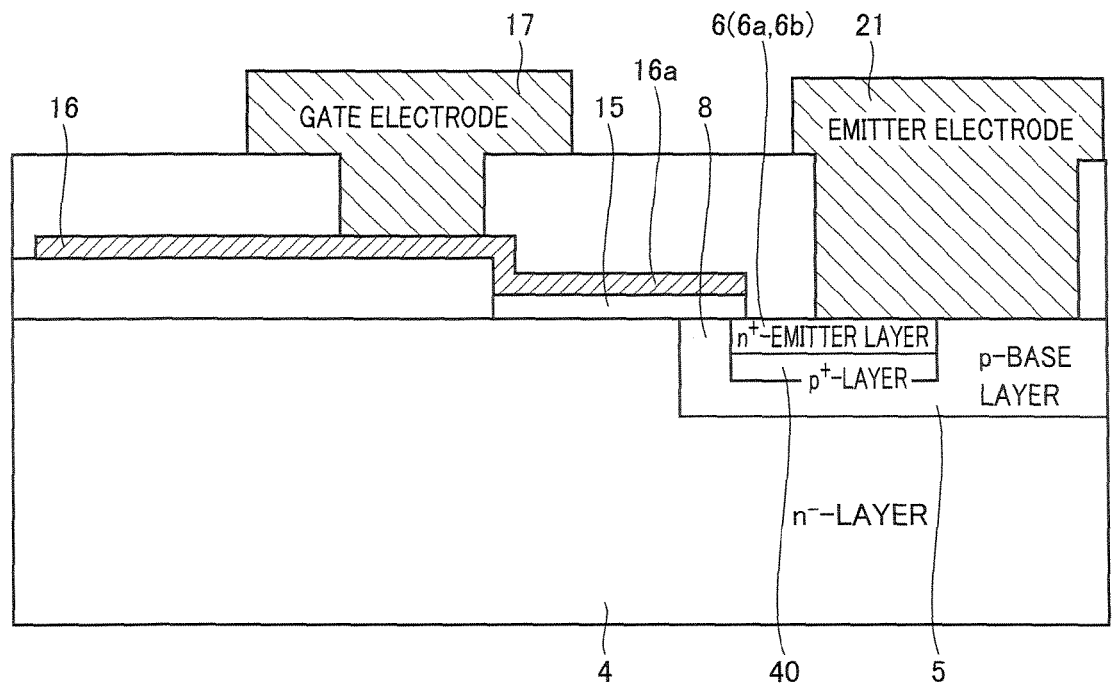
FIG. 12 schematically shows a cross sectional structure of a lateral IGBT of a second modification of the first embodiment of the invention.
Figure 13:
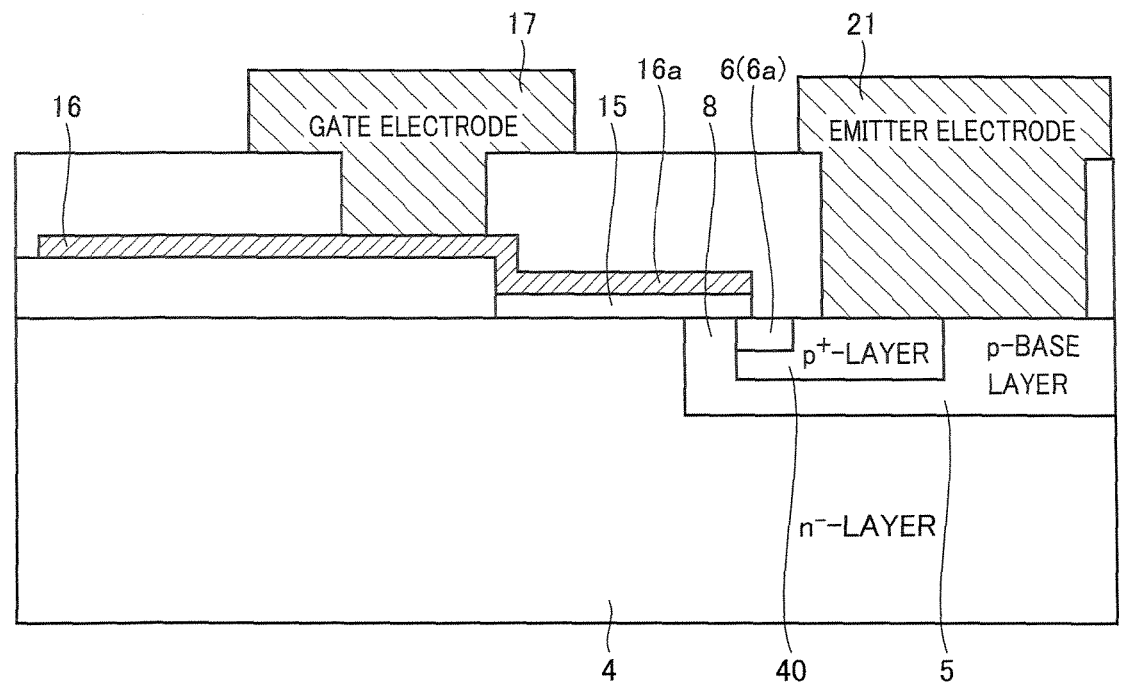
FIG. 13 schematically shows a cross sectional structure of an emitter region of the lateral IGBT of the second modification of the first embodiment of the invention.

FIGS. 12 and 13 schematically show cross sectional structures of an emitter region of an IGBT according to a second modification of the first embodiment of the invention. The cross sectional structure shown in FIG. 12 corresponds to the cross sectional structure taken along the line L10-L10 shown in FIG. 9. In the IGBT shown in FIG. 12, n$^+$-emitter layer 6 includes a main body 6a of a ring-shaped form and convex portions 6b projecting away from the collector layer, similarly to the structure already described. A p$^+$-layer 40 having substantially the same size as n$^+$-emitter layer 6 is arranged under n$^+$-emitter layer 6. Other structures in the cross sectional structure shown in FIG. 12 are the same as those in the cross sectional structure shown in FIG. 10. Corresponding portions are allotted with the same reference numerals, and description thereof is not repeated.

A cross sectional structure shown in FIG. 13 corresponds to the cross sectional structure taken along the line L11-L11 shown in FIG. 9. In FIG. 13, the convex portion (6b) of the n"+"-emitter layer is not arranged, and main body 6a is arranged. P$^+$-layer 40 is formed surrounding main body 6a of n$^+$-emitter layer 6, and is electrically coupled to emitter electrode 21.

Other structures in the cross sectional structure shown in FIG. 13 are the same as those in the cross sectional structure shown in FIG. 11. Corresponding portions are allotted with the same reference numerals, and description thereof is not repeated.

As shown in FIGS. 12 and 13, p$^+$-layer 40 is formed deeper than n$^+$-emitter layer 6 (6a and 6b) and at the portion below n$^+$-emitter layer 6 in p-base layer 5. Thus, the base resistance of p-base layer 5 can be reduced, and further the contact resistance to p-base layer 5 can be reduced, so that the effect similar to that by the structure shown in FIGS. 1 to 4 can be achieved.

[Third Modification]

Figure 14:
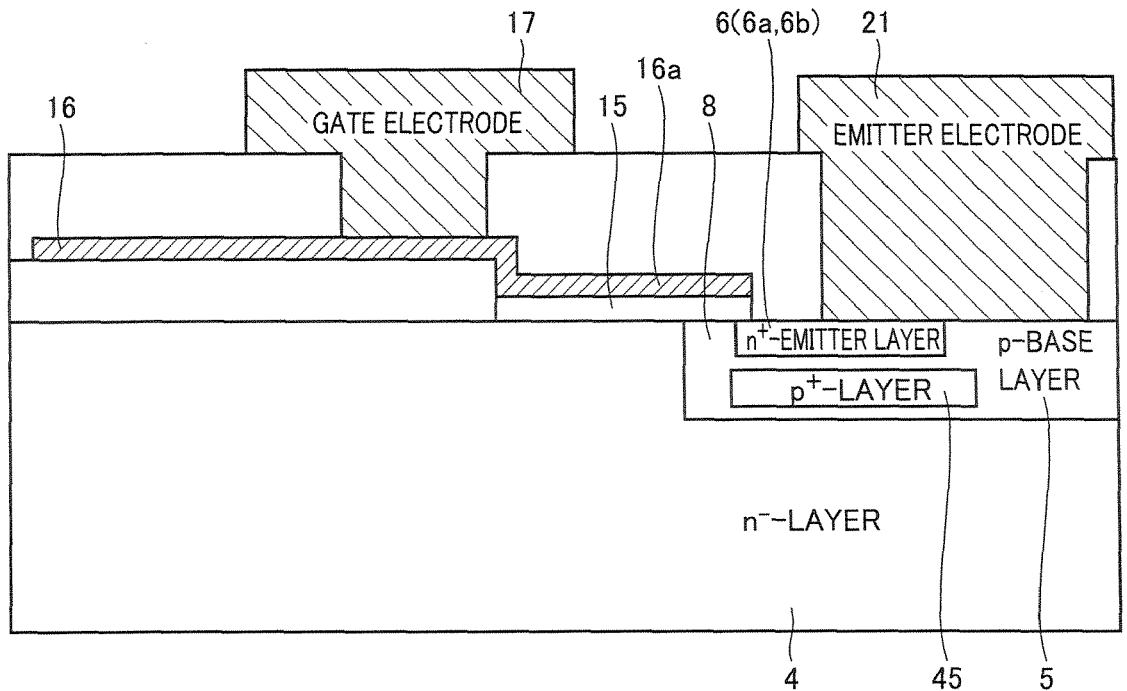
FIGS. 14 and 15 schematically show cross sectional structures of an emitter region of a lateral IGBT of a third modification of the first embodiment of the invention, respectively.
Figure 15:
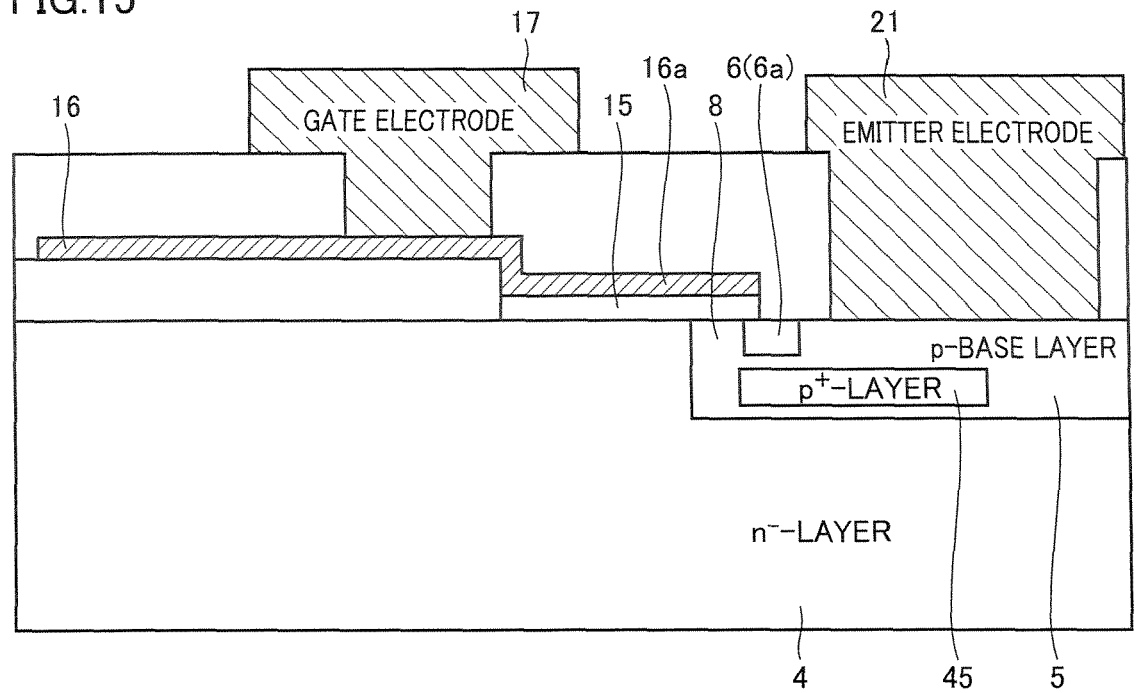

FIGS. 14 and 15 schematically show sectional structures of the emitter region according to a third modification of the first embodiment of the invention. The cross sectional structure shown in FIG. 14 corresponds to the cross sectional structure taken along the line L10-L10 in the planar layout shown in FIG. 9. The sectional structure shown in FIG. 15 corresponds to the sectional structure taken along the line L11-L11 in the planar layout shown in FIG. 9.

As shown in FIG. 14, a heavily doped p$^+$-layer 45 located under n$^+$-emitter layer 6 (main body 6a and convex portions 6b) is formed in p-base layer 5. P$^+$-layer 45 is embedded in p-base layer 5, and is separated from emitter layer 6. Emitter electrode 21 is electrically coupled to n$^+$-emitter layer 6 and p-base layer 5. As shown in FIG. 15, in a region layer where main body 6a is present but convex portion 6b is not present in n$^+$-emitter, p$^+$-layer 45 is formed extending in p-base layer 5 to a position under emitter electrode 21.

Other structures in the cross sectional structures shown in FIGS. 14 and 15 are the same as those in the cross sectional structures shown in FIGS. 12 and 13. Corresponding portions are allotted with the same reference numerals, and description thereof is not repeated.

Even in the structure in which p$^+$-layer 45 is arranged separately from n$^+$-emitter layer 6 in p-base layer 5 as shown in FIGS. 14 and 15, p$^+$-layer 45 serves to reduce the base resistance of the portion under n$^+$-emitter layer 6, and the latch-up immunity can be improved. Channel formation region 8 is formed continuously and can sufficiently suppress deterioration of characteristics of collector-emitter current ICE. The form of emitter layer 6 is the same as those shown in FIGS. 1 to 4 and those in the first and second modifications. Since emitter layer 6 has main body 6a and convex portions 6b, the gate electrode lead-out line can be arranged with a sufficient margin, and effects similar to those of the first embodiment and the first and second modifications already described can be achieved.

According to the first embodiment of the invention, as described above, the lateral IGBT has the emitter layer formed into the gear-like form having the concave and convex portions (form having the main body and the convex portions), and also has the heavily doped semiconductor layer formed in at least a portion deeper than the emitter layer. Therefore, the base resistance can be reduced, and the latch-up immunity of the parasitic thyristor can be improved. Further, the channel width can be sufficiently large, and it is possible to suppress such deterioration of the collector-emitter current (ICE) characteristics when the collector-emitter voltage (VC) is applied under the condition that a certain gate-emitter voltage (VCE) is applied. In addition, the gate electrode lead-out line can be arranged without adversely affecting contact between the emitter electrode and the emitter layer, so that it is possible to ensure a sufficiently large channel width and to drive a large current.

Second Embodiment

Figure 16:
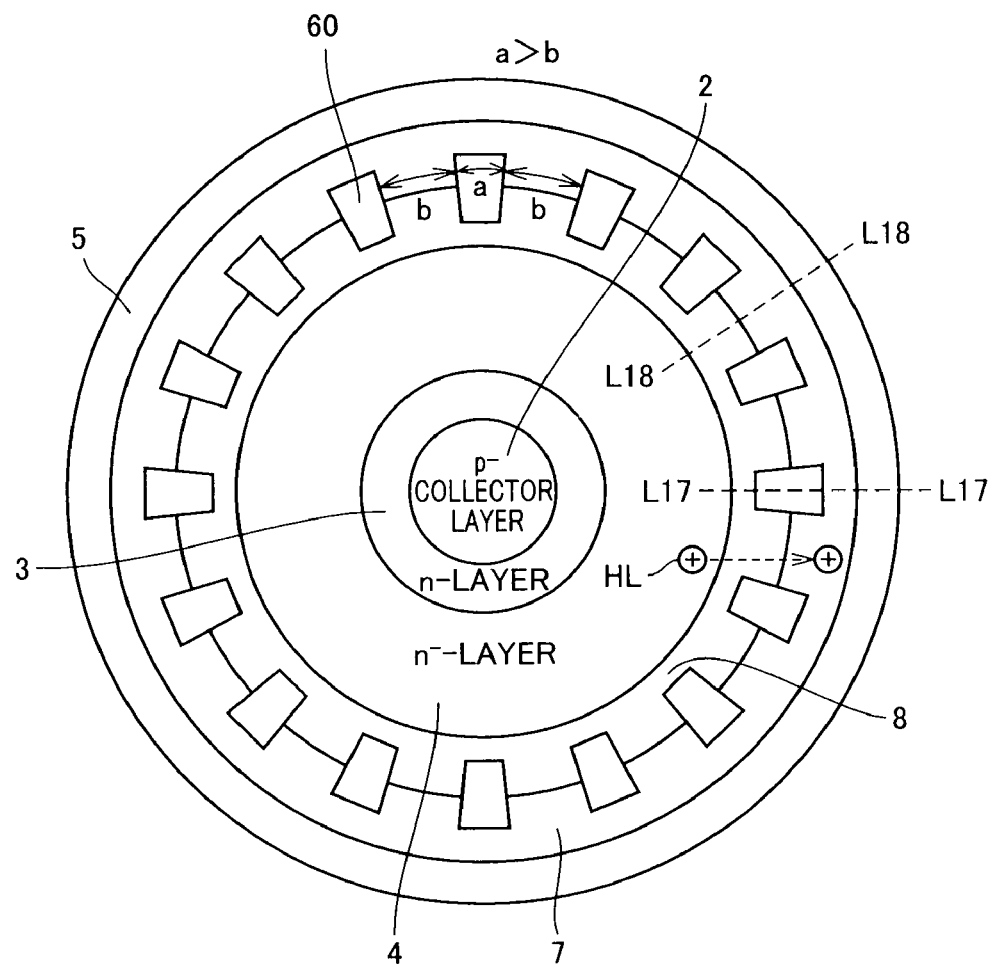
FIG. 16 schematically shows a surface layout of a lateral IGBT of a second embodiment of the invention.

FIG. 16 schematically shows a planar layout of an IGBT according to a second embodiment of the invention. For the sake of simplicity, FIG. 16 does not show the insulating films, electrode interconnection lines and heavily doped p-type layer in the base layer, similarly to FIG. 1.

The planar layout shown in FIG. 16 differs from that of the IGBT according to the first embodiment shown in FIG. 1 in the following points. As an $n^+$-emitter layer arranged in p-type base layer, unit emitter layers (unit regions) 60 are arranged in p-type base layer 5 at predetermined circumferential intervals. Other arrangements in the planar layout of the IGBT shown in FIG. 16 are the same as those in the planar layout shown in FIG. 1. Corresponding portions are allotted with the same reference numerals, and description thereof is not repeated.

A width a of unit emitter layer 60 along circumferential direction is larger than a distance b between adjacent unit regions. Unit emitter layer 60 can have any rectangular-like form having four sides. The width and the distance in the above description are dimensions in the circumferential direction.

Figure 17:
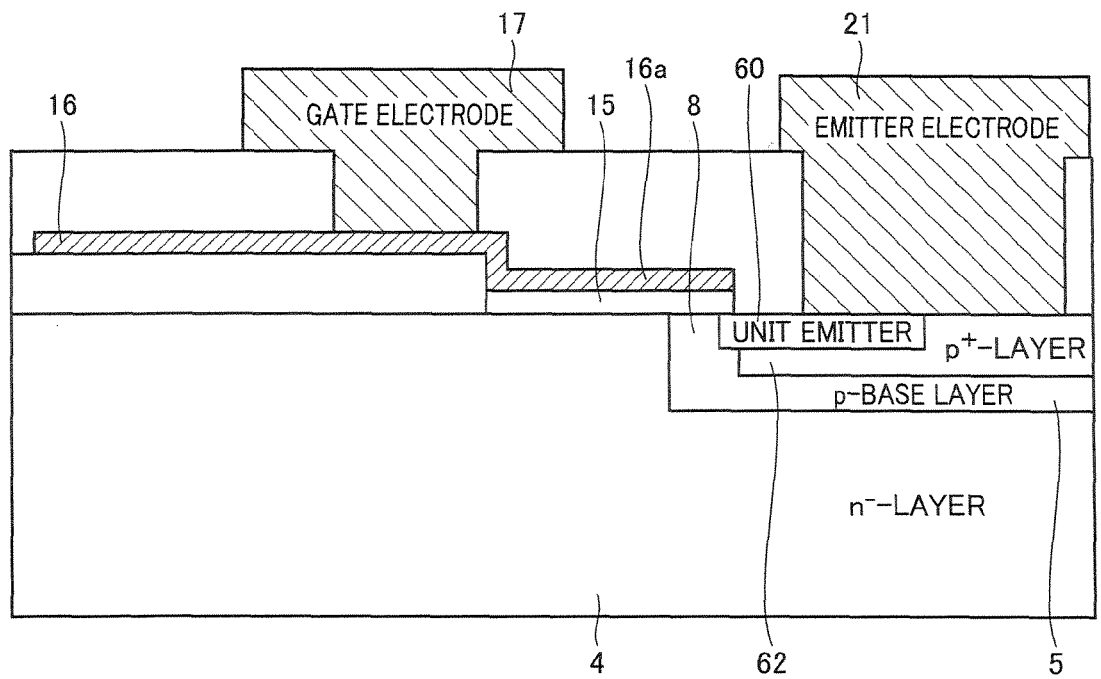
FIGS. 17 and 18 schematically show cross sectional structures taken along lines L17-L17 and L18-L18 in FIG. 16, respectively.

FIG. 17 schematically shows a cross sectional structure taken along a line L17-L17 shown in FIG. 16. As shown in FIG. 17, heavily doped p-type semiconductor layer ($p^+$-layer) 62 is formed, at the surface of p-base layer 5, under unit emitter layers 60. In emitter layer contact region 7 shown in FIG. 16, emitter electrode 21 is electrically connected to unit emitter layer 60 and $p^+$-layer 62. Channel formation region 8 is formed adjacent to the unit emitter layer at the surface of p-base layer 5. On channel formation region 8, gate interconnection 16a is formed with gate insulating film 15 interposed in between. Gate interconnection line 16a is formed of a continuously extending gate interconnection line, and forms a part of gate electrode 17.

Unit emitter layers 60 are formed in p-base layer 5 at the surface of $n^-$-layer 4, and heavily doped $p^+$-layer 62 is formed in p-base layer 5 deeper than and under the unit emitter layers.

Figure 18:
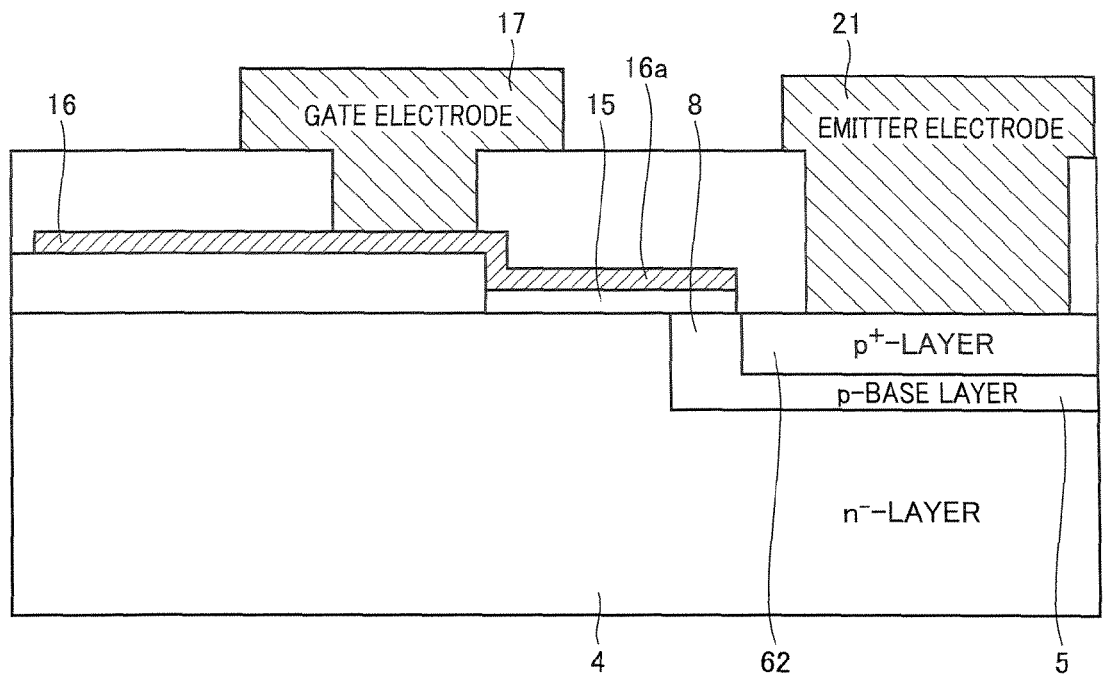

FIG. 18 schematically shows a cross sectional structure taken along a line L18-L18 shown in FIG. 16. Each unit emitter layer 60 is formed in an island-like form. In the region shown in FIG. 18, unit emitter layer 60 is not arranged, and $p^+$-layer 62 is formed extending adjacently to channel formation region 8, at the surface of p-base layer 5. $P^+$-layer 62 is coupled to emitter electrode 21.

Channel formation region 8 has a channel formed according to a voltage applied to upper gate interconnection line 16a. Unit emitter layer 60 is not arranged in the region shown in FIG. 18. Therefore, during the turn-off or during the on state in the steady state, holes more tend not to flow through a region immediately under $n^+$-emitter layer 60, but to flow to emitter electrode 21 through the p-base layer or $p^+$-layer 62 arranged between unit emitter layers 60. The holes flowing into a region immediately under the emitter layer are small in number, and an operation of a parasitic npn bipolar transistor operation formed of $n^-$-layer 4, p-base layer 5 and $n^+$-emitter layer 62 is suppressed. Thereby, it is possible to suppress latch-up of a parasitic thyristor formed of p-collector layer 2, n-buffer layer 3, $n^-$-drift layer 4, p-base layer 5 and $n^+$-emitter layer 60.

$P^+$-layer 62 serves to reduce the base resistance of the portion under unit emitter layer 60, and can suppress the latch-up of the parasitic thyristor, similarly to the first embodiment.

The regions where emitter electrode 21 is directly connected to $p^+$-layer 62 are present, and the contact resistance between each emitter electrode 21 and p-base layer 5 can be reduced, and the holes smoothly flow through the contact region between p-base layer 5 ($p^+$-layer 62) and emitter electrode 21, so that the latch-up immunity of the parasitic thyristor of unit emitter layer 60 and $p^+$-layer 62 can be further improved.

As shown in FIG. 16, the width a of the unit emitter layer along the circumferential direction is much larger than an arrangement pitch b of unit emitter layers 60. Therefore, the channel width can have sufficiently large due to the portions of channel formation region 8 facing to unit emitter layers 60, and the characteristics of collector-emitter current ICE can be improved.

As shown in FIG. 16, the form of unit emitter layer 60 in the planar layout may be selected from various forms such as a sector-like (fan-shaped) form, a trapezoidal form and a strip-like form. The unit emitter layer 60 may be sufficient to be formed into an island-like form providing a closed region having four sides. In this description of the present application, these strip-like form, trapezoidal form and sector-like form each having four sides will be referred to as "rectangle-like form".

Pitch b of unit emitter layers 60 is merely required to take a value allowing formation of a channel of a sufficient width in channel formation region 8. Therefore, unit emitter layer 60 may be configured to have a smaller outer portion and a wide inner portion facing to channel formation region 8 in the radial direction.

Similarly to the structure shown in FIG. 8, the gate electrode interconnection line lead-out line may be arranged in a region between such island-like regions.

[First Modification]

Figure 19:
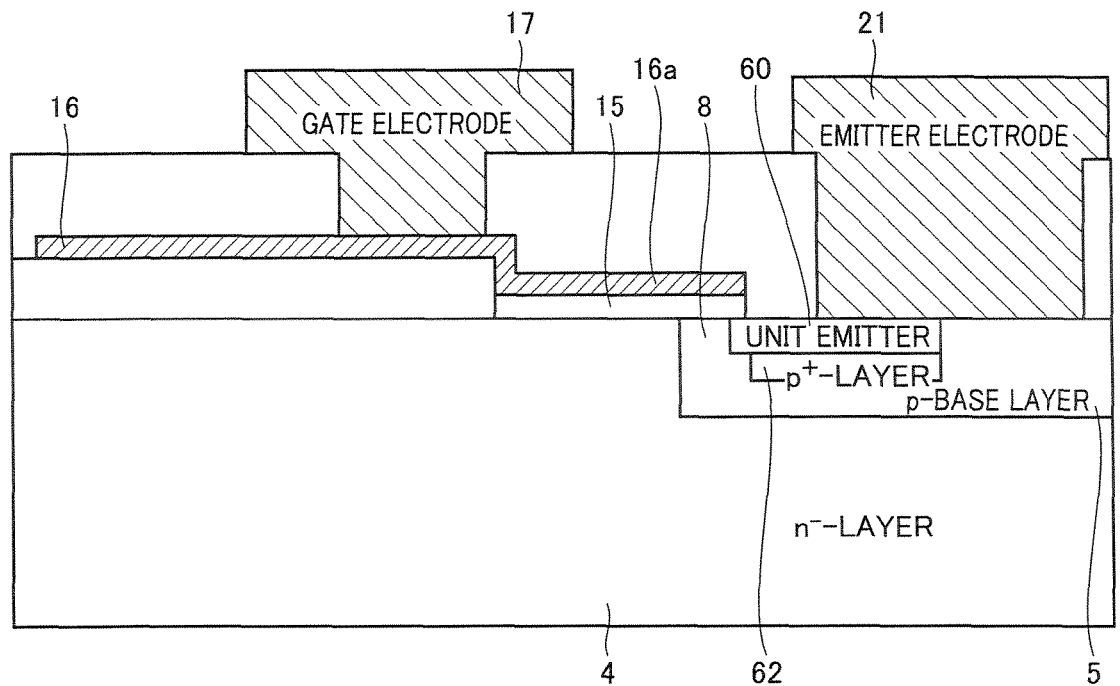
FIG. 19 schematically shows a cross sectional structure of an emitter region of a lateral IGBT of a first modification of the second embodiment of the invention.
Figure 20:
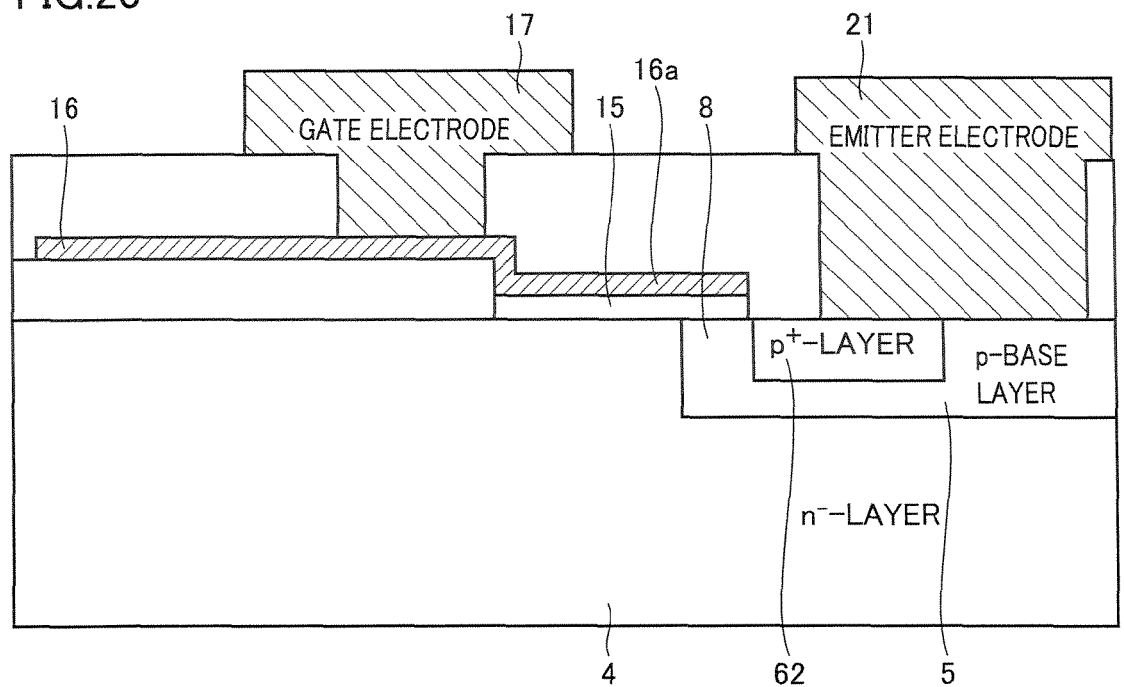
FIG. 20 schematically shows a cross sectional structure of an emitter region of a lateral IGBT of a first modification of the second embodiment of the invention.

FIGS. 19 and 20 schematically show cross sectional structures of an emitter region of the IGBT according to a first modification of the second embodiment of the invention. The cross sectional structure shown in FIG. 19 corresponds to the sectional structure taken along the line L17-L17 shown in FIG. 16, and the cross sectional structure in FIG. 20 corresponds to the sectional structure taken along the line L18-L18 shown in FIG. 16. In the structure shown in FIG. 19, $p^+$-layer 62 is formed under unit $n^+$-emitter layer 60. $P^+$-layer 62 has a length in the radial direction shorter than that of unit emitter layer 60, and has an outer periphery aligned to the outer periphery of unit emitter layer 60. In this region, therefore, emitter electrode 21 is electrically connected to unit emitter layers 60 and p-type base layer 5.

In the region where unit emitter layer 60 is not arranged, $p^+$-layer 62 is formed continuously on the surface of p-base layer 5. This $p^+$-layer 62 is formed in a partial portion of p-base layer 5 and adjacent to channel formation region 8. In this region, emitter electrode 21 is electrically connected to $p^+$-layer 62 and p-type base layer 5. Other portions in the sectional structures shown in FIGS. 19 and 20 have the same structures as those in the cross sectional structures shown in FIGS. 17 and 18. Corresponding portions are allotted with the same reference numerals, and description thereof is not repeated.

In the structures shown in FIGS. 19 and 20, merely p$^+$-layer 62 is made short in the radial direction, and channel formation region 8 in p-base layer 5 is formed extending to a portion under emitter electrode 21. Therefore, with the structures shown in FIGS. 19 and 20, effects similar to those of the structures shown in FIGS. 17 and 18 can be achieved.

[Second Modification]

Figure 21:
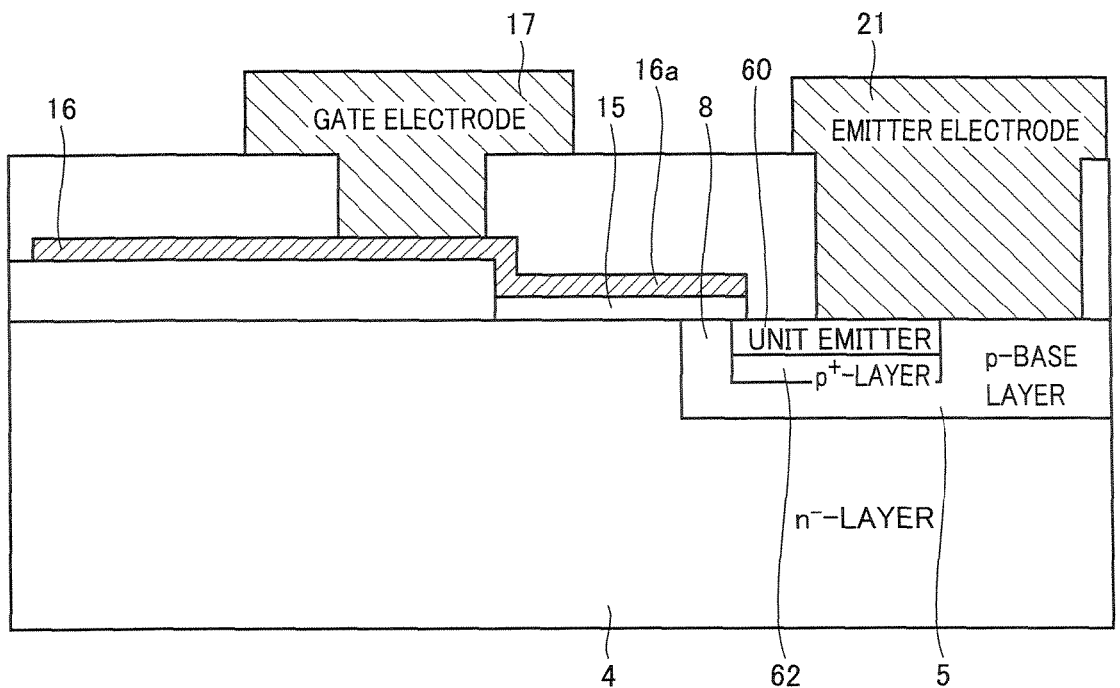
FIG. 21 schematically shows a cross sectional structure of an emitter region of a lateral IGBT according to a second modification of the second embodiment of the invention.
Figure 22:
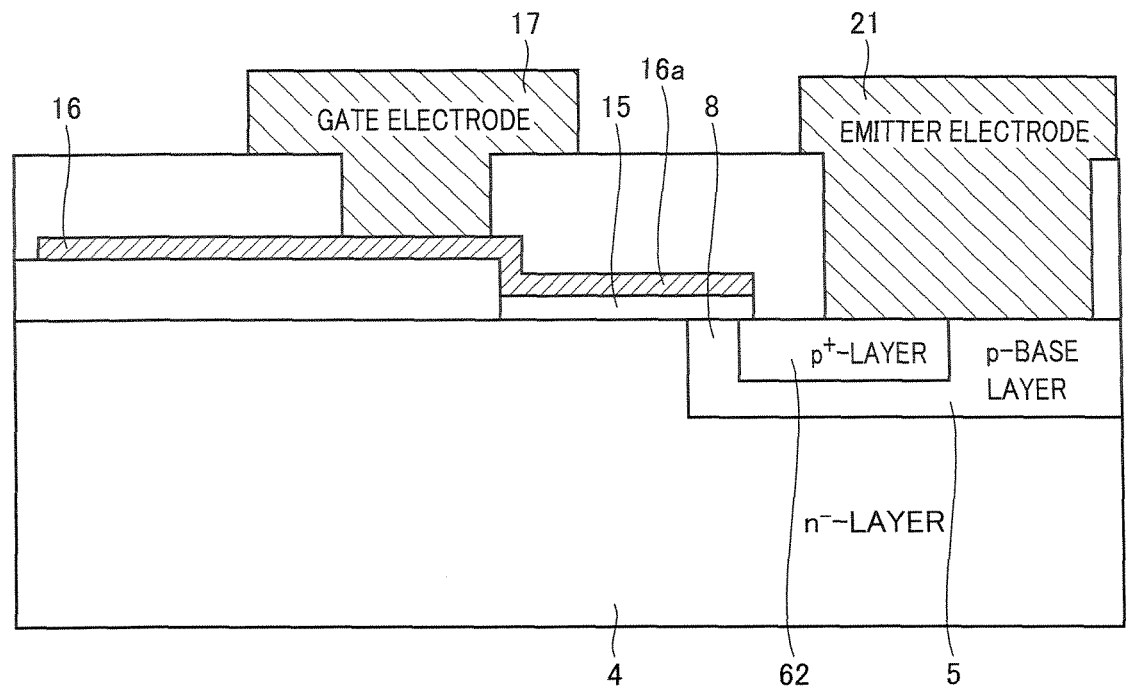
FIG. 22 schematically shows a cross sectional structure of the emitter region of the second modification of the second embodiment of the invention.

FIGS. 21 and 22 schematically show cross sectional structures of the emitter region of the IGBT of a second modification of the second embodiment according to the invention. In the structure of the second modification shown in FIGS. 21 and 22, the planar layout is the same as the planar layout of the IGBT shown in FIG. 16, and unit emitter layers 60 are arranged at predetermined pitches along circumference being spaced from each other.

The cross sectional structure shown in FIG. 21 corresponds to the cross sectional structure taken along the line L17-L17 in FIG. 16, and the sectional structure shown in FIG. 22 corresponds to that taken along the line L18-L18 shown in FIG. 16. As shown in FIG. 21, p$^+$-layer 62 has substantially the same width in the radial direction as unit n$^+$-emitter layer 60, and is formed extending to a portion under gate interconnection 16a so as to be in contact with channel formation region 8. P$^+$-layer 62 has the outer and inner peripheries aligned to those of unit emitter layers 60, respectively. Emitter electrode 21 is electrically connected to unit n$^+$-emitter layers 60 and p-type base layer 5.

As shown in FIG. 22, in the region where unit n$^+$-emitter layer 60 is not present, p$^+$-layer 62 is formed adjacently to channel formation region 8, and extending to a portion under gate electrode interconnection and line 16a and is electrically coupled to emitter electrode 21.

In the structures shown in FIGS. 21 and 22, heavily doped p$^+$-layer 62 is arranged in p-base layer 5, and is formed deeper than unit n$^+$-emitter layer 60 so that the holes can be absorbed more efficiently, and can be discharged to emitter electrode 21. Therefore, it is possible to achieve the operational advantages similar to those achieved by the structures shown in FIGS. 17 and 19. In particular, p$^+$-layer 62 is formed in contact with channel formation region 8 so that the base resistance under unit emitter layer 62 can be further reduced, and the holes from the channel formed in channel formation region 8 can be efficiently absorbed to be discharged to emitter electrode 21.

In this second embodiment, likewise a lateral p-channel IGBT may be employed as the IGBT. The heavily doped n$^+$-layer discharges electrons as minority carriers.

[Third Modification]

Figure 23:
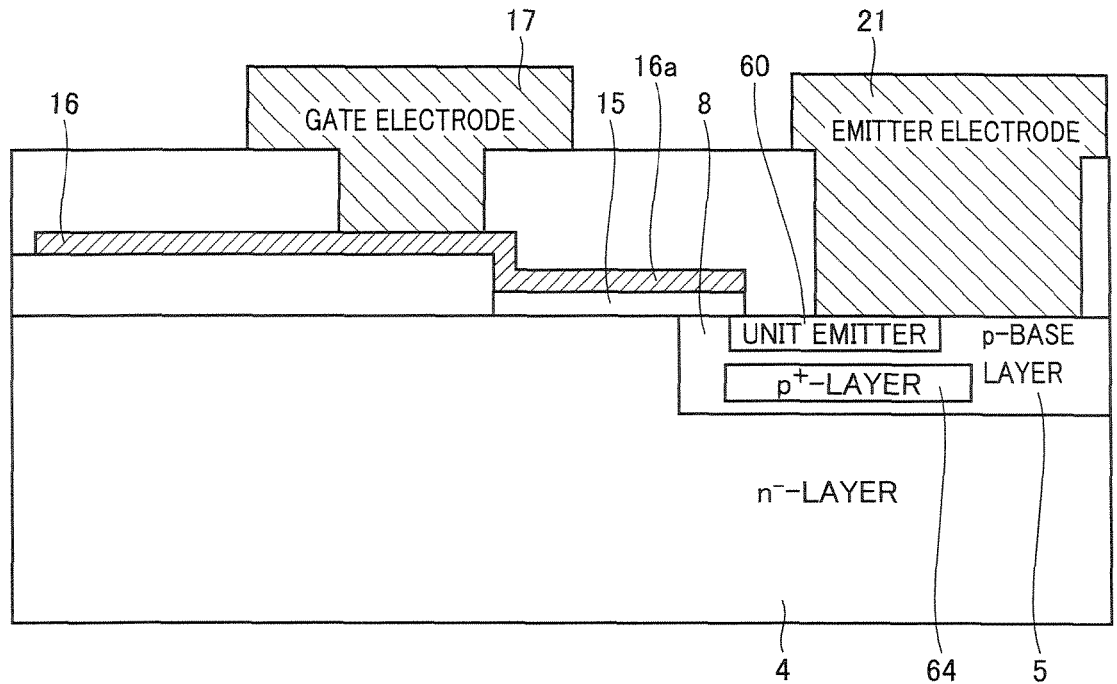
FIG. 23 schematically shows a cross sectional structure of the emitter region of the lateral IGBT of a third modification of the second embodiment of the invention.
Figure 24:
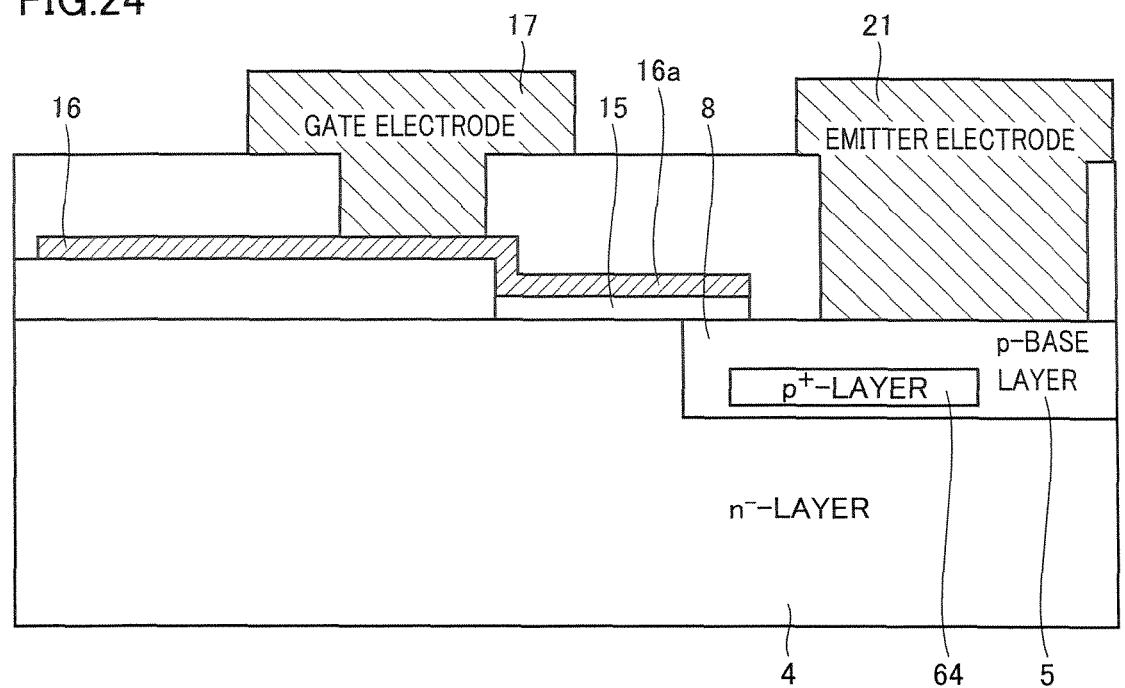
FIG. 24 schematically shows a cross sectional structure of the emitter region of the third modification of the second embodiment of the invention.

FIGS. 23 and 24 schematically show cross sectional structures of and around an emitter region of an IGBT according to a third modification of the second embodiment of the invention. The planar layout of the IGBT of the third modification shown in FIGS. 23 and 24 is the same as that of the structure shown in FIG. 16, and unit n$^+$-emitter layers 60 are arranged separately as an emitter layer in p-base layer 5 of the IGBT.

The cross sectional structure shown in FIG. 23 corresponds to the cross sectional structure taken along the line L17-L17 shown in FIG. 16, and the cross sectional structure shown in FIG. 24 corresponds to the that taken along the line L18-L18 shown in FIG. 16.

In the third modification, as shown in FIGS. 23 and 24, a p$^+$-layer 64 separated from unit n$^+$-emitter layers 62 is arranged as an embedded layer in p-base layer 5, at a region deeper than unit n$^+$-emitter layer 6. P$^+$-layer 64 is formed adjacently to channel formation region 8, and extending to a portion under emitter electrode 21 in p-base layer 5. Other arrangements and structures of the IGBT shown in FIGS. 23 and 24 are the same as those in the cross sectional structures shown in FIGS. 17 and 22. Corresponding portions are allotted with the same reference numerals, and description thereof is not repeated.

In the structures shown in FIGS. 23 and 24, p$^+$-layer 64 is formed in a deep region of p-base layer 5, whereby the base resistance at the bottom of unit n$^+$-emitter layer 60 can be reduced, as in the foregoing structures. In the region (see FIG. 24) where unit n$^+$-emitter layer 60 is not formed, p$^+$-layer 64 can efficiently absorb holes, and can transfer the holes to emitter electrode 21. As shown in FIGS. 23 and 24, therefore, embedded p$^+$-layer 64 is formed into a ring-shaped, continuous form at the region deeper than unit n$^+$-emitter layers 60 in p-base layer 5 in the structure in which unit n$^+$-emitter layers 60 are arranged separately as shown in FIGS. 23 and 24. Thus, the latch-up immunity of the parasitic thyristor can be improved. Further, a sufficiently large channel width can be ensured (a circumferential width of the unit n$^+$-emitter layer is much large than the pitch) so that a large collector-emitter current can flow.

Embedded p$^+$-layer 64 may have a radial width (width in the radial direction) equal to the radial width of unit n$^+$-emitter layer 62, and may be aligned to unit n$^+$-emitter layers 62.

According to the second embodiment of the invention, as described above, the unit emitters each having a rectangle-like and island-shaped form are arranged in the emitter region at a predetermined pitch, and the radial width of the unit emitter layer can be much larger than the arrangement pitch of the island-shaped regions, whereby minority carriers can be discharged to the emitter electrode via the heavily doped impurity region while ensuring a sufficiently large channel width. Thereby, the latch-up immunity of the parasitic thyristor can be improved, and the driving current can be increased. Further, the turn-off time can be reduced.

Third Embodiment

Figure 25:
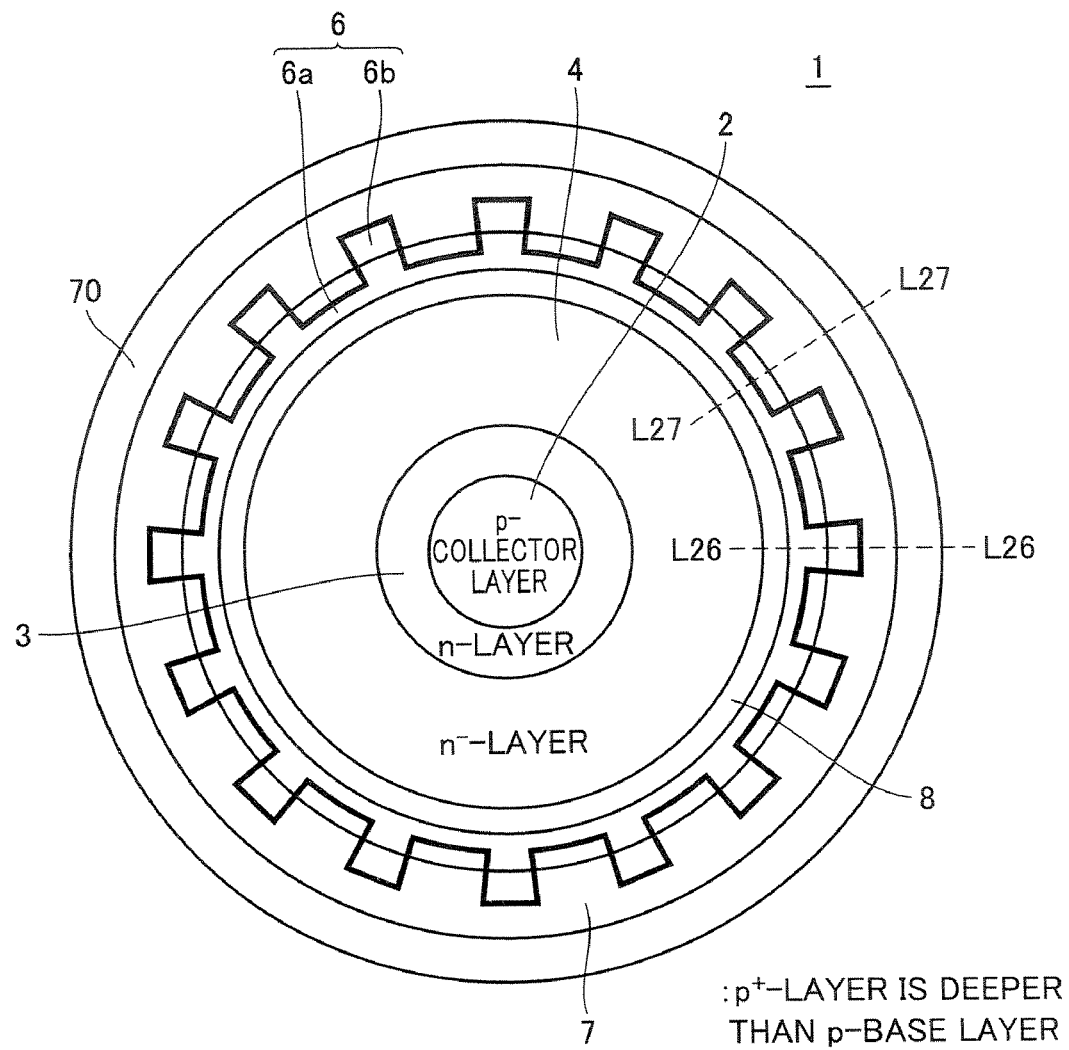
FIG. 25 schematically shows a surface layout of a lateral IGBT according to a third embodiment of the invention.

FIG. 25 schematically shows a planar layout of the IGBT according to a third embodiment of the invention. For the sake of simplicity, FIG. 25 does not show the insulating films, electrodes and interconnections in the planar layout.

The planar layout shown in FIG. 25 has the same arrangement as that of the IGBT according to the first embodiment shown in FIG. 1. The IGBT shown in FIG. 25 has a cross sectional structure, in which a p$^+$-layer is formed deeper than p-base layer 5, as will be described later in detail. N$^+$-emitter layer 6 includes main body 6a of a ring-shaped, continuous form as well as convex portions 6b protruding in the radial direction. Other arrangements of the planar layout of the IGBT shown in FIG. 25 is the same as those of the IGBT shown in FIG. 1. Corresponding portions are allotted with the same reference numerals, and description thereof is not repeated.

Figure 26:
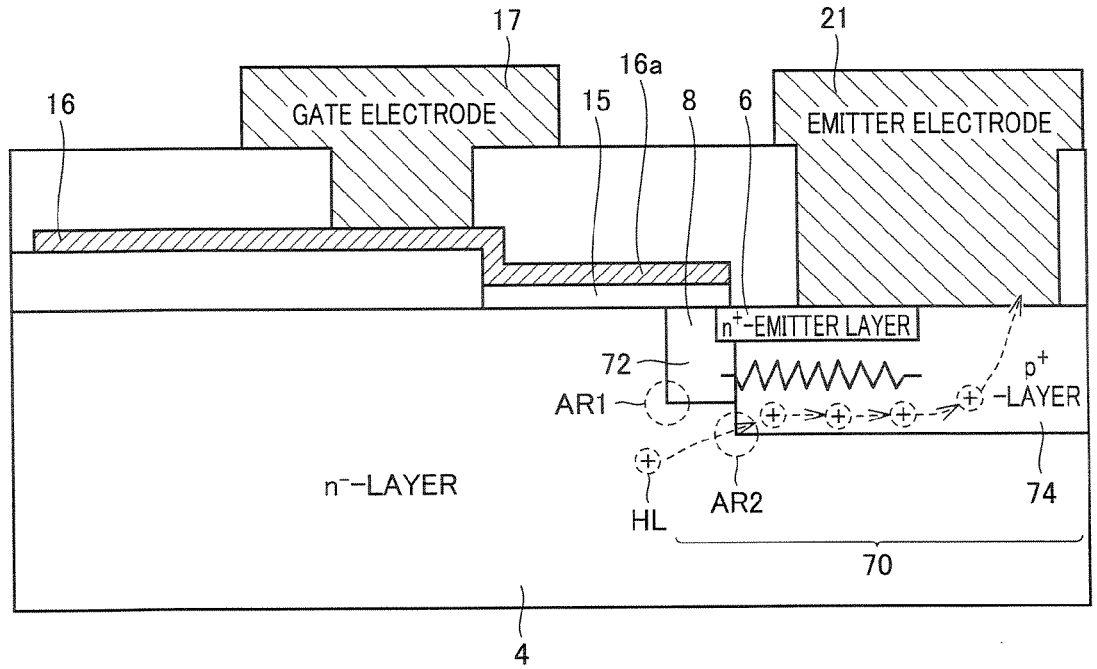
FIGS. 26 and 27 schematically show cross sectional structures taken along lines L26-L26 and L27-L27 in FIG. 25, respectively.

FIG. 26 schematically shows a cross sectional structure taken along a line L26-L26 shown in FIG. 25. In FIG. 26, a base layer region 70 includes a p-base layer 72 formed deeper than n$^+$-emitter layer 6 in channel formation region 8, and a p$^+$-layer 74 formed deeper than p-base layer region 72 and arranged extending under n$^+$-emitter layer 6. N$^+$-emitter layer 6 and p$^+$-layer 74 are coupled to emitter electrode 21. Gate interconnection line 16a (16) is formed on channel formation region 8 with gate insulating film 15 placed in between. Gate interconnection line 16 is coupled to gate electrode 17. Base layer region 70 is formed at the surface of n$^-$-drift layer 4.

Figure 27:
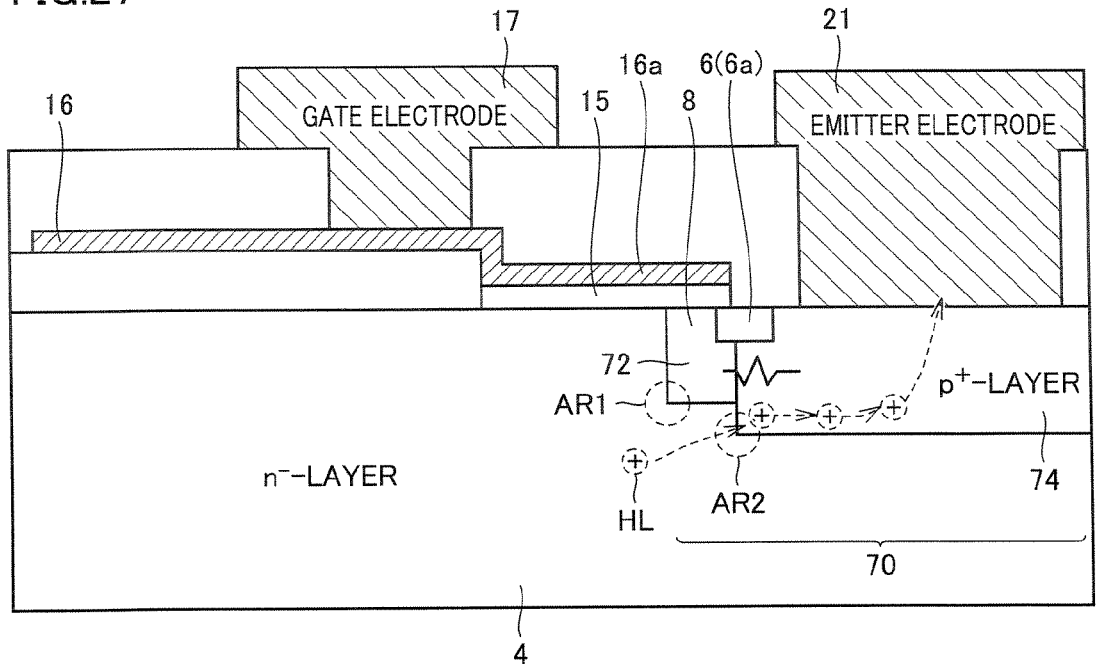

FIG. 27 schematically shows a cross sectional structure taken along a line L27-L27 shown in FIG. 25. In the sectional structure shown in FIG. 27, in n$^+$-emitter layer 6, main body 6a is present, but convex portion 6b is not present. Therefore, p$^+$-layer 74 is formed adjacently to and deeper than p-base layer 72, and is coupled to an entire surface bottom surface of emitter electrode 21. Other arrangements in the sectional structure shown in FIG. 27 are the same as those shown in FIG. 26. Corresponding portions are allotted with the same reference numerals, and description thereof is not repeated.

P$^+$-layer 74 is formed deeper than p-base layer 72, below n$^+$-emitter layer 6 (6a). Thus, the following effect can be achieved in addition to the effects previously described in the first embodiment.

In the parasitic npn bipolar transistor formed of n$^-$-layer 4, p-base layer 72 and n$^+$-emitter layer 6, the p-base region immediately under n$^+$-emitter layer 6 (6a) has a small width, so that the base resistance can be reduced, and the parasitic npn bipolar transistor operation can be suppressed. Thereby, the latch-up of the parasitic thyristor can be suppressed, and the latch-up immunity of the parasitic thyristor can be improved, similarly to the first embodiment.

P$^+$-layer 74 reduces the base resistance, and holes HL flow through the base resistance in p$^+$-layer 74. In this case, the electric field intensity at a curvature portion AR2 of the bottom of p$^+$-layer 74 may be higher than the electric field intensity at a curvature portion AR1 of p-base layer 72 (because the impurity concentration of p$^+$-layer 74 is higher than that of p-base layer 72). In this case, therefore, a hole current (flow of holes HL) enters through curvature portion AR2 of the bottom of p$^+$-layer 74 so that a length of the hole current flowing immediately under n$^+$-emitter layer 6 (6a) is short. Therefore, the length of the base resistance immediately under n$^+$-emitter layer 6 (6a) is short so that the base resistance can be reduced. Thereby, the parasitic bipolar transistor operation can be suppressed, and the latch-up of the parasitic thyristor can be suppressed.

P-base layer 72 has a short width in the radial direction so that the base resistance can be further reduced.

[First Modification]

Figure 28:
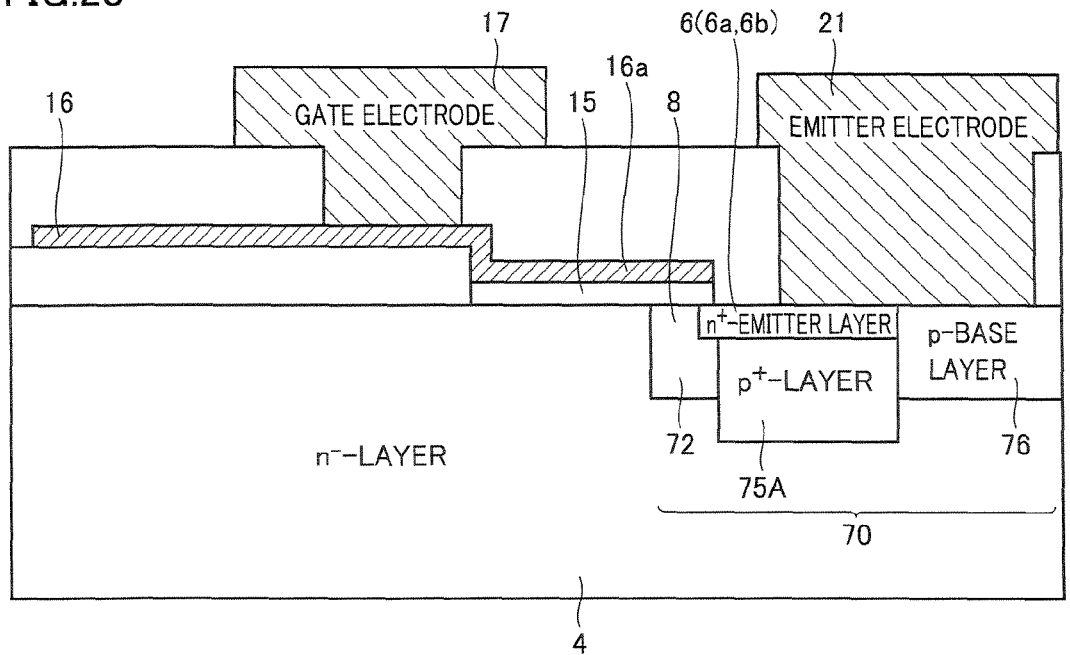
FIGS. 28 and 29 schematically show cross sectional structures of an emitter region of a lateral IGBT of a first modification of the third embodiment of the invention, respectively.
Figure 29:
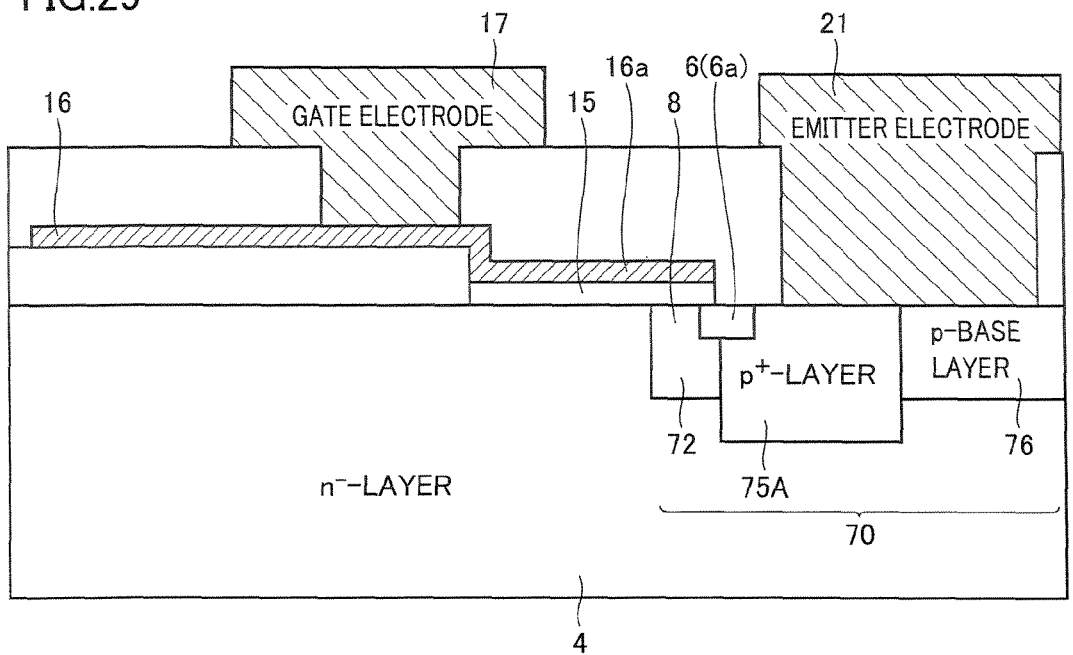

FIGS. 28 and 29 schematically show a cross sectional structure of an emitter region of the IGBT according to a first modification of the third embodiment of the invention. The planar layout of the IGBT of the first modification of the third embodiment is the same as that shown in FIG. 25. The sectional structure shown in FIG. 28 corresponds to the sectional structure taken along the line L26-L26 shown in FIG. 25, and the sectional structure shown in FIG. 29 corresponds to the sectional structure taken along the line L27-L27 shown in FIG. 25.

N$^+$-emitter layer 6 includes main body 6a extending continuously in the ring-shaped form as well as projections (convex portions) 6b projecting away from the collector layer. In FIG. 28, base layer region 70 includes a heavily doped p$^+$-layer 75 formed under emitter layer 6 (6a and 6b), and p-base layers 72 and 76 arranged on the opposite sides of p$^+$-layer 75, respectively. N-emitter layer 6 and p-base layer 76 are coupled to emitter electrode 21. P-base layer 72 is formed deeper than emitter layer 6, under channel formation region 8 and emitter layer main body 6a.

As shown in FIG. 29, p$^+$-layer 75 is also arranged in the region where convex portion 6b of emitter layer 6 is not arranged, and this p$^+$-layer 75 is formed from a portion under emitter layer main body 6a to a portion under emitter electrode 21, being deeper than p-base layers 72 and 79.

Other arrangements in the cross sectional structures shown in FIGS. 28 and 29 are the same as those in the cross sectional structures shown in FIGS. 26 and 27, respectively. Corresponding portions are allotted with the same reference numerals, and description thereof is not repeated.

In this arrangement of the first modification, p$^+$-base layer 75 is formed deeper than p-base layers 72 and 76 and under n$^+$-emitter layer 6. Similarly to the first embodiment already described, therefore, the base resistance of the p-base layer under the emitter layer can be reduced, the base resistance of the parasitic bipolar transistor can be reduced and the latch-up immunity of the parasitic thyristor can be improved. Similarly to the structures shown in FIGS. 26 and 27, with p$^+$-layer 75, the holes of minority carriers can be absorbed to be discharged to emitter electrode 21. Further, effects similar to those of the first embodiment can be achieved.

[Second Modification]

Figure 30:
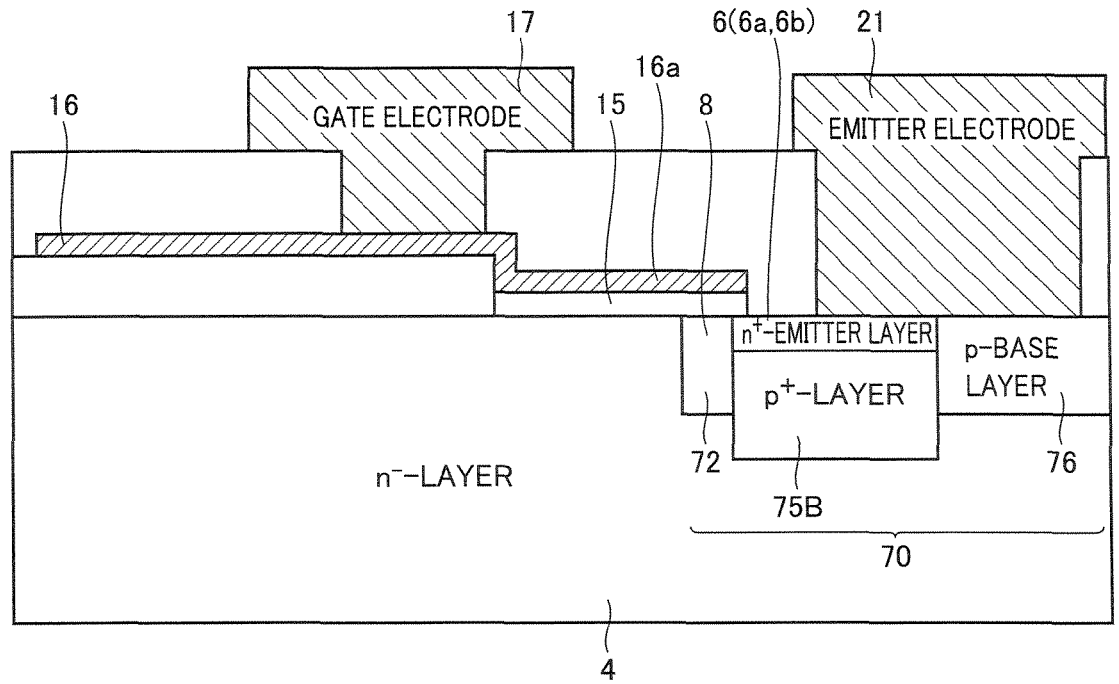
FIGS. 30 and 31 schematically show cross sectional structures of an emitter region of a lateral IGBT of a second modification of the third embodiment of the invention, respectively.
Figure 31:
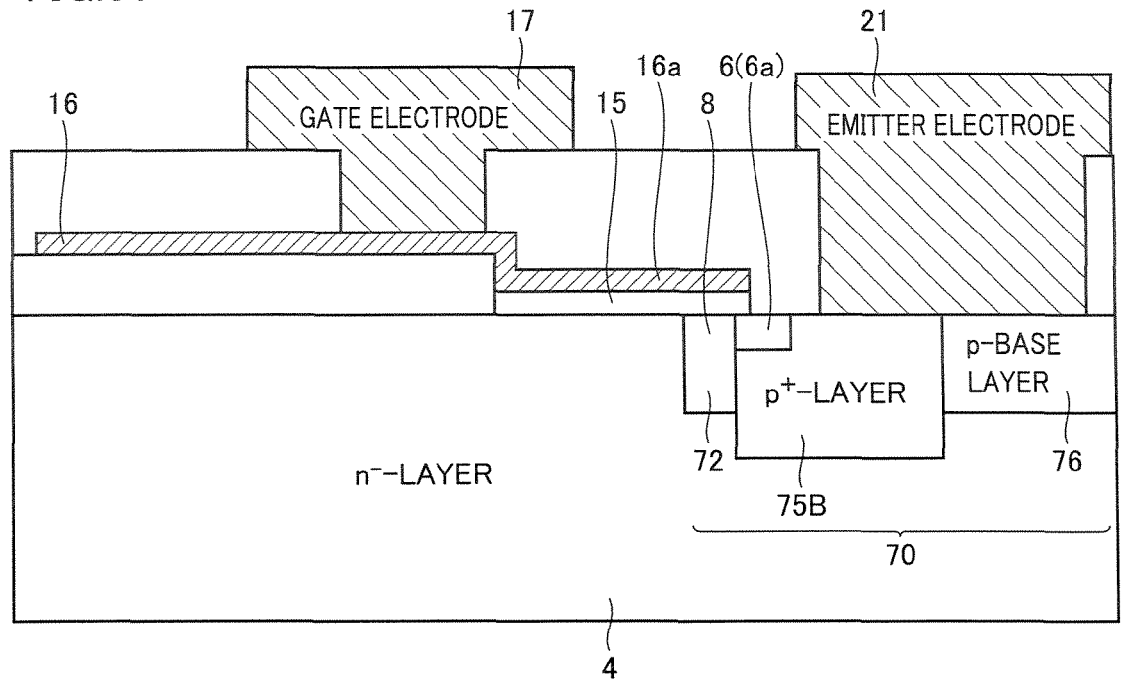

FIGS. 30 and 31 schematically show cross sectional structures of an emitter region of an IGBT according to a second modification of the third embodiment of the invention. In the structure of this second modification, n$^+$-emitter layer 6 includes main body 6a and convex portions 6b, similarly to the planar layout shown in FIG. 25. The cross sectional structure shown in FIG. 30 corresponds to the cross sectional structure taken along the line L26-L26 shown in FIG. 25, and the structure shown in FIG. 31 corresponds to the cross sectional structure taken along the line L27-L27 shown in FIG. 25.

The cross sectional structures shown in FIGS. 30 and 31 differ from the cross sectional structures shown in FIGS. 28 and 29 in the following arrangements. A p$^+$-layer 75B is formed deeper than p-base layers 72 and 76, below n$^+$-emitter layer 6 (6a and 6b). P$^+$-layer 75B has an inner peripheral portion aligned to the inner peripheral portion of n$^+$-emitter layer 6, and has an outer peripheral portion aligned to the outer peripheral portions of the convex portions (6b) of n-emitter layer 6.

Other arrangements in the cross sectional structures shown in FIGS. 30 and 31 are the same as those in the cross sectional structures shown in FIGS. 28 and 29, respectively. Corresponding portions are allotted with the same reference numerals, and description thereof is not repeated.

In the structures shown in FIGS. 30 and 31, p$^+$-layer 75B is formed with its inner peripheral portion aligned to the inner peripheral portion of n$^+$-emitter layer 6. Thereby, the base resistance under n$^+$-emitter layer 6 can be reduced, and the parasitic bipolar transistor operation can be suppressed. Also, operations and effects similar to those of the structures shown in FIGS. 26 to 29 can be achieved.

[Third Modification]

Figure 32:
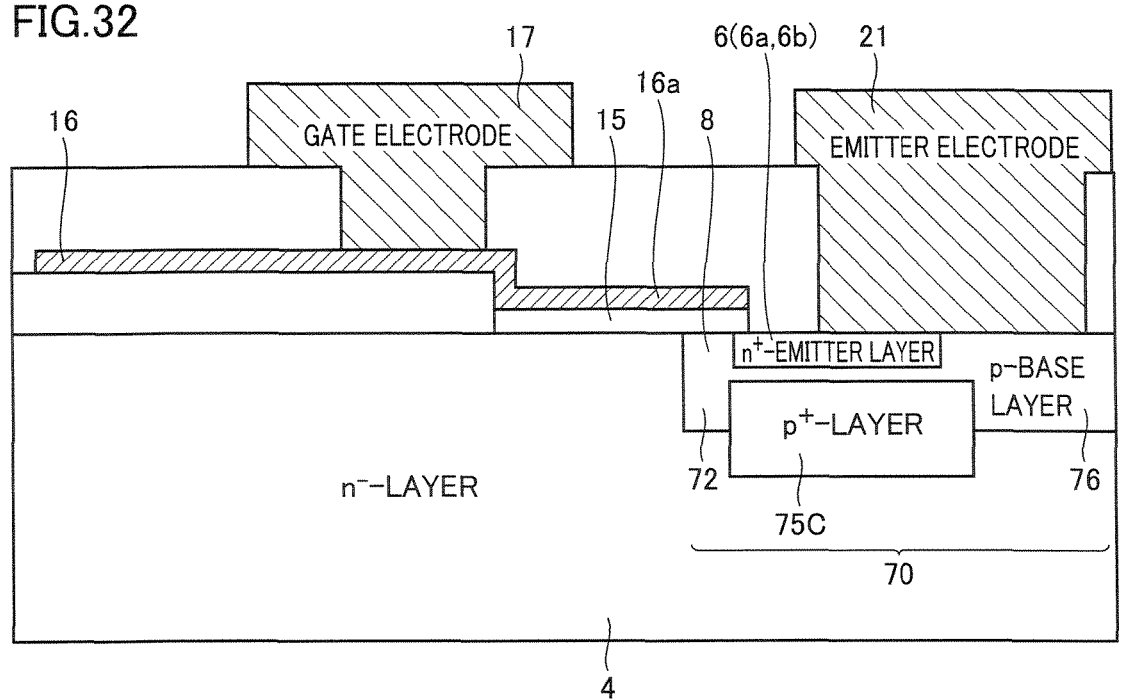
FIGS. 32 and 33 schematically show cross sectional structures of an emitter region of a lateral IGBT of a third modification of the third embodiment of the invention, respectively.
Figure 33:
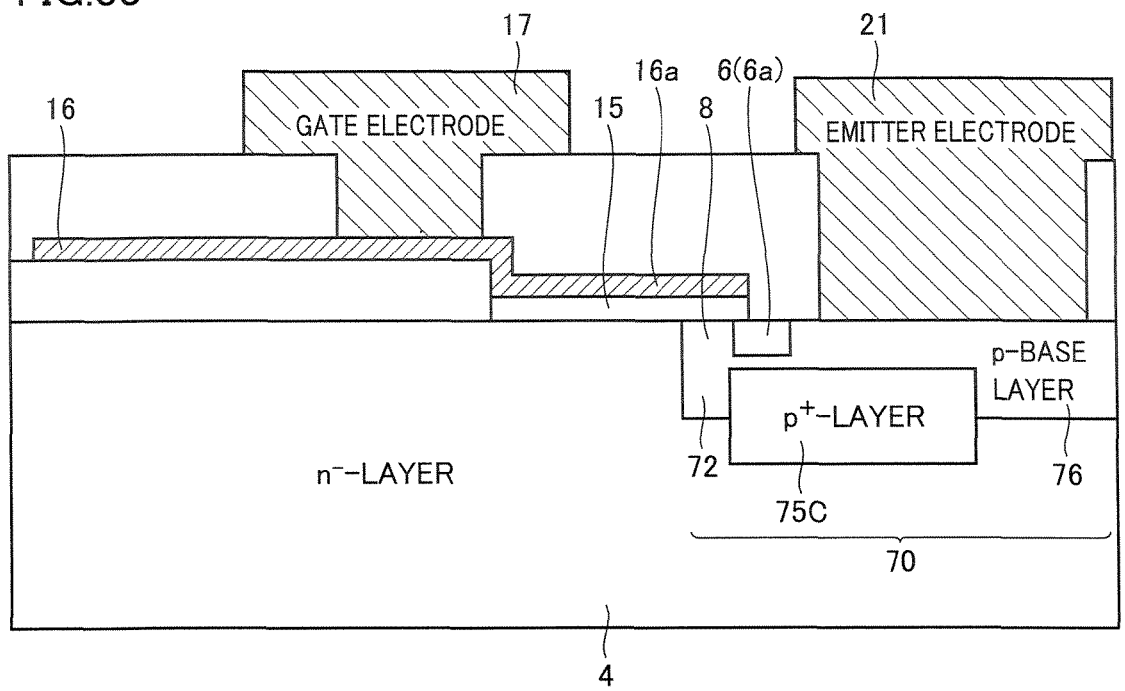

FIGS. 32 and 33 schematically show cross sectional structures of an emitter region of an IGBT according to a third modification of the third embodiment of the invention. The cross sectional structure shown in FIG. 32 corresponds to the cross sectional structure taken along the line L26-L26 in the planar layout shown in FIG. 25, and the cross sectional structure shown in FIG. 33 corresponds to the cross sectional structure taken along the line L27-L27 shown in FIG. 25.

In the arrangement of the third modification, as shown in FIGS. 32 and 33, a p$^+$-layer 75C is embedded in the p-base layer, and is formed deeper than p-base layers 72 and 76. P$^+$-layer 75C is separated from n$^+$-emitter layer 6 (6a and 6b). Therefore, p-base layers 72 and 76 formed on the opposite sides of p$^+$-layer 75C are continuously connected via a portion under the bottom of n$^+$-emitter layer 6.

Other arrangements in the cross sectional structures shown in FIGS. 32 and 33 are the same as those in the sectional structures shown in FIGS. 28 to 31. Corresponding portions are allotted with the same reference numerals, and description thereof is not repeated.

As shown in FIGS. 32 and 33, p$^+$-layer 75C spaced from n$^+$-emitter layer 6 is deeply formed under n$^+$-emitter layer 6, whereby $n^+$-emitter layer 6 can have a short width in the base region layer owing to main body 6a, and the base resistance can be small. Further, similarly to the structures shown in FIGS. 26 and 27, with $p^+$-layer 75C, holes HL can be efficiently absorbed to be transmitted to emitter electrode 21. More specifically, the electric field intensity at the curvature portion of $p^+$-layer 75C can be larger than that at the curvature portion of p-base layer 72, so that $p^+$-layer 75C can efficiently absorb the holes, and it is possible to reduce the resistance value of the path through which the hole current flows under $n^+$-emitter layer 6.

Due to main body 6a, the length of the flowing path of the hole current can be reduced. Similarly to the structures shown in FIGS. 26 to 31, therefore, the operation of the parasitic bipolar transistor can be suppressed, and the latch-up immunity of the parasitic thyristor can be improved. Further, channel formation region 8 is formed continuously, and the channel width can be sufficiently large so that the collector-emitter current of a sufficient magnitude can be driven.

According to the third embodiment of the invention, the emitter layer region has a gear-like form, is formed of the main body and the convex portions that are arranged at the predetermined intervals and are coupled to the main body, and the heavily doped impurity region is formed deeper than the base layer so that the minority carriers can be efficiently absorbed. Thereby, the base resistance under the emitter layer can be reduced, the parasitic bipolar transistor operation can be suppressed and the latch-up immunity of the parasitic thyristor can be improved. The channel is formed continuously in a ring-shaped form, and the channel width is large to cause a sufficiently large collector-emitter current to flow.

Similarly to the other embodiments, the emitter region in this third embodiment has a gear-like form, and the width and pitch conditions of the convex portions of the emitter layer region can be appropriately set to allow arrangement of the gate electrode lead-out line in the region between the convex portions, so that effects similar to those of the first embodiment can be achieved.

Fourth Embodiment

Figure 34:
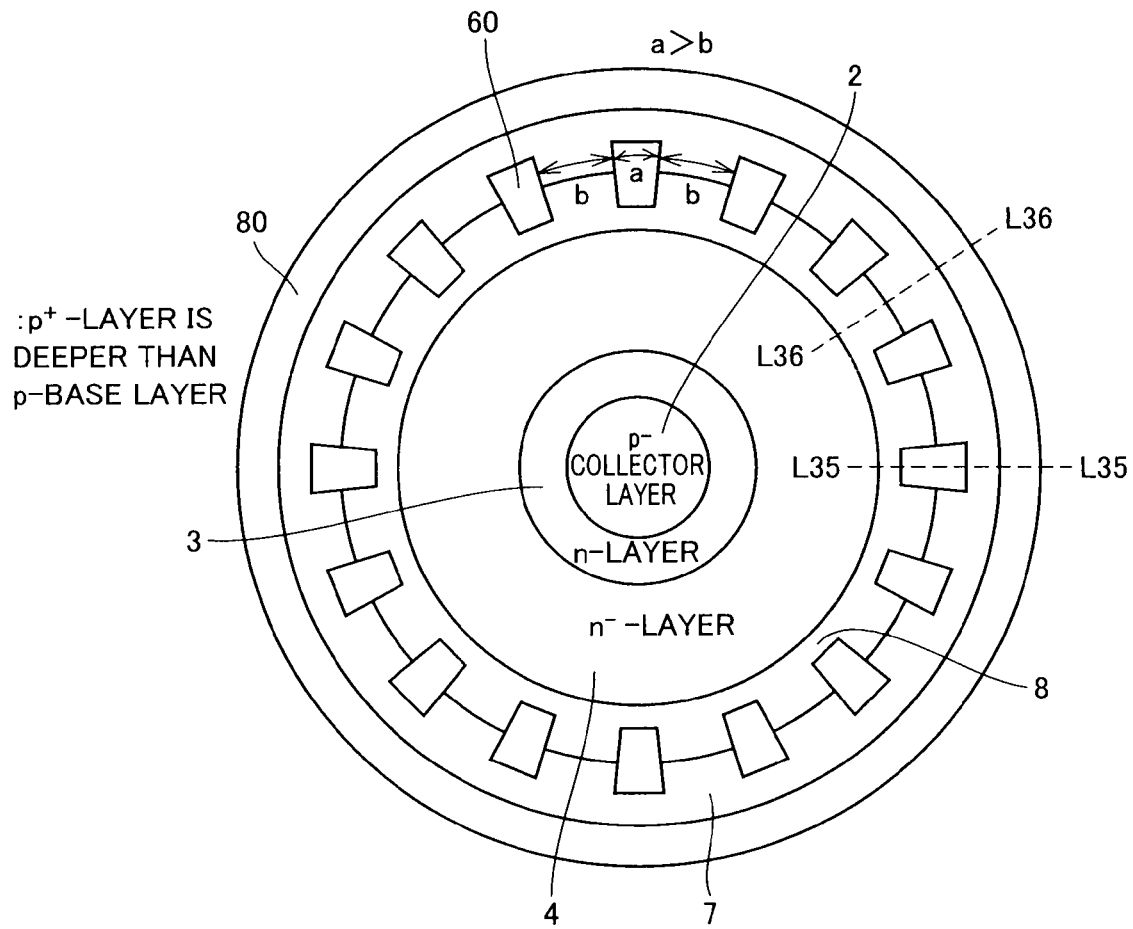
FIG. 34 schematically shows a layout of a surface of a lateral IGBT of a fourth embodiment of the invention.

FIG. 34 schematically shows a planar layout of an IGBT according to a fourth embodiment of the invention. FIG. 34 does not show the electrodes, interconnections and insulating layers, either. The planar layout shown in FIG. 34 differs from that shown in FIG. 16 in the following structures. In a base layer region 80 formed along an outer peripheral portion of $n^-$-layer 4, a heavily doped $p^+$-layer is formed deeper than the p-base layer. Unit emitter layers 60 spaced from each other implement the emitter layer. Unit emitter layers 60 have width a and pitch b that satisfy a relationship similar to that in the IGBT of the second embodiment already described.

Figure 35:
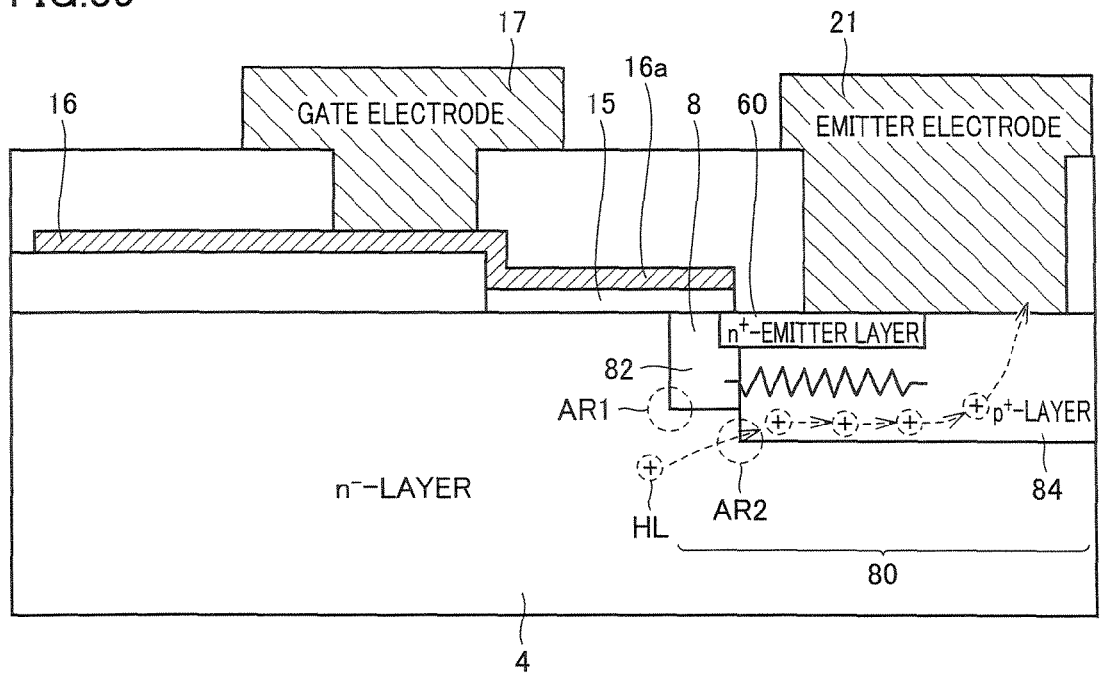
FIGS. 35 and 36 schematically show cross sectional structures taken along lines L35-L35 and L36-L36 in FIG. 34, respectively.

FIG. 35 schematically shows a cross sectional structure taken along a line L35-L35 shown in FIG. 34. As shown in FIG. 35, a $p^+$-layer 84 that is doped more heavily than p-type base layer 80 is formed, under unit $n^+$-emitter layer 60, deeper than p-type base layer 80. P-type base layer 82 is formed extending under channel formation region 8 and to a part under $n^+$-emitter layer 60. Emitter electrode 21 is electrically connected to unit $n^+$-emitter layer 60 and $p^+$-layer 84.

Figure 36:
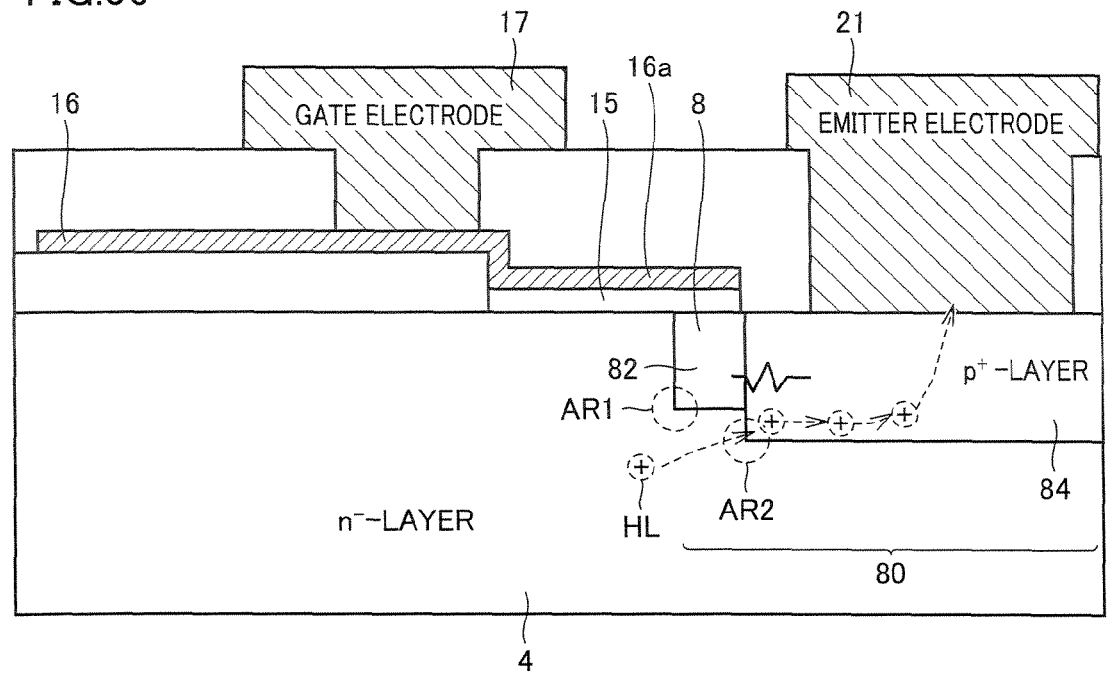

FIG. 36 schematically shows a cross sectional structure taken along a line L36-L36 shown in FIG. 34. In the region shown in FIG. 36, the emitter layer is not arranged at the surface of $p^+$-layer 84. $P^+$-layer 84 is coupled to p-type base layer 82. Emitter electrode 21 is electrically connected to heavily doped $p^+$-layer 84. Other arrangements in the cross sectional structures shown in FIGS. 35 and 36 are the same as those shown in FIGS. 17 and 18. Corresponding portions are allotted with the same reference numerals, and description thereof is not repeated.

As shown in FIGS. 35 and 36, heavily doped $p^+$-layer 84 is formed deeper than p-base layer 82 in the structure having unit emitter layers 60 that are arranged separately from each other along the circumference direction in the emitter electrode contact region. The electric field intensity at curvature portion AR2 under $p^+$-layer 84 shown in FIG. 35 can be stronger than that at curvature portion AR1 of p-base layer 82, and holes HL can be efficiently transmitted via $p^+$-layer 84 to emitter electrode 21. In particular, holes HL can be transmitted to emitter electrode 21 with a low resistance in the case where $n^+$-emitter layer 60 is not arranged as shown in FIG. 36. $P^+$-layer 84 is arranged under the $n^+$-emitter layer so that the resistance value of the portion immediately under $n^+$-emitter layer 60 is small, and a voltage across PN junction between the $p^+$-layer and $n^+$-emitter layer 60 is equal to or lower than the built-in voltage so that injection of the minority carriers is suppressed. Therefore, in addition to the effects of the structure of the second embodiment, $p^+$-layer 84 can absorb more efficiently holes HL, to transmit the holes to emitter electrode 21.

[First Modification]

Figure 37:
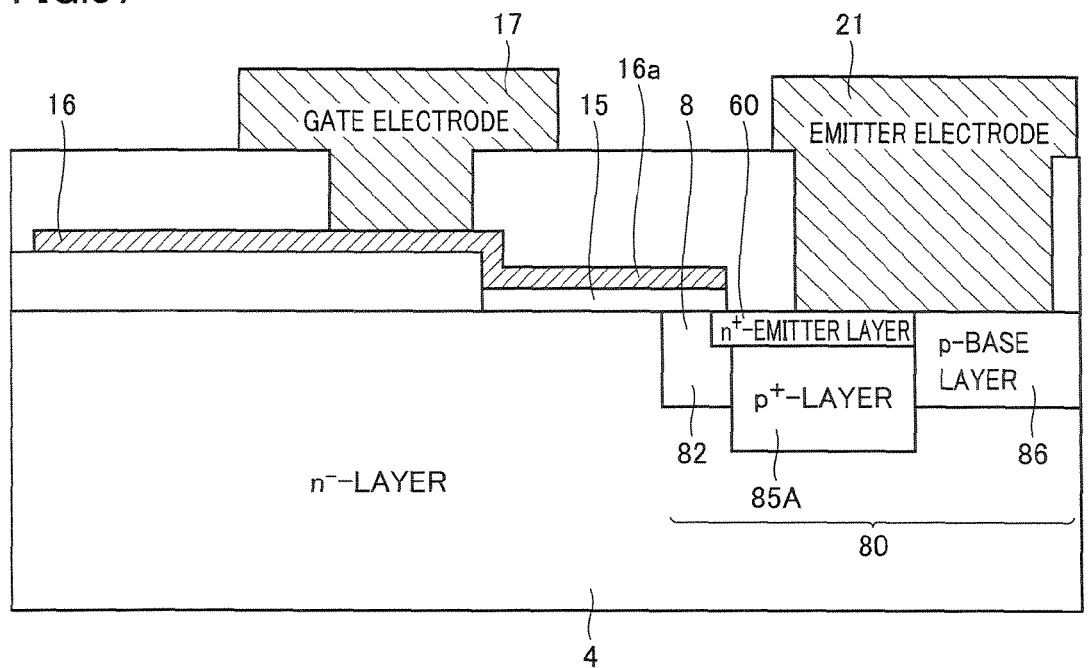
FIGS. 37 and 38 schematically show cross sectional structures of an emitter region of a lateral IGBT of a first modification of the fourth embodiment of the invention, respectively.
Figure 38:
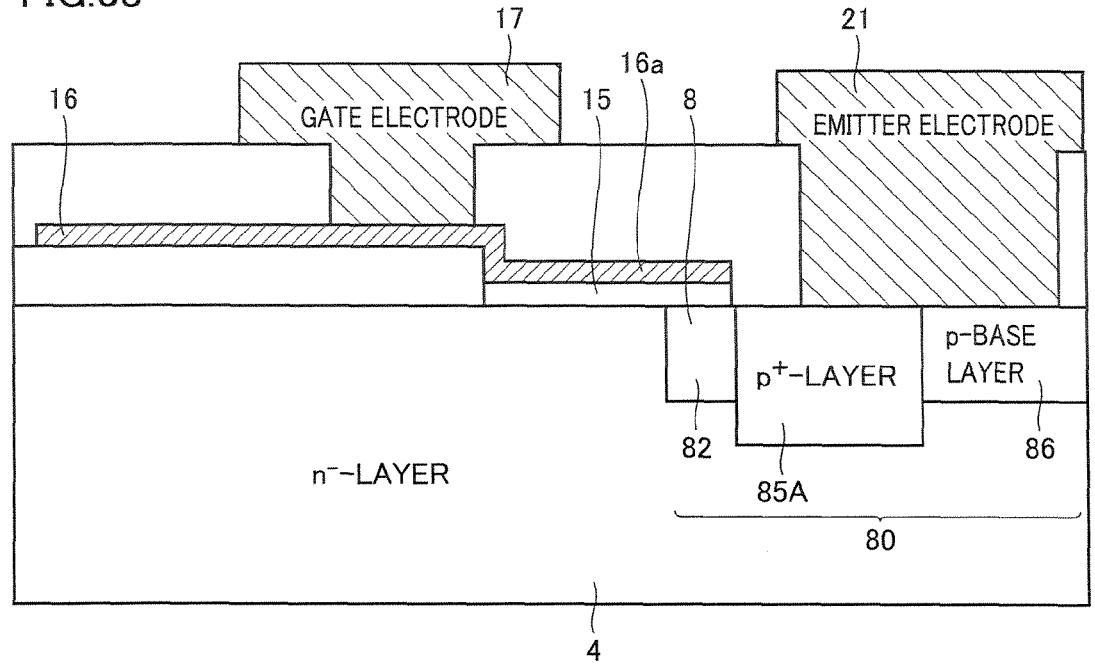

FIGS. 37 and 38 schematically show cross sectional structures of an emitter region of a first modification of the IGBT according to the fourth embodiment of the invention. The cross sectional structure shown in FIG. 37 corresponds to the sectional structure taken along the line L35-L35 shown in FIG. 34, and the cross sectional structure shown in FIG. 38 corresponds to the cross sectional structure taken along the line L36-L36 shown in FIG. 34.

As shown in FIGS. 37 and 38, a heavily doped $p^+$-layer 85A is formed between p-base layer 82 formed in channel formation region 8 and a p-base layer 86 formed under emitter electrode 21 at an outer periphery portion of base region 80. Unit $n^+$-emitter layers 60 are formed at the surface of $p^+$-layer 85. In FIG. 37, emitter electrode 21 is connected to unit emitter layers 60 and p-type base layer 86. In the region shown in FIG. 38, unit emitter layer 60 is not arranged, and therefore, emitter electrode 21 is electrically connected to $p^+$-layer 85A and p-type base layer 86. Other arrangements in the cross sectional structures shown in FIGS. 37 and 38 are the same as those shown in FIGS. 35 and 36. Corresponding portions are allotted with the same reference numerals, and description thereof is not repeated.

With $p^+$-layer 85A being arranged in the structure shown in FIGS. 37 and 387 holes can be efficiently transmitted to emitter electrode 21 via $p^+$-layer 85A in the region (see FIG. 38) between these unit $n^+$-emitter layers in the case where unit $n^+$-emitter layers 60 are arranged apart from each other, similarly to the foregoing structures. Further, heavily doped $p^+$-layer 85A accompanies a higher electric field to absorb holes more efficiently than p-base layer 82, and can transmit them to emitter electrode 21. Since emitter electrode 21 is electrically connected to heavily doped $p^+$-type layer 85A, the contact resistance between the base layer and the emitter electrode can be reduced, and accordingly, the base resistance can be reduced.

[Second Modification]

Figure 39:
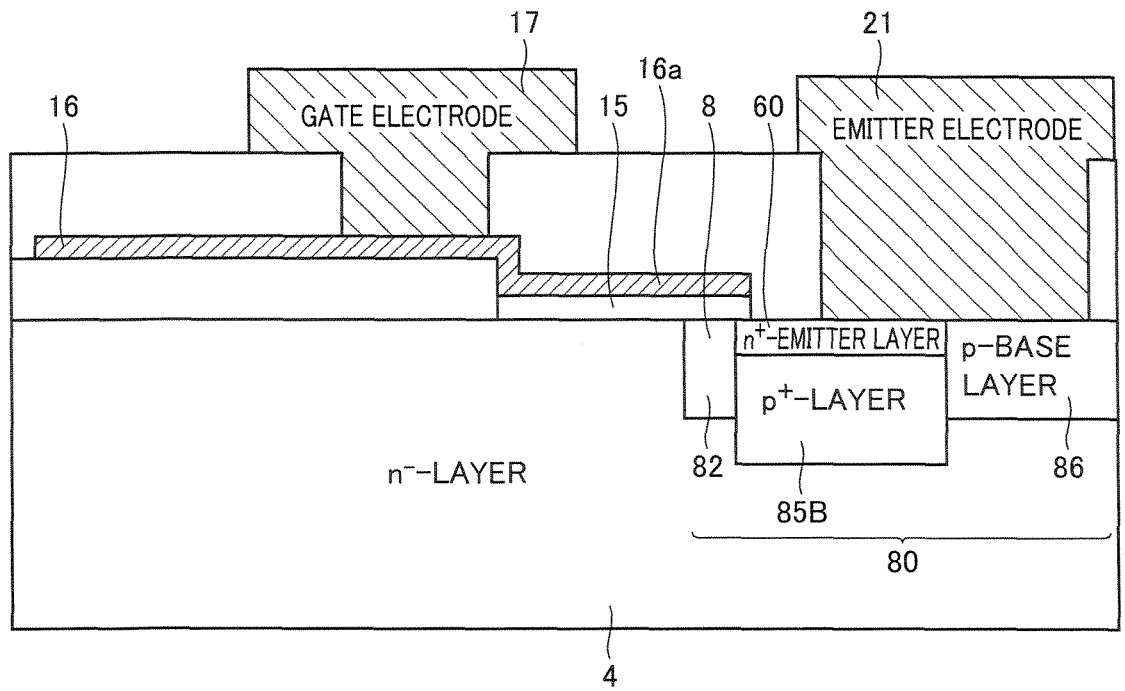
FIG. 39 schematically shows a cross sectional structure of an emitter region of a lateral IGBT of a second modification of the fourth embodiment of the invention.
Figure 40:
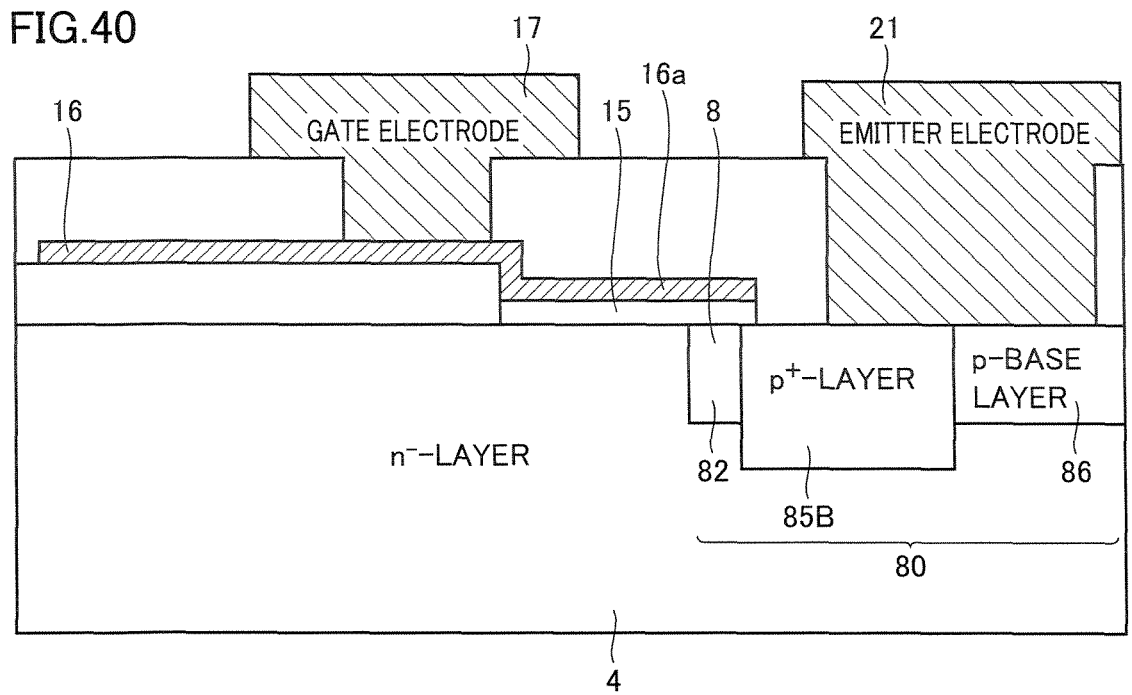
FIG. 40 schematically shows a cross sectional structure of the lateral IGBT of the second modification of the fourth embodiment of the invention.

FIGS. 39 and 40 schematically show cross sectional structures of an emitter region of a second modification of the IGBT according to the fourth embodiment of the invention. The sectional structures in FIGS. 39 and 40 differ from those in FIGS. 37 and 38 in the following arrangements. A $p^+$-layer 85B has substantially the same width as unit $n^+$-emitter layer 60 in the radial direction, and has inner and outer peripheral portions aligned to those of unit $n^+$-emitter layers 60 in the region shown in FIG. 39. Other arrangements in the sectional structures shown in FIGS. 39 and 40 are the same as those shown in FIGS. 37 and 38. Corresponding portions are allotted with the same reference numerals, and description thereof is not repeated.

In the structures shown in FIGS. 39 and 40, heavily doped $p^+$-layer 85B is formed in alignment with unit $n^+$-emitter layers 60 and deeper than base layers 82 and 86. Therefore, the base resistance of the portion immediately under unit $n^+$-emitter layers 60 can be reduced more advantageously, and the voltage difference between the base and the emitter can be reduced. $P^+$-layer 85B is formed longer than that shown in FIGS. 37 and 38, and can more reduce the base resistance. In addition to the effects of the structures shown in FIGS. 37 and 38, such effects can be achieved that the base resistance can be further reduced, and the latch-up immunity of the parasitic thyristor can be improved.

[Third Modification]

Figure 41:
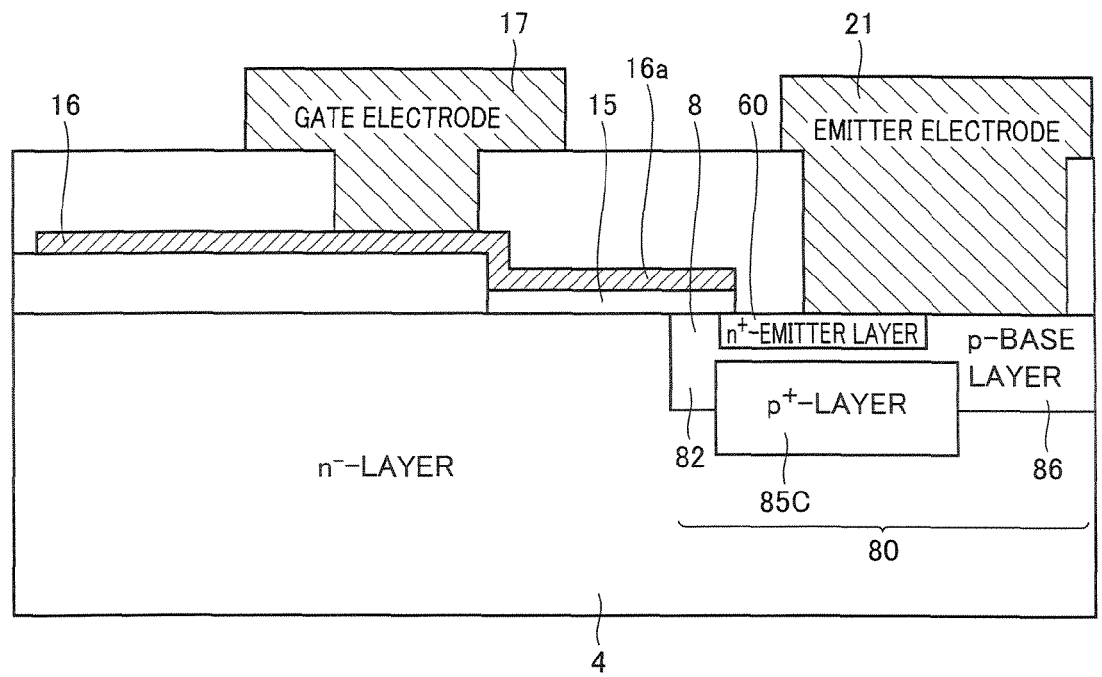
FIG. 41 schematically shows a cross sectional structure of an emitter region of a lateral IGBT of a third modification of the fourth embodiment of the invention.
Figure 42:
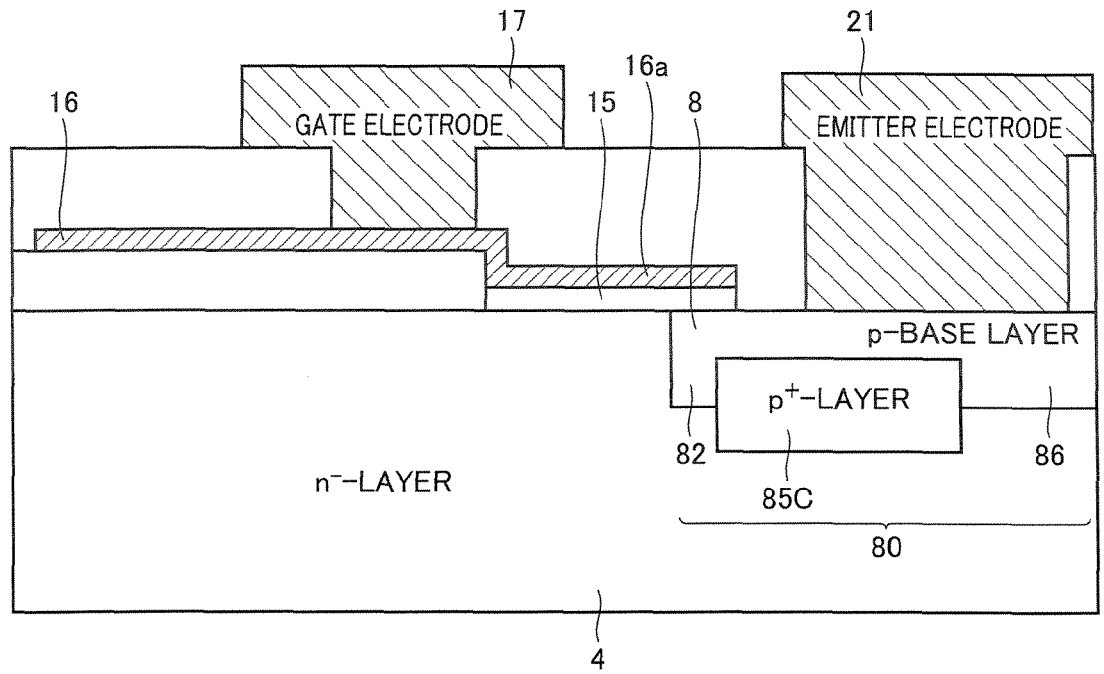
FIG. 42 schematically shows a cross sectional structure of the lateral IGBT of the third modification of the fourth embodiment of the invention.

FIGS. 41 and 42 schematically show cross sectional structures of an emitter region of a third modification of the IGBT according to the fourth embodiment of the invention. The cross sectional structures shown in FIGS. 41 and 42 differ from the cross sectional structures shown in FIGS. 37 to 40 in the following points. A heavily doped $p^+$-layer 85C formed deeper than p-base layer 82 is spaced from unit $n^+$-emitter layers 60, and is formed deeper than p-type base layers 82 and 86 as an embedded layer in p-type base layers 82 and 86. In p-base layer region 80, therefore, p-base layers 82 and 86 are coupled with each other on the surface portion of $p^+$-layer 85C. In particular, in the region where unit $n^+$-emitter layer 60 is not formed (see FIG. 42), $p^+$-layer 85C is merely arranged as an embedded impurity region deeper than p-base layers 82 and 86. In this region, the emitter electrode is electrically connected to p-type base layers 82 and 86.

Therefore, $p^+$-layer 85C determines the path of holes below unit $n^+$-emitter layers 60 even in the structure where $p^+$-layer 85C is formed as the embedded region, and the base resistance can be reduced. $P^+$-layer 85C is formed deeper than p-base layers 82 and 86, and therefore $p^+$-layer 85C can efficiently absorb the holes passed from the lower portion of the p-base layer owing to a high electric field, and can transmit the holes to emitter electrode 21.

In this fourth embodiment, radial width (width in the radial direction) a of unit $n^+$-emitter layer 60 is larger than arrangement pitch b of the unit emitter layers. However, radial width a of unit $n^+$-emitter layer 60 may be smaller than arrangement pitch b, provided that a sufficient channel width can be ensured.

According to the fourth embodiment of the invention, as described above, in the emitter layer, the unit emitter layers are formed of island-like regions spaced from each other, and the heavily doped impurity region is formed in and being deeper than the base layer. Therefore, the minority carriers can be efficiently absorbed. By reducing the base resistance of the portion below the emitter layer, the minority carriers can be effectively absorbed, to enhance the latch-up immunity. In addition, the turn-off time can be reduced. Further, the unit emitter layers of the island-like form (rectangle-like form) are arranged, and the sufficient channel width can be ensured so that the sufficient collector-emitter current can be driven.

Fifth Embodiment

Figure 43:
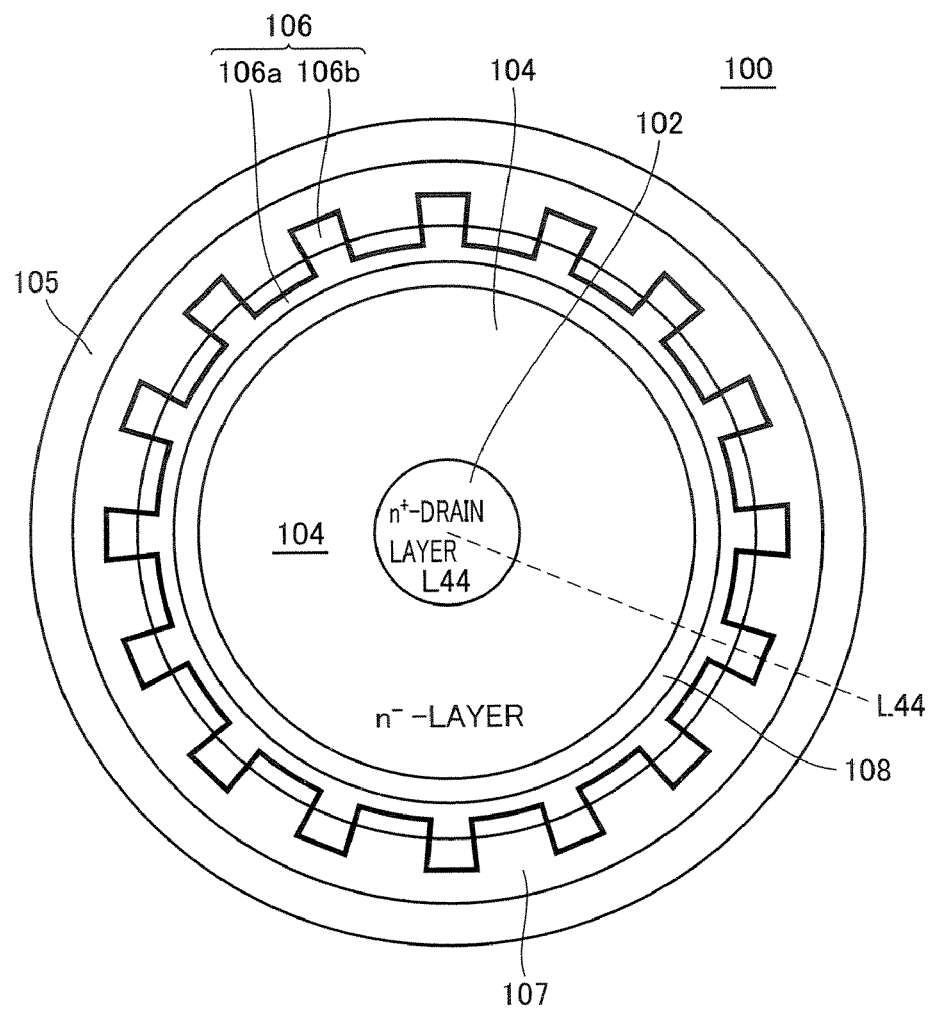
FIG. 43 schematically shows a layout of a surface of a lateral IGBT according to a fifth embodiment of the invention.

FIG. 43 schematically shows a planar layout of a lateral MOSFET according to a fifth embodiment of the invention. For the sake of simplicity, FIG. 43 does not show the electrodes, insulating films and electrode interconnection lines.

In FIG. 43, the lateral n-channel MOS transistor includes a heavily doped $n^+$-type drain layer (first semiconductor layer region) 102 formed in a central portion, an $n^-$-drift layer (semiconductor region) 104 formed surrounding $n^+$-drain layer 102, and a p-base layer (second semiconductor layer region) 105 formed surrounding $n^-$-drift layer 104. P-base layer 105 includes a channel formation region 108 neighboring to $n^-$-drift layer 14, and an $n^+$-source layer 106 of a gear-like form formed along the outer periphery of channel formation region 108. $N^+$-source layer 106 includes a main body 106a that is formed continuously into a single body form, and convex portions 106b protruding away from drain layer 102 in the radial direction. A source electrode contact region 107 is arranged above convex portions 106b and at an outer peripheral portion of p-base layer 105.

Figure 44:
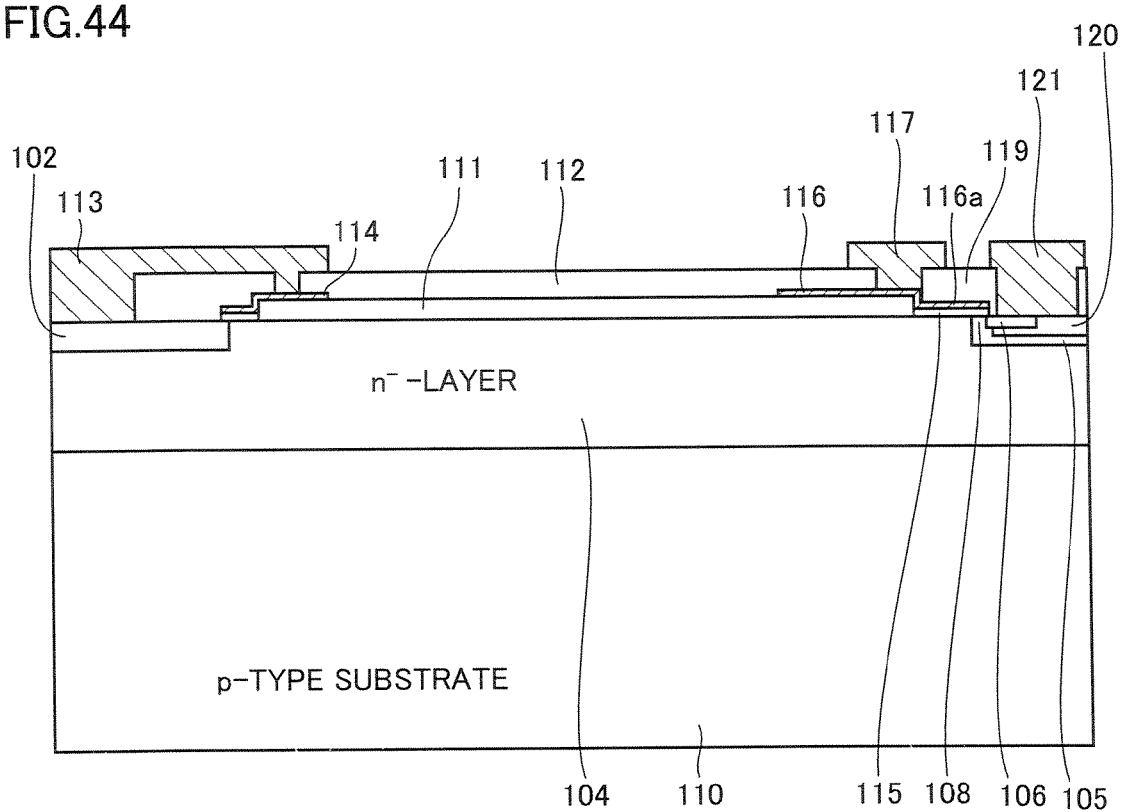
FIG. 44 schematically shows a cross sectional structure taken along a line L44-L44 in FIG. 43.

FIG. 44 schematically shows a cross sectional structure taken along a line L44-L44 shown in FIG. 43. In FIG. 44, the lateral n-channel MOSFET is formed at the surface of $n^-$-layer ($n^-$-drift layer) 104 formed at the surface of p-type substrate 110. $N^+$-drain layer 102 is formed at the surface of $n^-$-drift layer 104, and $n^+$-drain layer 102 is electrically connected to a drain electrode 113. Drain electrode 113 is electrically connected to a drain electrode lead-out line 114 formed at first and second insulating films 111 and 112.

In the vicinity of the source region, p-base layer 105 is formed at the surface of $n^-$-drift layer 104, and $n^+$-source layer 106 is formed at the surface of p-base layer 105. Channel formation region 108 is arranged adjacent to the $n^+$-source layer and at the inner peripheral portion of the surface of p-base layer 105. A gate interconnection line 116a is formed on channel formation region 108 with a gate insulating film 115 interposed in between, and is coupled to a conductive layer portion formed on first interlayer insulating film 111. Gate interconnection line 116 is electrically connected to a gate electrode 117 extending through second insulating film 112.

A $p^+$-layer 120 is formed being doped more heavily than p-base layer 105 and deeper than $n^+$-source layer 106. These $n^+$-source layer 106 and p-type base layer 105 are commonly coupled to a source electrode 121. In the cross sectional structure shown in FIG. 44, $n^+$-source layer 106 includes main body 106a and convex portions 106b.

In the region where only main body 106a of source layer 106 of the lateral MOSFET is arranged, the cross sectional structure near the source region is the same as that shown in FIG. 4. Source layer 106 is arranged in place of emitter layer 6.

As seen from the cross sectional structure shown in FIG. 44, IGBT and MOSFET have the same structure in the source and emitter regions, except for that the lateral n-channel MOSFET has the drift layer and the drain layer formed of the same conductivity type, and has no buffer layer in drain layer 102 in the structure of the lateral n-channel IGBT.

Similarly to the discharging of minority carriers in the emitter region of the IGBT already described in connection with the first to fourth embodiments, the lateral MOSFET can efficiently transfer the holes to source electrode 121 owing to provision of heavily doped $p^+$-layer 120 deeper than $n^+$-source layer 106 in p-base layer 105. Further, it is possible to reduce the base resistance of the parasitic npn bipolar transistor formed of $n^+$-source layer 106, $p^+$-layer 120 and p-base layer 105, and $n^-$-layer 104 under source electrode 121, and latch-up immunity of the parasitic thyristor can be improved. Accordingly, the fifth embodiment can achieve effects similar to those of the lateral IGBT of the first to fourth embodiments already described.

The cross sectional structure of the source region portion of the lateral MOSFET is the same as that of the lateral IGBT already described, and therefore n+-source layer 106 may be formed of separated unit n+-source layers each arranged in an island-like form, and can have the same shape or form as n+-source layers 106 in the IGBTs of the first to fourth embodiments already described.

Similarly to the first to fourth embodiments, it is merely required to place heavily doped p+-layer 120 below n+-source layer 106 and doped more heavily than p-base layer 105, and p+-layer 120 may be arranged deeper than p-base layer 100. These structures exhibit the same cross sectional structures as those already described, and therefore the cross sectional structures thereof are not shown in the figures for the sake of simplicity. Heavily doped p+-layer 120 may have the same structure as that already described in connection with the first to fourth embodiments, and the tolerance of the parasitic thyristor can likewise be improved. In channel formation region 108, a circular channel is continuously formed, and a large drain-source current can be driven. The minority carriers can be efficiently discharged to reduce the turn-off time.

The structure according to the invention can be applied to the lateral MOSFET having other structures such as a trench gate MOSFET having a gate structure of a trench structure. The structure of the invention can be also applied to a p-channel MOSFET by exchanging the conductivity types.

According to the fifth embodiment of the invention, as described above, the lateral n-channel MOSFET is formed to have, at the source region, p+-layer 120 formed below the n+-source layer and doped more heavily than p-base layer 105, and therefore can efficiently discharge the holes to source electrode 121. Also, the base resistance of the portion under the n+-source layer can be reduced, and the latch-up immunity of the parasitic thyristor can be improved. Further, the turn-off time can be reduced. The channel is formed along circumference in the channel formation region, and a large drain-source current can be driven.

Sixth Embodiment

Figure 45:
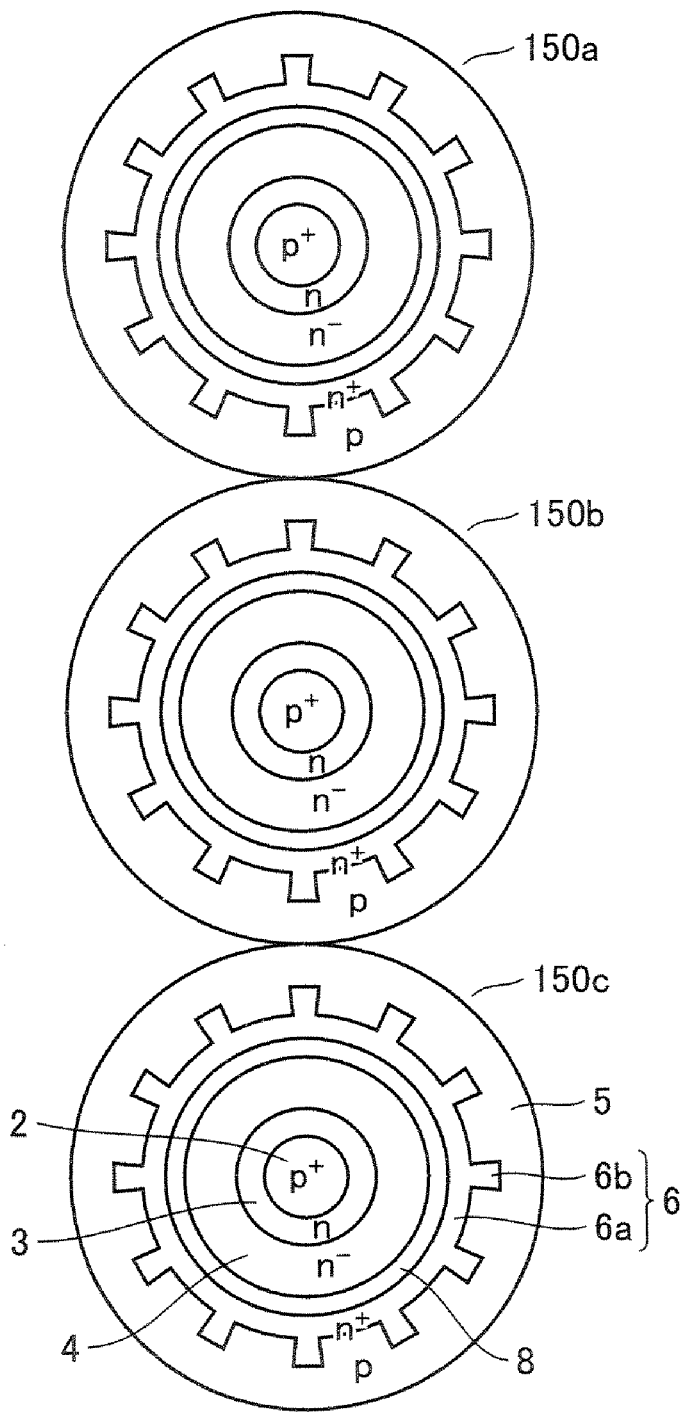
FIG. 45 shows an example of an arrangement of cells of an IGBT according to a sixth embodiment of the invention.

FIG. 45 schematically shows a planar layout of an IGBT according to a sixth embodiment of the invention. The IGBT includes a plurality of cells aligned to each other for driving a large current. FIG. 45 representatively shows IGBT cells 150a-150c. Each of cells 150a-150c has a circular form, and includes p+-collector layer 2 formed in a central portion, n-buffer layer 3 surrounding collector layer 2, n−-drift layer 4 surrounding n-buffer layer 3, and p-base layer 5 formed along the outer periphery of n−-drift layer 4. N+-emitter layer 6 is formed in the region of p-base layer 5. In the layout shown in FIG. 45, n+-emitter layer 6 includes convex portions 6b and main body 6a of the ring-shaped, continuous form. Channel formation region 8 is formed in p-base layer region 5 formed at an inner periphery of the main body 6a. P-base layers 5 in these cells 150a-150c are arranged adjacent to each other. Similarly to the first to fifth embodiments already described, FIG. 45 showing the planar layout does not show the electrode interconnections, insulating films and heavily doped p+-layer arranged at the base layer. Similarly to the first embodiment, the heavily doped p+-layer may be formed, under n+-emitter layer 6, being doped more heavily than p-base layer 5; or may be formed deeper than p-base layer 5.

Emitter layer 6 may be divided into unit emitter layers, similarly to the second embodiment.

In the structure shown in FIG. 45, the lateral MOSFET can be achieved with the p+-collector layer replaced with an n+-drain layer, and with n-buffer layer 3 omitted, and a similar arrangement is employed for the lateral MOSFET.

By arranging cells 150a-150c, the channel can be wider than that in a structure employing an IGBT cell of an elliptic structure that will be described later, and a larger current can be driven.

[Modification]

Figure 46:
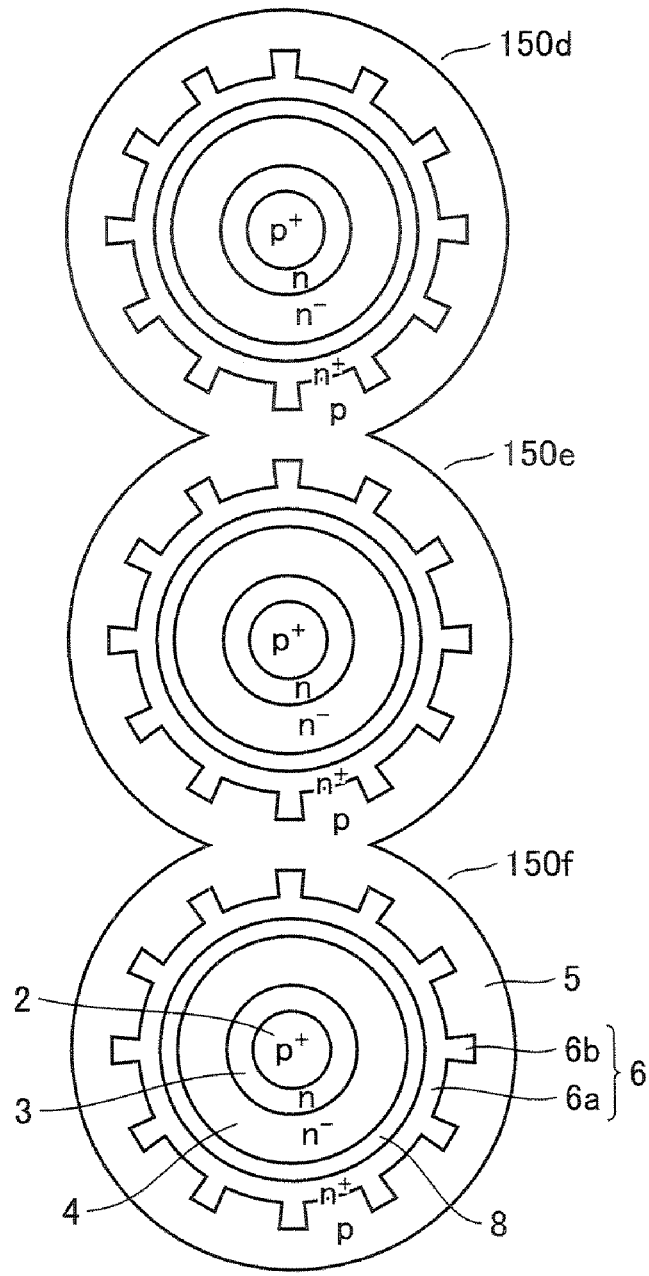
FIG. 46 shows another example of the arrangement of cells of the IGBT according to the sixth embodiment of the invention.

FIG. 46 shows a modification of the planar layout of the IGBT according to the sixth embodiment of the invention. The planar layout shown in FIG. 46 differs from that shown in FIG. 45 in the following arrangements. Unit cells 150d-150f are aligned to each other, and the adjacent cells share p-base layer region 5. Therefore, a total layout area of cells 150d-150f can be smaller than that in the planar layout shown in FIG. 45.

Other arrangements of the IGBT shown in FIG. 46 is the same as that of the IGBT shown in FIG. 45. Corresponding portions are allotted with the same reference numerals, and description thereof is not repeated.

In the planar layout shown in FIG. 46, the heavily doped p+-layer has only to be arranged under emitter layer 6, and may be formed being shallower than the p-base layer, or may be formed deeper than the p-base layer. The heavily doped p+-layer may be formed into an embedded structure. Instead of the continuous structure having main body 6a and convex portions 6b, emitter layer 6 may be formed with the unit emitter layers separated from each other.

Cells 150a-150c or 150d-150f each are formed into a circle-shaped form to be arranged as shown in FIG. 45 or 46, and thereby can increase the channel width to drive a larger current as compared with the case where the cell of the single elliptic structure is used, as will be described below.

Figure 47:
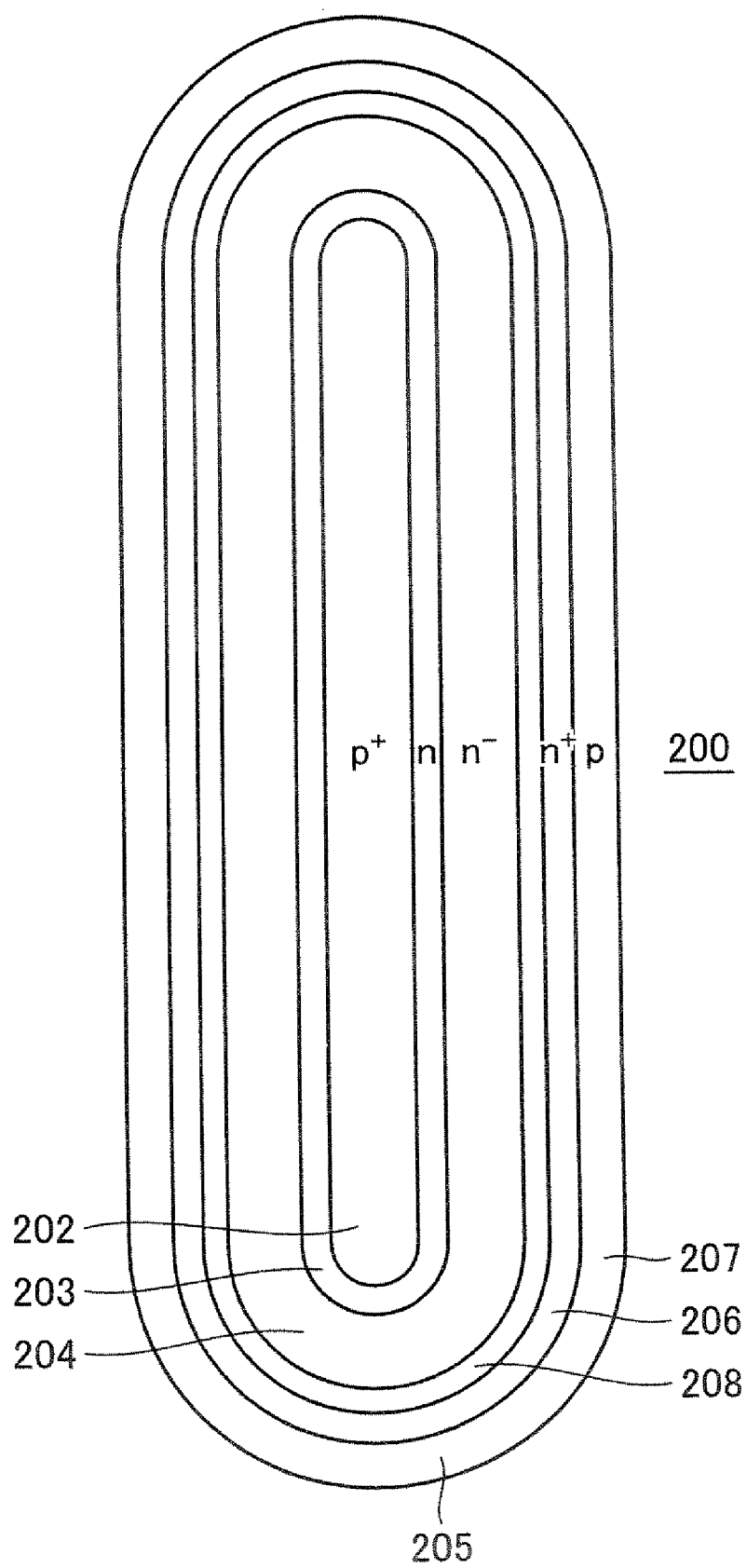
FIG. 47 schematically shows, for comparison, a layout of a surface of a conventional lateral IGBT having an elliptic structure.

Referring to FIG. 47, an IGBT 200 of an elliptic structure is considered. IGBT 200 includes an ellipse-shaped p+-collector layer 202 formed in a central portion, an ellipse-shaped n-buffer layer 203 surrounding collector layer 202, an ellipse-shaped n−-drift layer 204 surrounding n-buffer layer 203 and an ellipse-shaped p-base layer 205 surrounding drift layer 204. N+-emitter layer 206 is formed in p-base layer 205, and channel formation region 208 is formed in n+-emitter layer 206.

Figure 48:
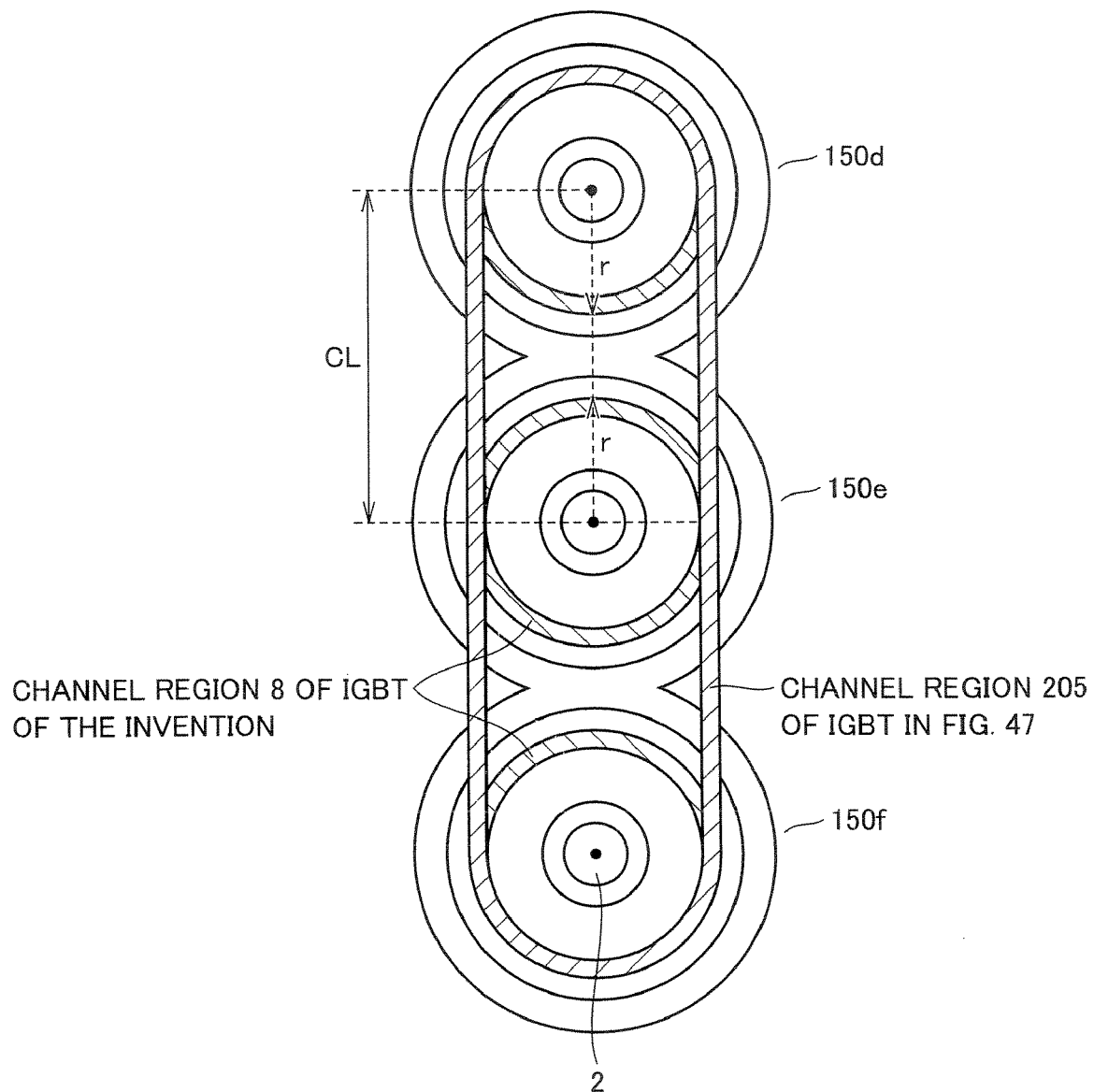
FIG. 48 shows a channel length of the IGBT according to the sixth embodiment of the invention together with channel regions of the IGBT shown in FIG. 47.

The elliptic IGBT shown in FIG. 47 has a track-like form formed of a linear portion and circumferential portions. The linear portion of this track-like form (ellipse-shaped form) has substantially the same cross sectional structure as the IGBT of the first embodiment and others (the p+-emitter layer may not be provided). It is now considered to arrange circular cells, e.g., shown in FIG. 46 in the same layout area as the IGBT of the elliptic structure shown in FIG. 47. In this arrangement, when cells 150d-150f are arranged as shown in FIG. 48, the channel formation regions 8 of cells 150d and 150f have the circumferential portions identical with the circumferential portions of the 205 channel formation region of the elliptic IGBT shown in FIG. 47. It is assumed that a distance CL is present between central portions of p+-collector layers 2 in the adjacent cells. It is also assumed in each of cells 150a-150f that a distance r is present from the center of p+-collector layer 2 to the center of channel formation region 8. A total length of the channel regions of cells 150d and 150e corresponding to a channel length CL of the elliptic IGBT is expressed by the following equality:

$$2 \cdot \pi (1/4) \cdot 2 = \pi \cdot r$$

Therefore, when the distance between the centers of p$^+$-collector layers 2 of the adjacent cells (150d and 150e) is smaller than (3·r), the following relationship can be achieved.

$$CL < 3 \cdot r < \pi \cdot r$$

The above relationship is achieved by reducing the distance between the channel formation regions of the adjacent cells to a value smaller than r. The channel formation region is formed at the base layer region of the outer peripheral portion of the cell, and the above conditions are readily satisfied.

Therefore, as compared with the elliptic IGBT shown in FIG. 47, the arrangement of unit cells 150d-150f (or 150a-150c) can increase the circumferential length of channel formation regions 8, and thereby it is possible to increase the channel width with respect to the current flowing from the p$^+$-collector layer to the emitter layer so that a large current can be driven.

Figure 49:
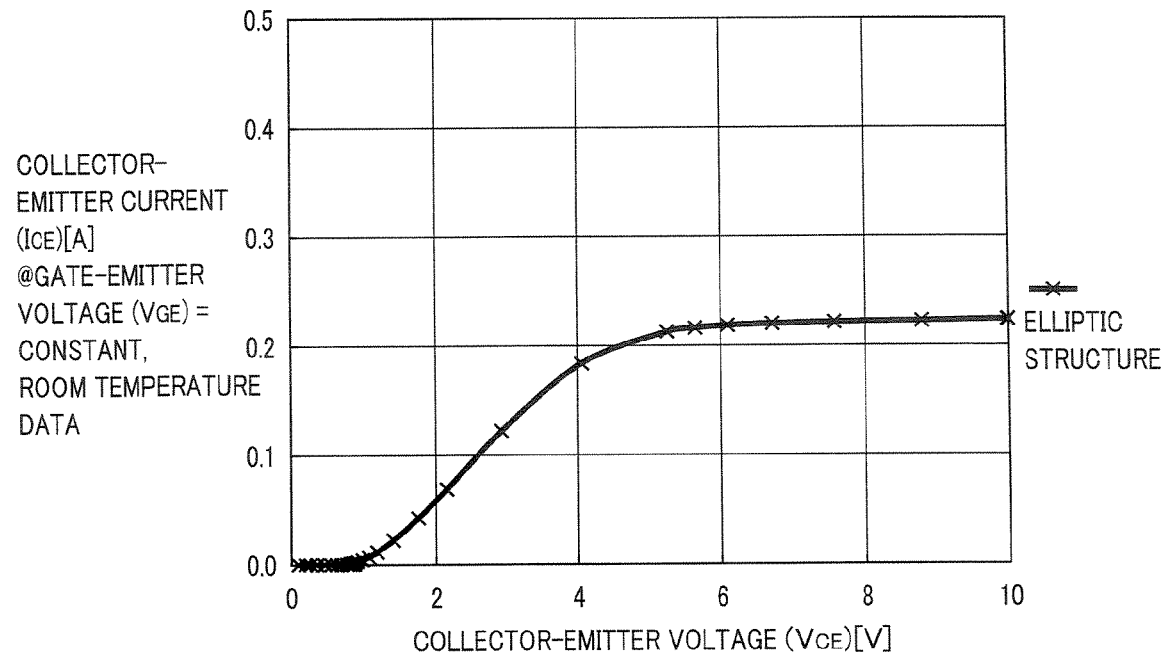
FIGS. 49 and 50 represent switching characteristics of the IGBTs shown in FIGS. 47 and 46, respectively.

FIG. 49 shows characteristics of collector-emitter current ICE exhibited when collector-emitter voltage VCE is applied under the condition that a certain gate-emitter voltage VGE is applied in the IGBT of the elliptic structure shown in FIG. 47. The abscissa axis gives collector-emitter voltage VCE with units of V (volt), and the ordinate axis gives collector-emitter current ICE with units of A (ampere). The measured temperature is the ambient temperature. However, the IGBT of the elliptic structure does not have a heavily doped semiconductor layer (p$^+$-layer) in the base layer.

In the IGBT of the elliptic structure, as shown in FIG. 49, collector-emitter current ICE gradually rises when collector-emitter voltage VCE gradually increases. When collector-emitter voltage VCE reaches near 6 V and collector-emitter current ICE reaches about 0.2 A, even when collector-emitter voltage VCE further rises from the voltage region, collector-emitter current ICE is substantially in a saturated state. Therefore, collector-emitter current ICE will not increase sufficiently even when the collector-emitter voltage VCE increases. In the region where collector-emitter voltage VCE rises from 0 V to 6 V, collector-emitter current ICE slowly rises, and the on-resistance (VCE/ICE) becomes high. This is because the elliptic structure device is not provided with the p$^+$-layer (p$^+$-emitter layer) in the base layer.

Figure 50:
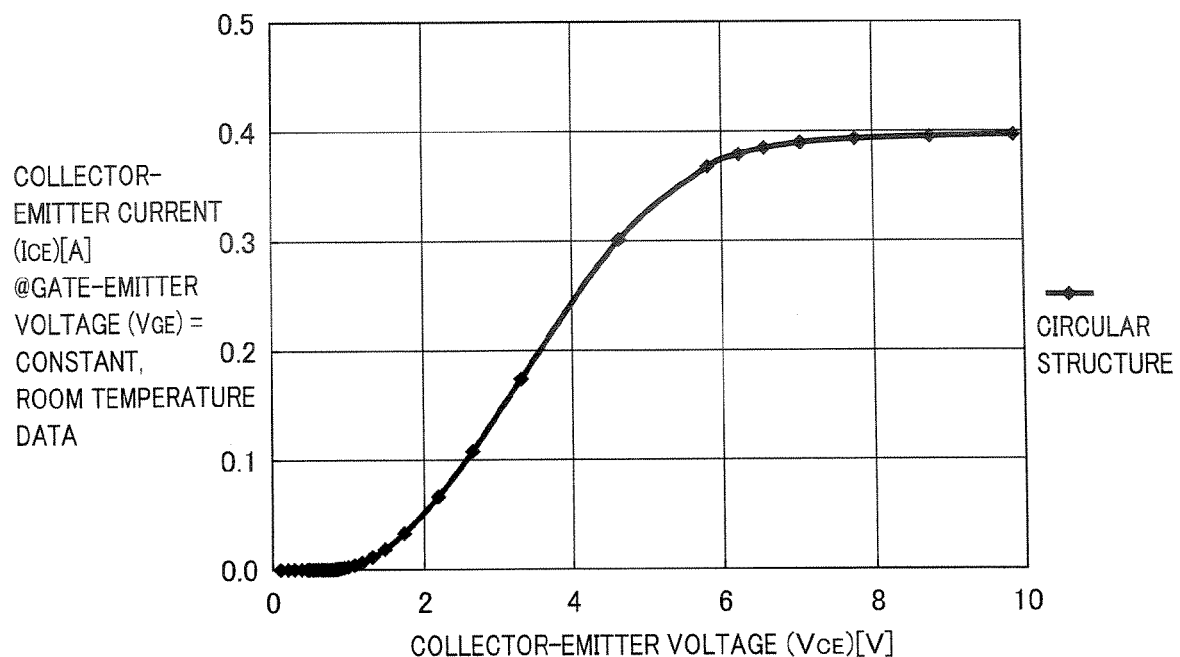

FIG. 50 shows characteristics of collector-emitter current ICE exhibited when collector-emitter voltage VCE is applied under the condition that a certain gate-emitter voltage VGE is applied in the structure of the IGBT (see FIG. 48 or 46) of the circular structure according to the invention. In FIG. 50, the abscissa axis gives collector-emitter voltage VCE with units of V (volt), and the ordinate axis gives collector-emitter current ICE with units of A (ampere). Measurement temperature is the ambient temperature.

According to the cells of the circular structure, as shown in FIG. 50, when collector-emitter voltage gradually increases to near 6.0 V, the collector-emitter current reaches about 0.4 A, and the collector-emitter current exhibits substantially the saturated state near that point onward. In this case, however, the collector-emitter current ICE takes the value that is nearly twice as large as that in the IGBT of the elliptic structure shown in FIG. 47. In the region where collector-emitter voltage VCE rises from 0 V to 6 V, the rising gradient is large, and the on-resistance (VCE-ICE) can be reduced. These are achieved by the facts that the total channel width is large, and the base resistance is reduced. Even when the current quantity increases, the parasitic bipolar transistor in the emitter region can be prevented from being turned on because the p$^+$-layer is arranged under the emitter layer. Therefore, the latch-up immunity of the parasitic thyristor can be improved.

As described above, the sixth embodiment of the invention employs a plurality of circular IGBT as the cells. This arrangement can increase the length of the channel region and therefore the channel width as compared with the structure using a single elliptic IGBT, and thereby can increase the collector-emitter current. Effects similar to those of the first to fourth embodiments can also be achieved.

Seventh Embodiment

Figure 51:
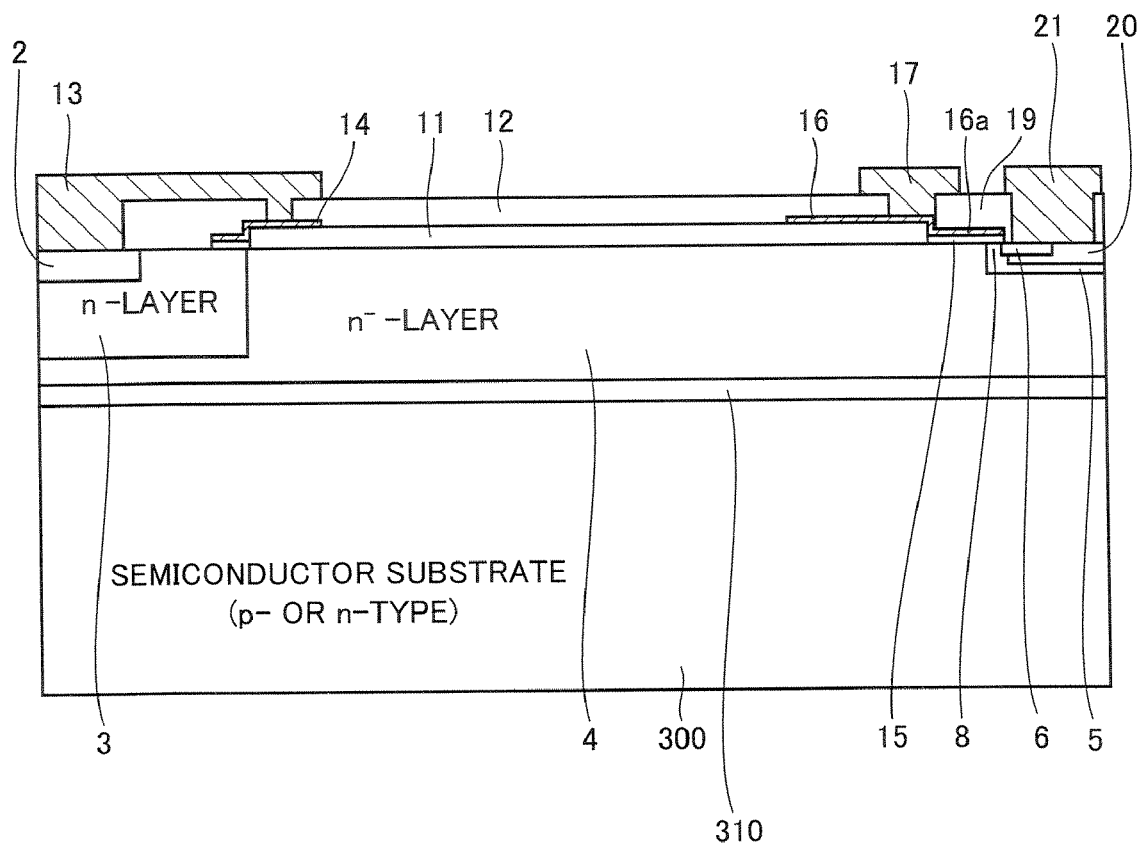
FIG. 51 schematically shows a cross sectional structure a lateral IGBT according to a seventh embodiment of the invention.

FIG. 5 schematically shows a cross sectional structure of a semiconductor device (lateral n-channel IGBT) according to a seventh embodiment of the invention. The planar (surface) layout of the IGBT shown in FIG. 51 is substantially the same as the planar layout of the IGBT shown in FIG. 1. In the IGBT shown in FIG. 517 an embedded insulating film 310 is arranged between n$^-$-layer 4 and a semiconductor substrate 300. Since semiconductor substrate 300 is isolated from n$^-$-layer 4, the conductivity type thereof may be either of p- and n-types.

Other structures of the IGBT shown in FIG. 51 are the same as those of the IGBT shown in FIG. 2. Corresponding portions are allotted with the same reference numerals, and description thereof is not repeated.

The structure in which an embedded insulating film 310 is arranged at the surface of semiconductor substrate 300, and a transistor is formed on embedded insulating film 310, is generally referred to as an "SOI (Silicon On Insulator) structure," and is also referred to as a "dielectric isolation structure". In the structure shown in FIG. 2, embedded insulating film 310 is not employed, and n$^-$-layer 4 and p-type semiconductor substrate (10) are isolated from each other by a PN junction formed between them. This structure is referred to as a "junction isolation structure". As compared with the junction isolation structure, the provision of embedded insulating film 310 can electrically isolate n$^-$-layer 4 from substrate 300 more reliably, and produces the depletion layer only in the n$^-$-layer so that a fast operation can be achieved.

Other arrangements of the IGBT shown in FIG. 51 are the same as those of the IGBT shown in FIG. 2. Corresponding portions are allotted with the same reference numerals, and description thereof is not repeated.

Figure 52:
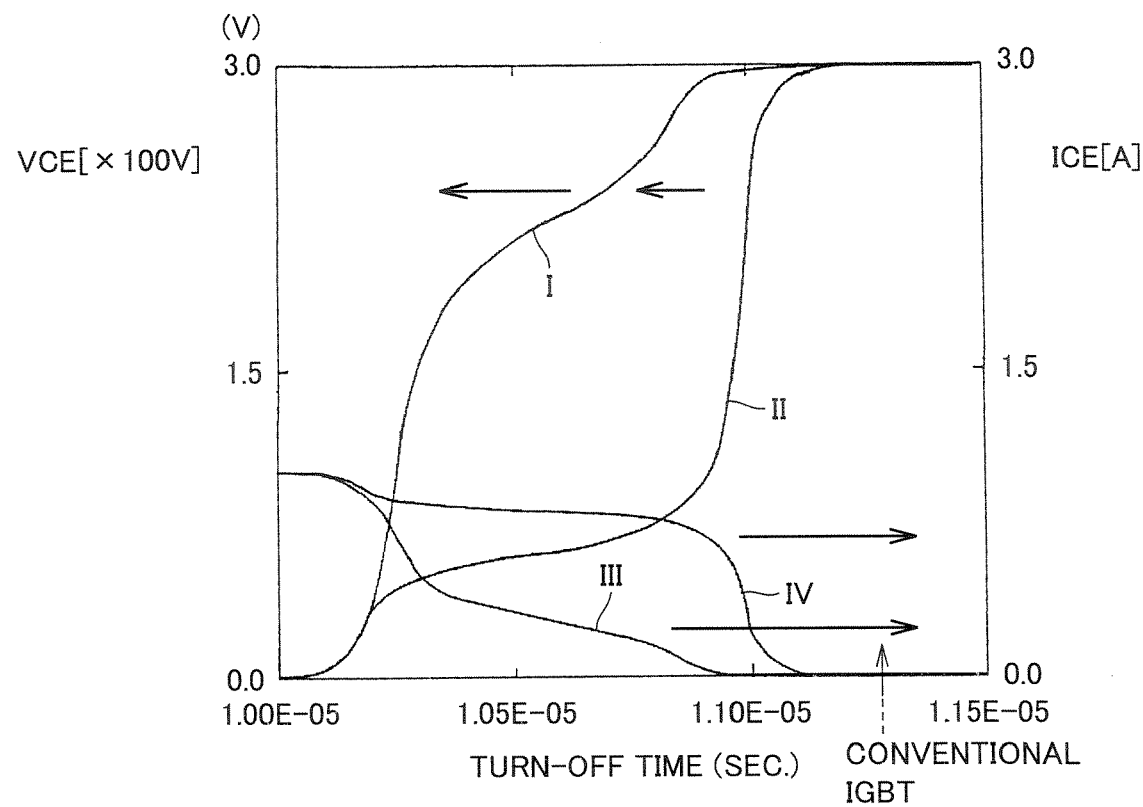
FIG. 52 represents switching characteristics of the lateral IGBTs shown in FIGS. 51 and 2.

FIG. 52 represents turn-off waveforms at the time of resistance load switching operation of the IGBT. In FIG. 52, the abscissa axis gives the turn-off time (seconds), and the ordinate axis gives collector-emitter voltage VCE (×100 V) as well as collector-emitter current ICE (A). A curve I represents the collector-emitter voltage of the IGBT of the dielectric isolation structure (FIG. 51), and a curve II represents, as a comparison example, collector-emitter voltage VCE of the IGBT of the junction isolation type, e.g., shown in FIG. 2. A curve III represents collector-emitter current ICE of the dielectric isolation structure, and a curve IV represents the collector-emitter current of the IGBT of the junction isolation structure.

As shown in FIG. 52, a fall time tf (i.e., a time required for falling of collector-emitter current ICE from 90% to 10% of the maximum value) of the IGBT of the junction isolation type is near 1 μs. Therefore, the switching speed is slow, and therefore the switching loss is relatively large. In the dielectric isolation structure, fall time tf is slightly larger than 0.5 μs, and the switching speed is high so that the switching speed loss can be reduced. In connection with the turn-off waveform in the resistance load switching operation, the absolute value of the rising rate of the VCE waveform (curve I) is substantially equal to the absolute value of the falling rate of the waveform (curve III) representing collector-emitter current ICE, and it is apparent that the switching operation is performed fast.

Therefore, it is apparent that the dielectric isolation structure can perform the faster switching operation than the junction isolation structure does.

In the junction isolation structure, however, it can be seen that during the turn-off in the switching period, collector-emitter voltage VCE rapidly rises to enter the off state (curve II), and collector-emitter current ICE rapidly lowers (curve IV). In the junction isolation structure, therefore, the provision of the p$^+$-layer and the ring-shaped emitter layer can achieves faster operation than the structure that employs the conventional IGBT of the elliptic structure using merely the p-base layer without using p$^+$-layer, and using an annular n-emitter layer, as can be seen from the characteristics of the curves II and IV. The turn-off time of the conventional structure is indicated by a dotted arrow in FIG. 52.

Figure 53:
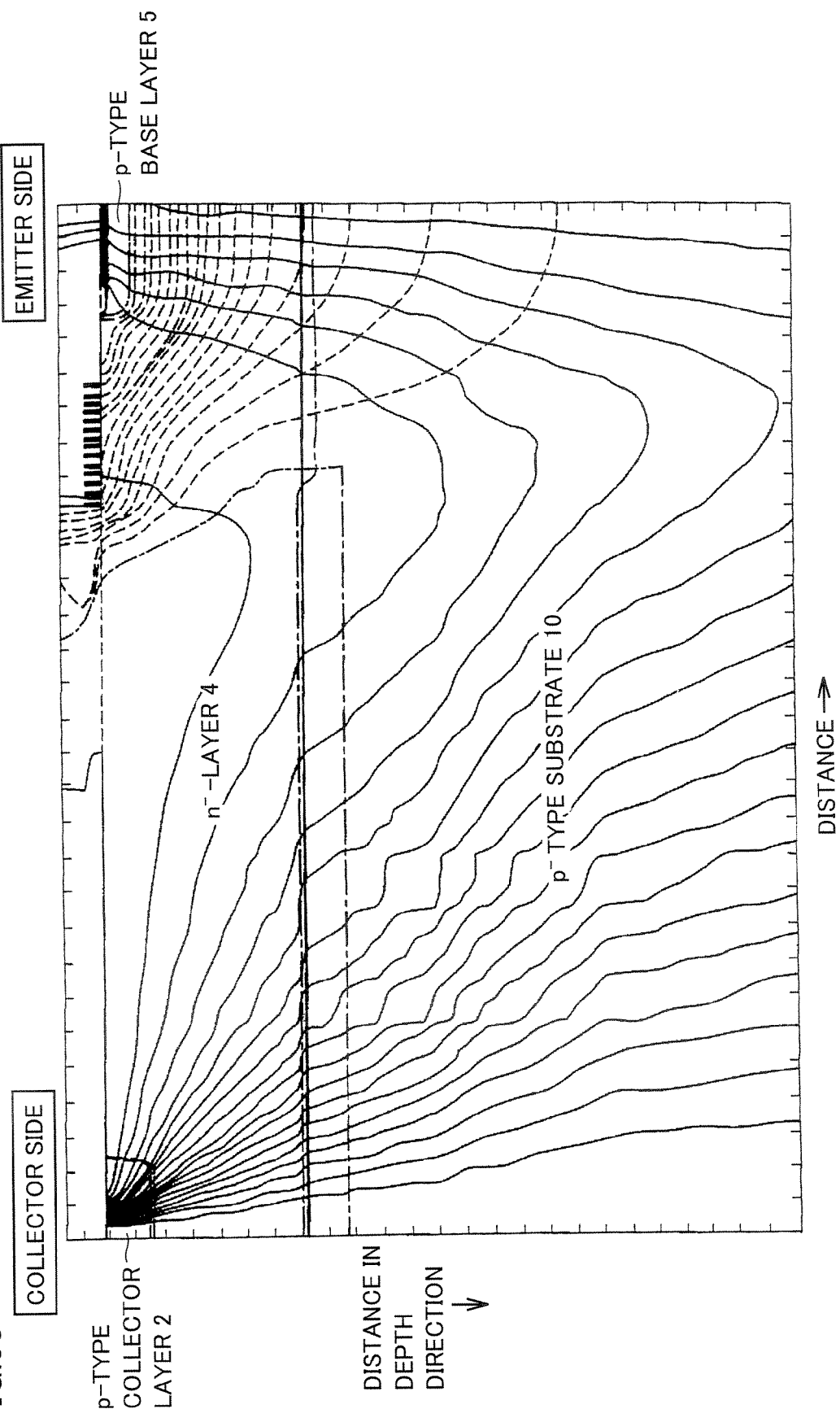
FIG. 53 represents distribution of holes and electrons, and a depletion layer region boundary in the lateral IGBT shown in FIG. 2.

FIG. 53 represents an electric current distribution, a voltage distribution and a depletion layer region boundary during the resistance load switching turn-off (at 10.6 μs) of the lateral IGBT of the junction isolation structure according to the first embodiment already described. The current distribution is represented by solid lines, the voltage distribution is represented by broken lines, and the depletion layer region boundary is represented by alternate long and short dash line.

In the lateral IGBT of the junction isolation structure, as shown in FIG. 53, the depletion layer expanding from the emitter side distributes toward the collector side (to a region neighboring to p-type collector layer 2), and further into p-type substrate 10. Therefore, the potential distribution represented by broken lines and the current distribution represented by solid lines are both present within p-type substrate 10. Therefore, the depletioning (making depletion) on the collector side is suppressed, and collector-emitter voltage VCE rises relatively slowly. As a result, decrease of collector-emitter current ICE becomes relatively slow during the turn-off, and accordingly fall time tf becomes long.

Figure 54:
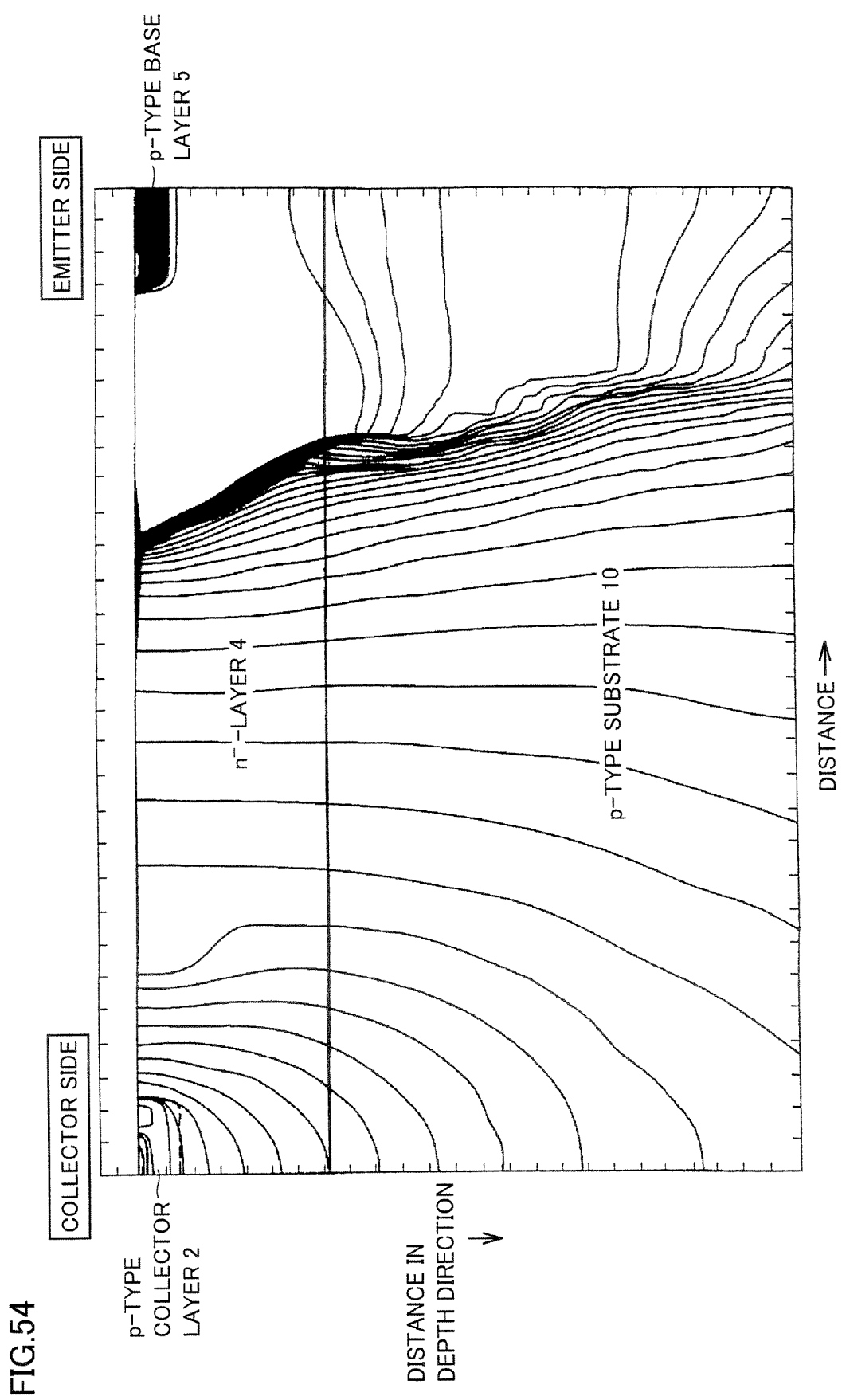
FIG. 54 represents a distribution of holes in the lateral IGBT (FIG. 2) of a junction isolation structure.

FIG. 54 represents, on the sectional structure, a hole distribution at the resistance load switching turn-off (10.6 μs) of the lateral IGBT of the junction isolation structure according to the first embodiment of the invention. In this lateral IGBT of the junction isolation structure, the depletion from the emitter side toward the collector side is suppressed as shown in FIG. 53, so that many holes are distributed within n$^-$-layer 4 and p-type substrate 10. Since many holes are distributed within n$^-$-layer 4 and p-type substrate 10, a long time is required before disappearance of the holes that have been distributed in n$^-$-layer 4 and p-type substrate 10, even in the structure with the p$^+$-layer. Therefore, fall time tf becomes long.

Figure 55:
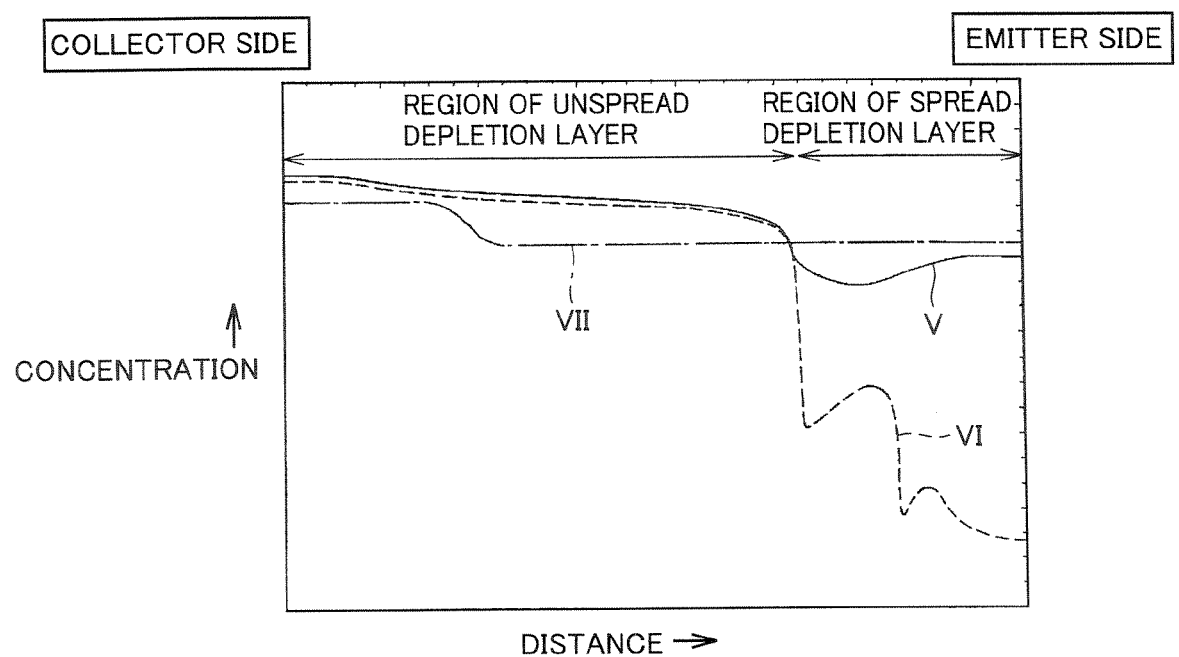
FIG. 55 represents a concentration distribution of electrons, holes and an equilibrium state in the lateral IGBT of the junction isolation structure shown in FIG. 2.

FIG. 55 represents a hole distribution, an electron distribution and a hole/electron concentration distribution at an equilibrium state in the resistance load switching turn-off (at 10.6 μs) of the lateral IGBT of the junction isolation structure, and represents a distribution of respective carriers from the collector side to the emitter side at a certain depth in n$^-$-layer 4. In FIG. 55, a curve V represents the distribution of holes, a curve VI represents the distribution of electrons and a curve VII represents the electron/hole concentration profile in the equilibrium state.

In the lateral IGBT of the junction isolation structure, as shown in FIG. 53, the depletioning from the emitter side toward the collector side is suppressed. Therefore, in the n$^-$-layer where the depletion layer is not spread, excessive holes and excessive electrons are distributed at concentrations higher than those in the equilibrium state. Therefore, these excessive holes and excessive electrons are distributed a larger amount in the n$^-$-layer, which increases the time required before these excessive holes and electrons disappear. Therefore, fall time tf can be reduced only to a limited extent.

Figure 56:
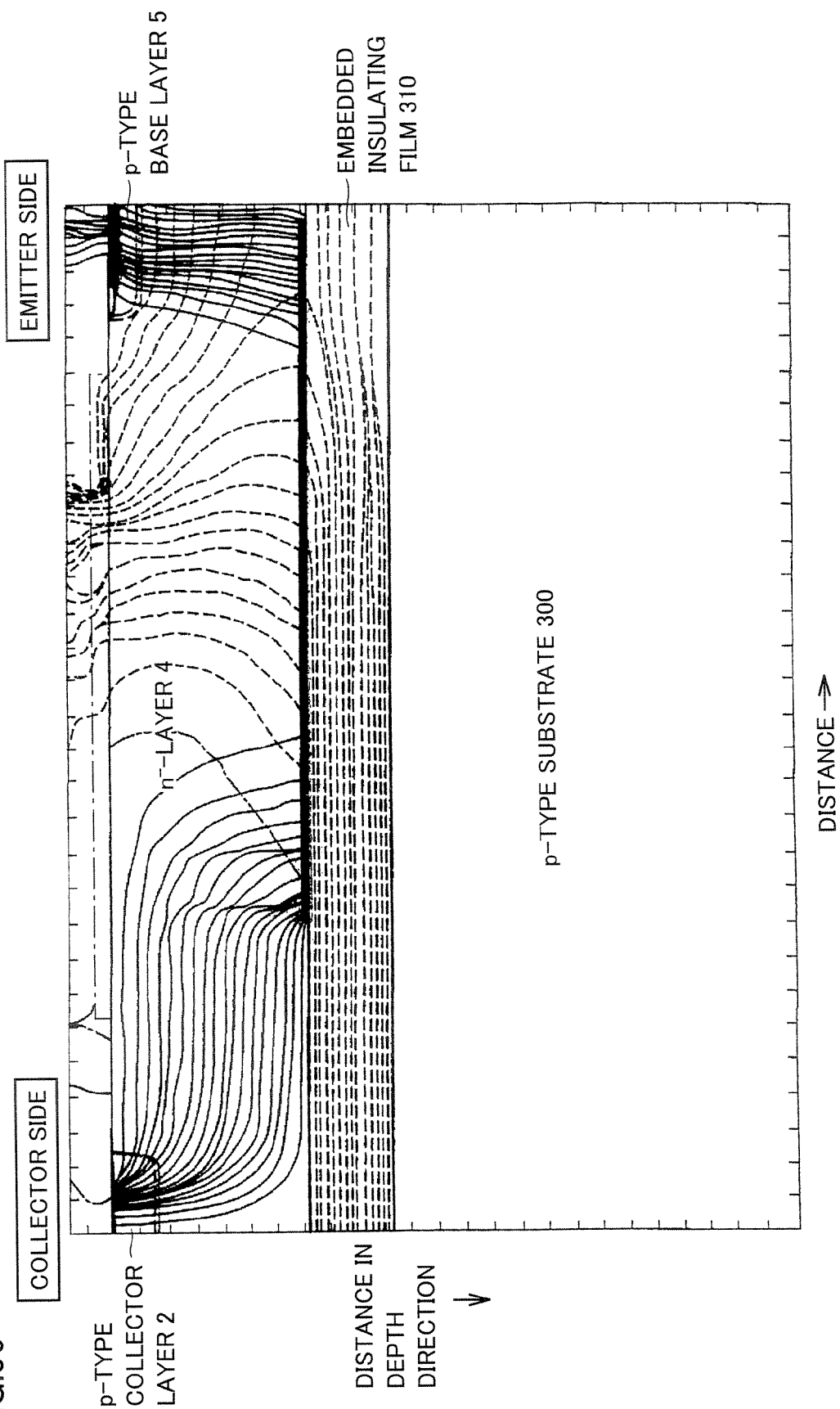
FIG. 56 represents a distribution of current and a potential and a depletion layer region boundary in the lateral IGBT of a dielectric isolation structure shown in FIG. 51.

FIG. 56 represents a potential distribution, a current distribution and a depletion layer region boundary at the resistance load switching turn-off (at 10.6 μs) of the lateral IGBT of the dielectric isolation structure, and corresponds to the sectional view of FIG. 51. In FIG. 56, solid lines represent the current distribution, the broken lines represent the potential distribution and the alternate long and short dash line represents the depletion layer region boundary.

In the lateral IGBT of the dielectric isolation structure, as shown in FIG. 56, embedded insulating film 310 is present between n$^-$-layer 4 and p-type substrate 300. In the embedded insulating film 310, therefore, the potential distribution is present parallel to the surface of embedded insulating film 310, but the depletion layer extending from the emitter side is not spread into p-type substrate 300, and is spread in n$^-$-layer 4 toward the collector side (the insulating film originally corresponds to the depletion layer region). Therefore, the current distribution represented by solid lines and the potential distribution represented by broken lines are not present in p-type substrate 300. Therefore, the depletion expands toward the collector, and thereby the collector-emitter voltage rapidly rises so that corresponding collector-emitter current ICE rapidly rises, and fall time tf becomes short.

Figure 57:
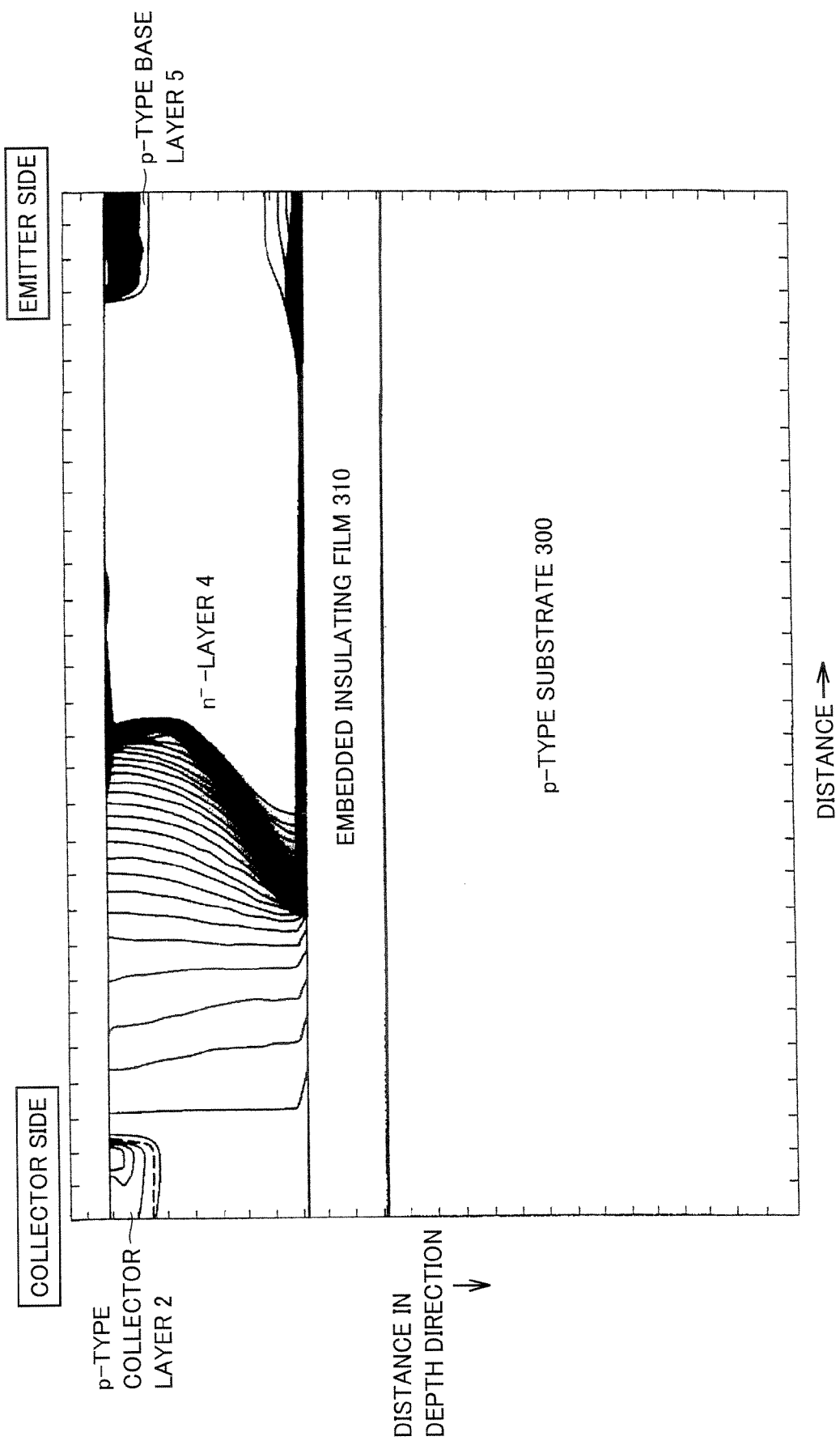
FIG. 57 represents a distribution of holes in the lateral IGBT of the dielectric isolation structure shown in FIG. 51.

FIG. 57 represents a distribution (represented by solid lines) of holes at the resistance load switching turn-off (at 10.6 μs) of the lateral IGBT of the dielectric isolation structure. The cross sectional structure corresponds to the cross sectional structure shown in FIG. 51. In the lateral IGBT of the dielectric isolation structure, as shown in FIG. 57, the depletioning from the emitter side toward the collector side is promoted as represented in FIG. 56 so that only a small number of holes are distributed in n$^-$-layer 4. Therefore, only a short time is required before the holes distributed in n$^-$-layer 4 disappear, and fall time tf becomes short.

Figure 58:
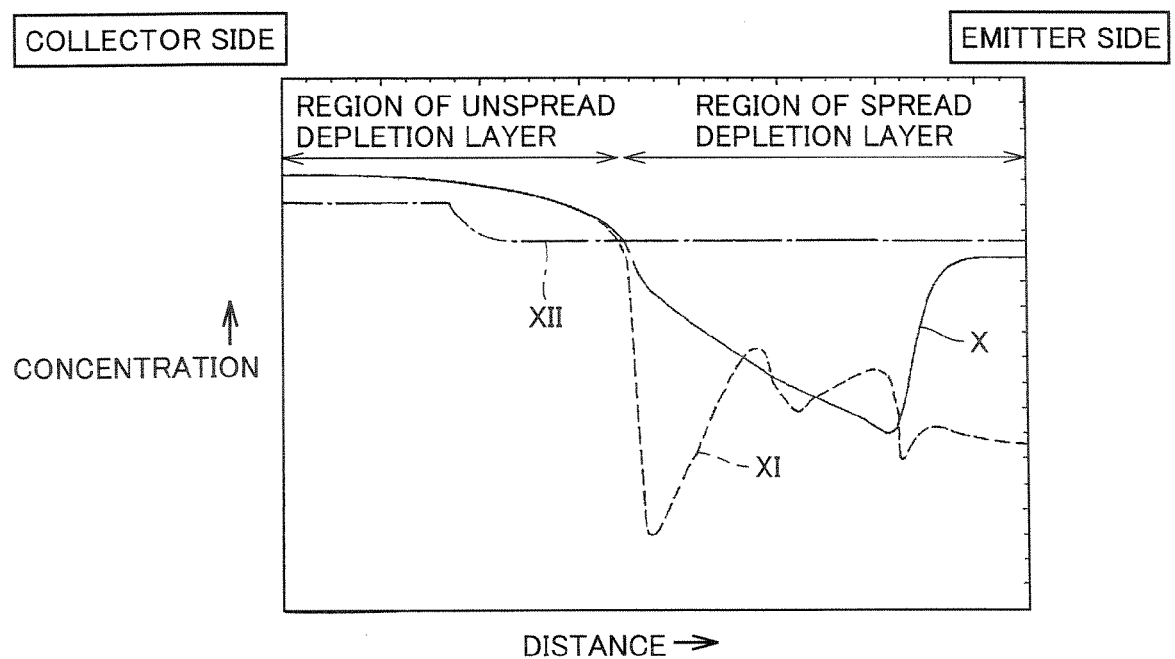
FIG. 58 represents distribution of electron and holes and a hole/electron concentration distribution in an equilibrium state between the collector and emitter in the lateral IGBT of the junction isolation structure shown in FIG. 51.

FIG. 58 shows a hole distribution, an electron distribution and a hole/electron concentration distribution at an equilibrium state at the time of the resistance load switching turn-off (at 10.6 μs) of the lateral IGBT of the dielectric isolation structure. The abscissa axis gives a distance, and the ordinate axis gives a concentration. FIG. 58 represents the respective distributions from the collector side to the emitter side at a certain depth in n$^-$-layer 4. A curve X represents the distribution of holes, a curve XI represents the distribution of electrons and a curve XII represents the electron/hole concentration distribution at the equilibrium state.

In the lateral IGBT of the dielectric isolation structure, as shown in FIG. 56, since the depletionizing from the emitter side toward the collector side is promoted, the region where the depletion layer is not spread is small in n$^-$-layer 4. As shown in FIG. 58, therefore, n$^-$-layer 4 contains only small amounts of holes and/or electrons (excessive holes and/or excessive electrons) of which concentrations exceed the concentrations at the equilibrium state. Thus, the quantities of the excessive holes and excessive electrons are small in n$^-$-layer 4, resulting in reduced time required before the excessive holes and excessive electrons disappear. Accordingly, fall time tf can be short.

By using the dielectric isolation structure according to the seventh embodiment of the invention, therefore, it is possible to achieve the reduction of fall time tf in addition to the effect of improving the characteristics of collector-emitter current ICE in the IGBT and MOSFET already described in connection with the first embodiment and others.

The dielectric isolation structure according to the seventh embodiment can be applied to the lateral MOS device in the fifth embodiment already described and also can be applied to the p-channel IGBT and the p-channel lateral MOSFET. As for the structure of the lateral MOSFET, the present embodiment can be likewise applied to the lateral MOSFET of the trench gate structure.

According to the seventh embodiment of the invention, as described above, the transistor element is formed into the dielectric isolation structure, and can achieve the effect of reducing the fall time and achieving the fast switching operation in addition to the effects of the first to sixth embodiments already described.

The invention can be applied to power switching elements that perform power conversion and/or power control. The invention may be solely employed as a power transistor, or may be integrated as an intelligent power device with a controller or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a semiconductor substrate;
    a semiconductor region on a surface of said semiconductor substrate;
    a first semiconductor layer region at a surface of said semiconductor region and coupled to a first electrode;
    a second semiconductor layer region being of a ring-shaped form and located in said semiconductor region, the second semiconductor layer region being spaced from said first semiconductor layer region and surrounding said first semiconductor layer region, the second semiconductor layer region being different in conductivity type from said semiconductor region;
    a third semiconductor layer region having a plurality of unit regions located in said second semiconductor layer region, the plurality of unit regions being spaced from each other at a predetermined interval and being different in conductivity type from said second semiconductor layer region, each of the unit regions having a rectangle-like form with a width larger than the predetermined interval, the third semiconductor layer region being different in conductivity type from said second semiconductor layer region;
    a heavily doped semiconductor layer located in said second semiconductor layer region, at least below said third semiconductor layer region, the heavily doped semiconductor layer being doped more heavily than said second semiconductor layer region and being the same in conductivity type as said second semiconductor layer region;
    a gate electrode layer above said semiconductor region and a part of said second semiconductor layer region and configured to form a channel, at a surface of the part of said second semiconductor layer region, extending so as to reach said semiconductor region from the third semiconductor layer region, for transferring charges between the semiconductor region and the third semiconductor layer region through said channel; and
    a base layer located in said second semiconductor layer region, the base layer having been doped less heavily than said heavily doped semiconductor layer and being the same conductivity type as said heavily doped semiconductor layer, the heavily doped semiconductor layer extending farther toward the surface of said semiconductor substrate than does said base layer extend toward the surface of said semiconductor substrate.

2. The semiconductor device according to claim 1, further comprising:
    an insulating layer between said semiconductor region and said semiconductor substrate.

3. The semiconductor device according to claim 1, wherein said semiconductor region consists of a single conductivity type.

4. The semiconductor device according to claim 1, further comprising:
    an electrode adjoining the third semiconductor layer region, the heavily doped semiconductor layer, and the base layer.

5. The semiconductor device according to claim 1, wherein the base layer includes an opposing region opposing the part of said second semiconductor layer region across said heavily doped semiconductor layer.

6. The semiconductor device according to claim 5, further comprising:
    an electrode adjoining the third semiconductor layer region, the heavily doped semiconductor layer, and the opposing region.

* * * * *